(12) United States Patent
Jang et al.

(10) Patent No.: US 10,557,924 B1
(45) Date of Patent: Feb. 11, 2020

(54) LIDAR DEVICE

(71) Applicant: SOS LAB CO., LTD, Gwangju (KR)

(72) Inventors: Jun Hwan Jang, Gwangju (KR); Hee Sun Yoon, Incheon (KR)

(73) Assignee: SOS LAB CO., LTD, Gwangju (KR)

( * ) Notice: Subject to any disclaimer, the term of this patent is extended or adjusted under 35 U.S.C. 154(b) by 0 days.

(21) Appl. No.: 16/362,298

(22) Filed: Mar. 22, 2019

Related U.S. Application Data

(63) Continuation of application No. 16/283,542, filed on Feb. 22, 2019.
(Continued)

(30) Foreign Application Priority Data

| Jul. 13, 2018 | (KR) | ......................... 10-2018-0081897 |
| Jul. 13, 2018 | (KR) | ......................... 10-2018-0081898 |

(Continued)

(51) Int. Cl.
*G01C 3/08* (2006.01)
*G01S 7/481* (2006.01)
(Continued)

(52) U.S. Cl.
CPC .......... *G01S 7/4817* (2013.01); *G01S 7/4815* (2013.01); *G01S 17/08* (2013.01); *G02B 1/002* (2013.01);
(Continued)

(58) Field of Classification Search
None
See application file for complete search history.

(56) References Cited

U.S. PATENT DOCUMENTS

| 3,944,323 A | 3/1976 | Starkweather |
| 5,006,721 A * | 4/1991 | Cameron ............... G01S 7/4811 |
| | | 250/559.16 |

(Continued)

FOREIGN PATENT DOCUMENTS

| JP | H 01-133017 A | 5/1989 |
| JP | H 06-078924 B2 | 10/1994 |

(Continued)

OTHER PUBLICATIONS

Korean Intellectual Property Office, Final Office Action, Korean Patent Application No. 10-2018-0095385, dated Mar. 26, 2019, 5 pages (with concise explanation of relevance).
(Continued)

*Primary Examiner* — Isam A Alsomiri
*Assistant Examiner* — Amir J Askarian
(74) *Attorney, Agent, or Firm* — Fenwick & West LLP

(57) ABSTRACT

A lidar device comprises: a laser emitting unit for including a plurality of VCSEL elements emitting a laser beam; a metasurface for including a plurality of beam steering cells arranged in a form of two-dimensional array by a row direction and a column direction, wherein the plurality of beam steering cells guide the laser beam by using nanopillars; wherein the nanopillars included in the plurality of beam steering cells form a subwavelength pattern, wherein the increase of an attribute related to at least one of the width, height, and number per unit length of the nanopillars is repetitive along the direction from the center of the metasurface to the position of the row corresponding to the plurality of beam steering cells.

10 Claims, 37 Drawing Sheets

Related U.S. Application Data

(60) Provisional application No. 62/671,305, filed on May 14, 2018, provisional application No. 62/723,804, filed on Aug. 28, 2018.

(30) Foreign Application Priority Data

| Aug. 27, 2018 | (KR) | 10-2018-0100701 |
|---|---|---|
| Nov. 20, 2018 | (KR) | 10-2018-0143972 |
| Nov. 20, 2018 | (KR) | 10-2018-0143973 |
| Nov. 20, 2018 | (KR) | 10-2018-0143974 |

(51) Int. Cl.
  *G01S 17/08* (2006.01)
  *H01S 5/00* (2006.01)
  *G02B 1/00* (2006.01)

(52) U.S. Cl.
  CPC ...... *H01S 5/0071* (2013.01); *G02B 2207/101* (2013.01)

(56) References Cited

U.S. PATENT DOCUMENTS

| 5,268,565 | A | | 12/1993 | Katoh et al. | |
|---|---|---|---|---|---|
| 5,493,388 | A | * | 2/1996 | Adachi | G01S 7/4812 356/5.01 |
| 6,104,524 | A | | 8/2000 | Hisano et al. | |
| 8,619,237 | B2 | | 12/2013 | Hillman et al. | |
| 10,133,144 | B2 | * | 11/2018 | Inada | G02F 1/295 |
| 10,261,389 | B2 | * | 4/2019 | Skirlo | G02F 1/2955 |
| 10,408,416 | B2 | * | 9/2019 | Khorasaninejad | G02B 5/1809 |
| 10,422,990 | B2 | * | 9/2019 | Inada | G02F 1/29 |
| 2003/0043364 | A1 | | 3/2003 | Jamieson et al. | |
| 2004/0036630 | A1 | | 2/2004 | Jamieson et al. | |
| 2005/0219504 | A1 | | 10/2005 | Adachi | |
| 2007/0023621 | A1 | * | 2/2007 | Blick | B82Y 15/00 250/251 |
| 2007/0071056 | A1 | | 3/2007 | Chen | |
| 2009/0321633 | A1 | * | 12/2009 | Blick | H01J 1/32 250/307 |
| 2011/0204327 | A1 | * | 8/2011 | Hiruma | H01L 27/153 257/13 |
| 2012/0140240 | A1 | * | 6/2012 | Hillman | G01N 21/4795 356/496 |
| 2012/0273662 | A1 | * | 11/2012 | Caldwell | G01N 21/658 250/214.1 |
| 2013/0313517 | A1 | * | 11/2013 | Choi | H01L 33/08 257/13 |
| 2014/0078514 | A1 | | 3/2014 | Zhu | |
| 2014/0224989 | A1 | * | 8/2014 | Long | G02F 1/0126 250/338.4 |
| 2014/0233599 | A1 | * | 8/2014 | Park | H01L 33/40 372/92 |
| 2014/0286367 | A1 | * | 9/2014 | Scofield | H01S 5/1042 372/43.01 |
| 2015/0131080 | A1 | * | 5/2015 | Retterath | G01S 17/10 356/5.01 |
| 2015/0219764 | A1 | * | 8/2015 | Lipson | H01S 5/00 356/4.01 |
| 2016/0266242 | A1 | * | 9/2016 | Gilliland | G01S 7/4814 |
| 2017/0153528 | A1 | * | 6/2017 | Kim | G02F 1/293 |
| 2017/0235126 | A1 | * | 8/2017 | DiDomenico | G02B 19/0042 349/1 |
| 2018/0045953 | A1 | * | 2/2018 | Fan | G02B 27/0012 |
| 2018/0059221 | A1 | | 3/2018 | Slobodyanyuk et al. | |
| 2018/0113200 | A1 | * | 4/2018 | Steinberg | G01S 7/4815 |
| 2018/0120434 | A1 | | 5/2018 | Jeong et al. | |
| 2018/0216797 | A1 | * | 8/2018 | Khorasaninejad | F21V 5/004 |
| 2018/0224574 | A1 | * | 8/2018 | Lee | G02B 1/002 |
| 2018/0252857 | A1 | * | 9/2018 | Glik | G02B 27/0172 |
| 2018/0301875 | A1 | * | 10/2018 | Burroughs | G01S 17/89 |
| 2018/0332677 | A1 | * | 11/2018 | Ku | H05B 33/0821 |
| 2019/0004151 | A1 | * | 1/2019 | Abediasl | G02B 26/101 |
| 2019/0011556 | A1 | * | 1/2019 | Pacala | G01S 7/4863 |
| 2019/0025509 | A1 | * | 1/2019 | Kim | G02B 6/12014 |
| 2019/0137075 | A1 | * | 5/2019 | Aieta | F21V 5/045 |
| 2019/0154877 | A1 | * | 5/2019 | Capasso | G02B 1/00 |
| 2019/0183635 | A1 | * | 6/2019 | MacInnis | G02B 1/043 |
| 2019/0196068 | A1 | * | 6/2019 | Tsai | G02B 5/008 |
| 2019/0204423 | A1 | * | 7/2019 | O'Keeffe | G01S 7/4816 |
| 2019/0243208 | A1 | * | 8/2019 | Peng | G02F 1/29 |
| 2019/0256995 | A1 | * | 8/2019 | Leach | C23C 18/31 |
| 2019/0271769 | A1 | * | 9/2019 | Raly | G01S 7/4808 |
| 2019/0293765 | A1 | * | 9/2019 | Jeong | H04N 5/2354 |
| 2019/0302022 | A1 | * | 10/2019 | Sun | G01N 21/01 |
| 2019/0302325 | A1 | * | 10/2019 | Sorbel | G02B 1/111 |
| 2019/0310351 | A1 | * | 10/2019 | Hughes | G01S 7/4817 |
| 2019/0317011 | A1 | * | 10/2019 | Hu | B01J 20/268 |

FOREIGN PATENT DOCUMENTS

| JP | H 09-274076 | A | 10/1997 |
|---|---|---|---|
| JP | H 11-006973 | A | 1/1999 |
| JP | H 11-072517 | A | 3/1999 |
| JP | 2000-009422 | A | 1/2000 |
| JP | 2003-121546 | A | 4/2003 |
| JP | 2005-024894 | A | 1/2005 |
| JP | 2007-088601 | A | 4/2007 |
| JP | 4023426 | B2 | 12/2007 |
| JP | 2008-033135 | A | 2/2008 |
| JP | 2010-038859 | A | 2/2010 |
| JP | 2011-257221 | A | 12/2011 |
| JP | 2012-117996 | A | 6/2012 |
| JP | 2014-020889 | A | 2/2014 |
| JP | 2014-032149 | A | 2/2014 |
| JP | 2014-071029 | A | 4/2014 |
| JP | 2014-071038 | A | 4/2014 |
| JP | 2014-115182 | A | 6/2014 |
| JP | 2016-035411 | A | 3/2016 |
| JP | 6090433 | B2 | 3/2017 |
| JP | 2017-150990 | A | 8/2017 |
| KR | 0136171 | B1 | 1/1998 |
| KR | 1998-050810 | U | 10/1998 |
| KR | 10-0278806 | B1 | 2/2001 |
| KR | 2001-0090649 | A | 10/2001 |
| KR | 10-2004-0091500 | A | 10/2004 |
| KR | 10-2006-0080359 | A | 7/2006 |
| KR | 10-2009-0092609 | A | 9/2009 |
| KR | 10-2011-0061787 | A | 6/2011 |
| KR | 10-2011-0075755 | A | 7/2011 |
| KR | 10-2011-0131789 | A | 12/2011 |
| KR | 10-2012-0001321 | A | 1/2012 |
| KR | 10-2012-0096941 | A | 8/2012 |
| KR | 10-2013-0010956 | A | 1/2013 |
| KR | 10-2017-0063196 | A | 6/2017 |
| KR | 10-2017-0071181 | A | 6/2017 |
| KR | 10-2017-0114242 | A | 10/2017 |
| KR | 10-2017-0135415 | A | 12/2017 |
| KR | 10-2018-0008655 | A | 1/2018 |
| KR | 10-2018-0011453 | A | 2/2018 |
| KR | 10-2018-0015489 | A | 2/2018 |
| KR | 10-2018-0029585 | A | 3/2018 |
| KR | 10-2018-0032709 | A | 4/2018 |
| KR | 10-2018-0046081 | A | 5/2018 |

OTHER PUBLICATIONS

Korean Intellectual Property Office, Notice of Allowance, Korean Patent Application No. 10-2018-0081898, dated Apr. 16, 2019, 4 pages (with concise explanation of relevance).

Korean Intellectual Property Office, Notice of Allowance, Korean Patent Application No. 10-2018-0081896, dated Apr. 16, 2019, 3 pages (with concise explanation of relevance).

Korean Intellectual Property Office, Notice of Allowance, Korean Patent Application No. 10-2018-0100701, dated Mar. 29, 2019, 3 pages.

Korean Intellectual Property Office, Notice of Allowance, Korean Patent Application No. 10-2018-0126278, dated Feb. 28, 2019, 3 pages.

(56) References Cited

OTHER PUBLICATIONS

Korean Intellectual Property Office, Notice of Allowance, Korean Patent Application No. 10-2018-0081897, dated Feb. 1, 2019, 5 pages.

Korean Intellectual Property Office, Notice of Allowance, Korean Patent Application No. 10-2018-0143973, dated Jul. 31, 2019, three pages (with concise explanation of relevance).

Korean Intellectual Property Office, Notice of Allowance, Korean Patent Application No. 10-2018-0099340, datd Jan. 1, 2019, 7 pages (with concise explanation of relevance).

Korean Intellectual Property Office, Notice of Allowance, Korean Patent Application No. 10-2018-0120184, dated Nov. 21, 2018, 6 pages (with concise explanation of relevance).

Korean Intellectual Property Office, Office Action, Korean Patent Application No. 10-2018-0143972, dated Feb. 7, 2019, 11 pages (with concise explanation of relevance).

Korean Intellectual Property Office, Office Action, Korean Patent Application No. 10-2018-0143974, dated Jan. 30, 2019, 9 pages (with concise explanation of relevance).

Korean Intellectual Property Office, Office Action, Korean Patent Application No. 10-2018-0126278, dated Dec. 19, 2018, 6 pages (with concise explanation of relevance).

Korean Intellectual Property Office, Office Action, Korean Patent Application No. 10-2018-0081898, dated Dec. 18, 2018, 5 pages (with concise explanation of relevance).

Korean Intellectual Property Office, Office Action, Korean Patent Application No. 10-2018-0081896, dated Dec. 14, 2018, 5 pages (with concise explanation of relevance).

Korean Intellectual Property Office, Office Action, Korean Patent Application No. 10-2018-0095385, dated Nov. 26, 2018, 6 pages (with concise explanation of relevance).

Korean Intellectual Property Office, Office Action, Korean Patent Application No. 10-2018-0100701, dated Nov. 26, 2018, 6 pages (with concise explanation of relevance).

Korean Intellectual Property Office, Office Action, Korean Patent Application No. 10-2018-0081897, dated Nov. 1, 2018, 11 pages (with concise explanation of relevance).

United States Office Action, U.S. Appl. No. 16/140,272, dated Apr. 8, 2019, 9 pages.

* cited by examiner

LIDAR DEVICE

CROSS-REFERENCE TO RELATED APPLICATIONS

This application is a continuation of U.S. patent application Ser. No. 16/283,542 filed on Feb. 22, 2019, which claims priority to and the benefit of U.S. Patent Application No. 62/671,305, filed on May 14, 2018, U.S. Patent Application No. 62/723,804, filed on Aug. 28, 2018, Korean Patent Application No. 10-2018-0081897, filed on Jul. 13, 2018, Korean Patent Application No. 10-2018-0081898, filed on Jul. 13, 2018, Korean Patent Application No. 10-2018-0100701, filed on Aug. 27, 2018, Korean Patent Application No. 10-2018-0143972, filed on Nov. 20, 2018, Korean Patent Application No. 10-2018-0143973, filed on Nov. 20, 2018, and Korean Patent Application No. 10-2018-0143974, filed on Nov. 20, 2018, the disclosures of which are incorporated herein by reference in their entirety.

TECHNICAL FIELD

The present disclosure relates to a light detection and ranging (LiDAR) device, and more particularly, to a LiDAR device for obtaining information on a distance to an obstacle by steering a laser beam using a metasurface including a nanopillar.

BACKGROUND

In active use of edge-emitting lasers, in recent years, interest in the vertical cavity surface emitting laser (VCSEL) has been increasing. The VCSEL is a semiconductor laser that emits a laser in a vertical direction on an upper surface and has advantages in that it is easy to mass produce because of its simple manufacturing process and it is able to be manufactured in a small size because of its high degree of integration.

The VCSEL has mostly been applied to the telecommunications field, but recently, attempts to apply the VCSEL to the optical system have been vigorously made. Particularly, with autonomous-driving vehicles being in the spotlight, attempts to apply the VCSEL to a light detection and ranging (LiDAR) device have been vigorously made.

SUMMARY OF THE INVENTION

In an embodiment, the present disclosure is directed to reducing the size of a light detection and ranging (LiDAR) device by using a vertical cavity surface emitting laser (VCSEL) element.

In another embodiment, the present disclosure is directed to generating a scanning point cloud by forming various subwavelength patterns using nanopillars.

In still another embodiment, the present disclosure is directed to realizing a solid-state lidar device capable of three-dimensional scanning using a metasurface.

Objectives of the present disclosure are not limited to those described above, and other unmentioned objectives should be clearly understood by those of ordinary skill in art to which the present disclosure pertains from the present specification and accompanying drawings.

An aspect of the present disclosure is directed to a lidar device for measuring a distance to an obstacle within a field of view having a vertical direction and a horizontal direction and being formed by a plurality of scanning points. The device may include a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a direction from a center of the metasurface to a row of the specific cell and a change rate of the first attribute being increased according to a distance from the row of the specific cell to the center of the metasurface, an increment of a second attribute being repeated along a direction from the center of the metasurface to a column of the specific cell and a change rate of the second attribute being related to a distance from the column of the specific cell to the center of the metasurface, and wherein the first attribute is related to at least one of a width, a height, and a number per unit length of the nanopillars, and the second attribute is related to at least one of a width, a height, and a number per unit length of the nanopillars.

Another aspect of the present disclosure is directed to a laser emitting device, whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a direction from a center of the metasurface to a row of the specific cell and a change rate of the first attribute being increased according to a distance from the row of the specific cell to the center of the metasurface, an increment of a second attribute being repeated along a direction from the center of the metasurface to a column of the specific cell and a change rate of the second attribute being increased according to a distance from the column of the specific cell to the center of the metasurface, and wherein the first attribute is related to at least one of a width, a height, and a number per unit length of the nanopillars, and, the second attribute is related to at least one of a width, a height, and a number per unit length of the nanopillars.

Yet another aspect of the present disclosure is directed to a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a metasurface including a plurality of beam steering cells guiding the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a first component of a steering direction in which the specific cell guides the laser beam and a change rate of the first attribute being increased according to a magnitude of the first component, an increment of a second attribute being repeated along a second component of a steering direction in which the specific cell guides the laser beam and a change rate of the second attribute being increased according to a magnitude of the second component, and wherein the first component corresponds to the vertical direction of the field of view and the second component corresponds to the horizontal direction of the field of view.

Still yet another aspect of the present disclosure is directed to a laser emitting device whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a metasurface including a plurality of beam steering cells guiding the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a first component of a steering direction in which the specific cell guides the laser beam and a change rate of the first attribute being increased according to a magnitude of the first component, an increment of a second attribute being repeated along a second component of a steering direction in which the specific cell guides the laser beam and a change rate of the second attribute being increased according to a magnitude of the second component, and wherein the first component corresponds to the vertical direction of the field of view and the second component corresponds to the horizontal direction of the field of view.

Further still another aspect of the present disclosure is directed to a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the plurality of the beam steering cells include a first cell, a second cell being located at a same row and on a right side of the first cell, and a third cell being located at a same column and on a lower side of the first cell, wherein the nanopillars included in each of the first, the second and the third cells form a subwavelength pattern in each of the first, the second and the third cells, wherein the subwavelength pattern in each of the first, the second and the third cells includes: an increment of a first attribute being repeated along a direction from a center of the metasurface to a row of each of the first, the second and the third cells, respectively, and an increment of a second attribute being repeated along a direction from a center of the metasurface to a column of each of the first, the second and the third cells, respectively, and wherein the first attribute is related to at least one of a width, a height, and a number per unit length of the nanopillars and the second attribute is related to at least one of a width, a height, and a number per unit length of the nanopillars, in case that the first to the third cells are located on a upper left quadrant side among a quadrant of the metasurface, a change rate of the second attribute of the subwavelength pattern in the first cell is greater than a change rate of the second attribute of the subwavelength pattern in the second cell and a change rate of the first attribute of the subwavelength pattern in the first cell is greater than a change rate of the first attribute of the subwavelength pattern in the third cell.

Further still another aspect of the present disclosure is directed to a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when an angle of the first steering direction of the first specific cell is greater than that of the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when an angle of the second steering direction of the third specific cell is greater than that of the fourth specific cell.

Further still another aspect of the present disclosure is directed to a laser emitting device whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when an angle of the first steering direction of the first specific cell is greater than that of the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when an angle of the second steering direction of the third specific cell is greater than that of the fourth specific cell.

Further still another aspect of the present disclosure is directed to a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when a distance from a center of the first metasurface to the first specific cell is greater than a distance from the center of the first metasurface to the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when a distance from a center of the second metasurface to the third specific cell is greater than a distance from the center of the second metasurface to the fourth specific cell.

Further still another aspect of the present disclosure is directed to a lidar device comprising: a polygonal mirror rotating along a rotational axis, reflecting a laser beam provided from a side toward an object and receiving a laser beam reflected from the object; a laser emitting module including a plurality of VCSEL (Vertical Cavity Surface Emitting Laser) elements emitting a laser beam toward the polygonal mirror and arranged along the rotational axis; a metasurface forming, via a plurality of nanopillars disposed on an emission surface side of the laser emitting module, a beam of line pattern line pattern being extended along the rotational axis using the laser beam emitted from the laser emitting module; and a sensor unit receiving, via the polygonal mirror, the laser beam reflected from the object.

Further still another aspect of the present disclosure is directed to a lidar device comprising: a laser emitting module for including a plurality of VCSEL (Vertical Cavity Surface Emitting Laser) elements emitting a laser beam; a metasurface forming a beam of line pattern extended along a first axis which is one of a vertical axis and a horizontal axis, wherein the metasurface includes a plurality of steering cells steering the laser beam along the first axis by using a nanopillar disposed on an emission surface side of the laser emitting module; a scanning mirror transforming the beam of line pattern to a beam of plane pattern and receiving a laser beam reflected from an object, by being rotated along the first axis; and a sensor unit for receiving the laser beam reflected from the object via the scanning mirror.

Means for achieving above-described objectives are not limited to those described above, and other unmentioned means for achieving the objectives should be clearly understood by those of ordinary skill in art to which the present disclosure pertains from the present specification and accompanying drawings.

BRIEF DESCRIPTION OF THE DRAWINGS

Above and other objects, features and advantages of the present disclosure will become more apparent to those of ordinary skill in art by describing exemplary embodiments thereof in detail with reference to accompanying drawings, in which.

DETAILED DESCRIPTION OF EXEMPLARY EMBODIMENTS

Figure 1:
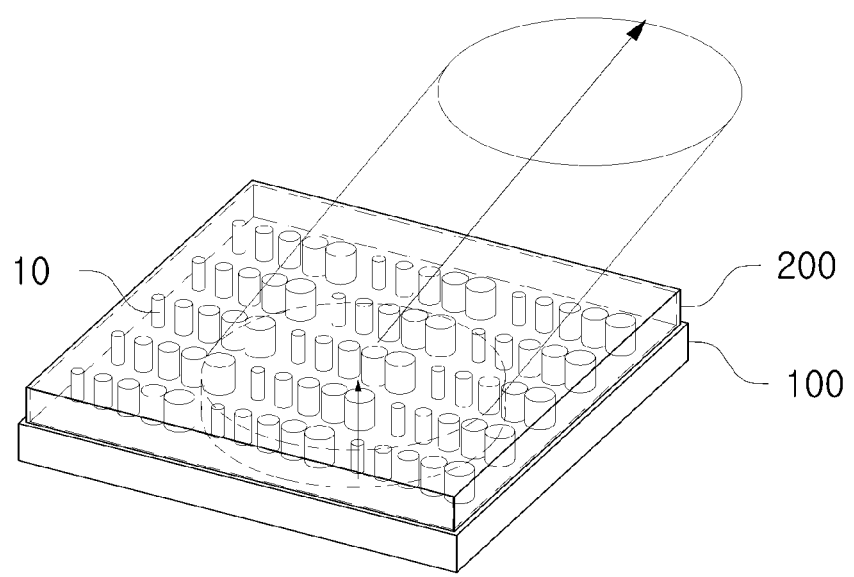
FIG. 1 is a pictorial diagram illustrating a laser emitting device according to an embodiment.

The foregoing objects, features and advantages of the present disclosure will become more apparent from the following detailed description related to accompanying drawings. However, various modifications may be applied to the present disclosure, and the present disclosure may have various embodiments. Hereinafter, specific embodiments, which are illustrated in the drawings, will be described in detail.

In the drawings, the thicknesses of layers and regions are exaggerated for clarity. When it is indicated that an element or layer is "on" or "above" another element or layer, this includes a case in which another layer or element is interposed therebetween as well as a case in which the element or layer is directly above the other element or layer. In principle, like reference numerals designate like elements throughout the specification. In the following description, like reference numerals are used to designate elements which have the same function within the same idea illustrated in the drawings of each embodiment.

When detailed description of known functions or configurations related to the present disclosure is deemed to unnecessarily blur the gist of the invention, the detailed description thereof will be omitted. Also, numerals (e.g., first, second, etc.) used in the description herein are merely identifiers for distinguishing one element from another element.

In addition, the terms "module" and "unit" used to refer to elements in the following description are given or used in combination only in consideration of ease of writing the specification, and the terms themselves do not have distinct meanings or roles.

According to one embodiment, a lidar device for measuring a distance to an obstacle within a field of view having a vertical direction and a horizontal direction and being formed by a plurality of scanning points is provided. The device may include a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a direction from a center of the metasurface to a row of the specific cell and a change rate of the first attribute being increased according to a distance from the row of the specific cell to the center of the metasurface, an increment of a second attribute being repeated along a direction from the center of the metasurface to a column of the specific cell and a change rate of the second attribute being related to a distance from the column of the specific cell to the center of the metasurface, and wherein the first attribute is related to at least one of a width, a height, and a number per unit length of the nanopillars, and the second attribute is related to at least one of a width, a height, and a number per unit length of the nanopillars.

Herein, a steering direction of the beam steering cell may have a vertical component in a range of $-M°$ to $M°$ and a horizontal component in a range of $-N°$ to $N°$, wherein N is greater than M.

Herein, a size of a component corresponding to the vertical direction of the steering direction of the plurality of beam steering cells may correspond to a location in the row direction of the beam steering cell; and a size of a component corresponding to the horizontal direction of the steering direction of the plurality of beam steering cells may correspond to a location in the column direction of the beam steering cell.

Herein, a location of each of the plurality of scanning points included in the field of view may be related to a location of the beam steering cell.

Herein, a vertical location of each of the plurality of scanning points may correspond to a row-direction location of the beam steering cell; and a horizontal location of each of the plurality of scanning points may correspond to a column-direction location of the beam steering cell.

Herein, the nanopillars may have a cylindrical or polygonal column shape.

According to another embodiment, a laser emitting device, whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a direction from a center of the metasurface to a row of the specific cell and a change rate of the first attribute being increased according to a distance from the row of the specific cell to the center of the metasurface, an increment of a second attribute being repeated along a direction from the center of the metasurface to a column of the specific cell and a change rate of the second attribute being increased according to a distance from the column of the specific cell to the center of the metasurface, and wherein the first attribute is related to at least one of a width, a height, and a number per unit length of the nanopillars, and, the second attribute is related to at least one of a width, a height, and a number per unit length of the nanopillars may be provided.

Herein, a size of a component corresponding to the vertical direction of the steering direction of the plurality of beam steering cells may correspond to a location in the row direction of the beam steering cell; and a size of a component corresponding to the horizontal direction of the steering direction of the plurality of beam steering cells may correspond to a location in the column direction of the beam steering cell.

According to another embodiment, a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a metasurface including a plurality of beam steering cells guiding the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a first component of a steering direction in which the specific cell guides the laser beam and a change rate of the first attribute being increased according to a magnitude of the first component, an increment of a second attribute being repeated along a second component of a steering direction in which the specific cell guides the laser beam and a change rate of the second attribute being increased according to a magnitude of the second component, and wherein the first component corresponds to the vertical direction of the field of view and the second component corresponds to the horizontal direction of the field of view may be provided.

Herein, a steering direction of the beam steering cell may have a vertical component in a range of −M° to M° and a horizontal component in a range of −N° to N°, wherein N is greater than M.

Herein, the plurality of beam steering cells may be arranged in a two-dimensional array in a row direction corresponding to the vertical direction and a column direction corresponding to the horizontal direction; wherein: a size of a component corresponding to the vertical direction of the steering direction of the plurality of beam steering cells may correspond to a location in the row direction of the beam steering cell; and a size of a component corresponding to the horizontal direction of the steering direction of the plurality of beam steering cells may correspond to a location in the column direction of the beam steering cell.

According to another embodiment, a laser emitting device whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a metasurface including a plurality of beam steering cells guiding the laser beam to the plurality of the scanning points by using nanopillars disposed on an emission surface side of the laser emitting unit; wherein the nanopillars form a subwavelength pattern in the plurality of the beam steering cells, wherein the subwavelength pattern of a specific cell among the plurality of the beam steering cells includes: an increment of a first attribute being repeated along a first component of a steering direction in which the specific cell guides the laser beam and a change rate of the first attribute being increased according to a magnitude of the first component, an increment of a second attribute being repeated along a second component of a steering direction in which the specific cell guides the laser beam and a change rate of the second attribute being increased according to a magnitude of the second component, and wherein the first component corresponds to the vertical direction of the field of view and the second component corresponds to the horizontal direction of the field of view may be provided.

According to another embodiment, a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit; wherein the plurality of the beam steering cells include a first cell, a second cell being located at a same row and on a right side of the first cell, and a third cell being located at a same column and on a lower side of the first cell, wherein the nanopillars included in each of the first, the second and the third cells form a subwavelength pattern in each of the first, the second and the third cells, wherein the subwavelength pattern in each of the first, the second and the third cells includes: an increment of a first attribute being repeated along a direction from a center of the metasurface to a row of each of the first, the second and the third cells, respectively, and an increment of a second attribute being repeated along a direction from a center of the metasurface to a column of each of the first, the second and the third cells, respectively, and wherein the first attribute is related to at least one of a width, a height, and a number per unit length of the nanopillars and the second attribute is related to at least one of a width, a height, and a number per unit length of the nanopillars, in case that the first to the third cells are located on a upper left quadrant side among a quadrant of the metasurface, a change rate of the second attribute of the subwavelength pattern in the first cell is greater than a change rate of the second attribute of the subwavelength pattern in the second cell and a change rate of the first attribute of the subwavelength pattern in the first cell is greater than a change rate of the first attribute of the subwavelength pattern in the third cell may be provided.

According to another embodiment, a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when an angle of the first steering direction of the first specific cell is greater than that of the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when an angle of the second steering direction of the third specific cell is greater than that of the fourth specific cell may be provided.

Herein, the first metasurface may include a first support layer configured to support the nanopillars included in the first beam steering cell; and the second metasurface may include a second support layer configured to support the nanopillars included in the second beam steering cell.

Herein, a refractive index of the first support layer may be equal to a refractive index of the second support layer.

Herein, a refractive index of the first support layer may be lower than a refractive index of the nanopillars included in the first beam steering cell.

Herein, the plurality of first beam steering cells may guide the laser beam in the vertical direction; and the plurality of second beam steering cells may guide the laser beam in the horizontal direction.

Herein, a length in the first steering direction of the first metasurface may be smaller than a length in the first steering direction of the second metasurface.

Herein, a change rate of the first attribute may be lower than a change rate of the second attribute.

Herein, an angle range of an axis which is perpendicular to the first metasurface of the laser beam after passing through the first metasurface may be from −45° to 45°, and an angle range of the axis of the laser beam after passing through the second metasurface may be from −90° to 90°.

Herein, a location of each of the plurality of scanning points included in the field of view may be related to at least one of a location of the first beam steering cell and a location of the second beam steering cell.

According to another embodiment, a laser emitting device whose a field of view being formed by a plurality of scanning points distributed in a vertical direction and a horizontal direction, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when an angle of the first steering direction of the first specific cell is greater than that of the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when an angle of the second steering direction of the third specific cell is greater than that of the fourth specific cell may be provided.

According to another embodiment, a lidar device for measuring a distance to an obstacle within a field of view having a vertical direction and a horizontal direction and being formed by a plurality of scanning points, the device comprising: a laser emitting unit including a plurality of VCSEL (Vertical Cavity Surface Emitting Laser) elements arranged in a form of array and emitting a laser beam; a first metasurface including a plurality of first beam steering cells arranged in a form of one-dimensional array along a first direction, wherein the plurality of the first beam steering cells guide the laser beam along a first steering direction corresponding to one of the vertical direction and the horizontal direction by using nanopillars disposed on an emission surface side of the laser emitting unit; a second metasurface including a plurality of second beam steering cells arranged in a form of one-dimensional array along a second direction perpendicular to the first direction, wherein the plurality of the second beam steering cells guide the laser beam along a second steering direction corresponding to another of the vertical direction or the horizontal direction by using nanopillars disposed on an emission surface side of the laser emitting unit; wherein the nanopillars included in the plurality of the first beam steering cells form a first subwavelength pattern, wherein the first subwavelength pattern includes an increment of a first attribute repeated along the first steering direction, the first attribute being related to at least one of a width, a height, and a number per unit length of the nanopillars, and wherein a change rate of the first attribute is greater in a first specific cell of the first beam steering cell than at a second specific cell of the first beam steering cell when a distance from a center of the first metasurface to the first specific cell is greater than a distance from the center of the first metasurface to the second specific cell, wherein the nanopillars included in the plurality of the second beam steering cells form a second subwavelength pattern, wherein the second subwavelength pattern includes an increment of a second attribute repeated along the second steering direction, the second attribute being related to at least one of a width, a height, and a number per unit length of the nanopillars, and wherein a change rate of the second attribute is greater in a third specific cell of the second beam steering cell than at a fourth specific cell of the second beam steering cell when a distance from a center of the second metasurface to the third specific cell is greater than a distance from the center of the second metasurface to the fourth specific cell may be provided.

Herein, a vertical location of each of the plurality of scanning points may be related to a location of the first beam steering cell; and a horizontal location of each of the plurality of scanning points may be related to a location of the second beam steering cell.

According to another embodiment, a lidar device comprising: a polygonal mirror rotating along a rotational axis, reflecting a laser beam provided from a side toward an object and receiving a laser beam reflected from the object; a laser emitting module including a plurality of VCSEL (Vertical Cavity Surface Emitting Laser) elements emitting a laser beam toward the polygonal mirror and arranged along the rotational axis; a metasurface forming, via a plurality of nanopillars disposed on an emission surface side of the laser emitting module, a beam of line pattern line pattern being extended along the rotational axis using the laser beam emitted from the laser emitting module; and a sensor unit receiving, via the polygonal mirror, the laser beam reflected from the object may be provided.

Herein, the metasurface may include a plurality of beam steering cells arranged in the form of an array along the rotation axis and configured to steer the emitted laser beam along the rotation axis.

Herein, a steering direction of the beam steering cell may be determined by a location of the beam steering cell in the array.

Herein, the beam steering cell may include a first beam steering cell located at the top of the array and a second beam steering cell located at the bottom of the array; and a direction of a rotation-axis component of a first steering direction of the first beam steering cell may be opposite to a direction of a rotation-axis component of a second steering direction of the second beam steering cell.

Herein, a first point at which a first laser beam steered by the first beam steering cell is irradiated on the polygonal mirror may be located above a second point at which a second laser beam steered by the second beam steering cell is irradiated on the polygonal mirror.

Herein, a length along the rotation axis of the beam of a line pattern may be smaller than a length along the rotation axis of the metasurface.

Herein, each of the plurality of beam steering cells may include the plurality of nanopillars; at least some of the plurality of nanopillars may form a subwavelength pattern in which at least one attribute among a width, a height, and the number per unit length thereof increases in a direction from a center of the metasurface to a beam steering cell to which some of the plurality of nanopillars belong; and a change rate of the attribute may become higher as a location of the beam steering cell is farther from the center of the metasurface.

Herein, the plurality of nanopillars may form a subwavelength pattern in which, along the rotation axis of the polygonal mirror, a change in at least one attribute of a width, a height, and the number per unit length thereof is repeated, and a change rate of the attribute may change according to a location along the rotation axis.

Herein, a length along the rotation axis of the metasurface may be smaller than a length along the rotation axis of the polygonal mirror.

Herein, a length along the rotation axis of the metasurface may be greater than a length along the rotation axis of the polygonal mirror.

Herein, the laser emitting module may emit a laser beam in a direction perpendicular to the rotation axis of the polygonal mirror.

According to another embodiment, a lidar device comprising: a laser emitting module for including a plurality of VCSEL (Vertical Cavity Surface Emitting Laser) elements emitting a laser beam; a metasurface forming a beam of line pattern extended along a first axis which is one of a vertical axis and a horizontal axis, wherein the metasurface includes a plurality of steering cells steering the laser beam along the first axis by using a nanopillar disposed on an emission surface side of the laser emitting module; a scanning mirror transforming the beam of line pattern to a beam of plane pattern and receiving a laser beam reflected from an object, by being rotated along the first axis; and a sensor unit for receiving the laser beam reflected from the object via the scanning mirror may be provided.

Herein, the plurality of steering cells may be arranged in the form of an array along the first axis; and a length along the first axis of the array may be greater than a length thereof along a second axis, which is perpendicular to the first axis.

Herein, the scanning mirror may have a polygonal column shape including a first reflective surface and a second reflective surface, which shares one side with the first reflective surface, and rotates 360° about the first axis.

Herein, the scanning mirror may rotate about the first axis within a preset range; and a virtual line, along which the beam of a line pattern formed by the metasurface extends, crosses the first axis.

FIG. 1 is a pictorial diagram illustrating a laser emitting device 1000 according to an embodiment.

The laser emitting device 1000 according to an embodiment may emit a laser beam in various directions.

The laser emitting device 1000 according to an embodiment may include a laser emitting unit 100 and a beam steering unit 200.

The laser beam emitted from the laser emitting unit 100 may be steered by the beam steering unit 200. Accordingly, laser beams of various shapes may be formed. For example, the laser emitting device 1000 may emit a laser beam in the form of a planar beam. As another example, the laser emitting device 1000 may emit a laser beam in the form of a linear beam. Alternatively, the laser emitting device 1000 may output a laser beam in the form of a point light source.

Hereinafter, each configuration of the laser emitting device 1000 will be described in detail.

The laser emitting unit 100 may emit a laser beam to one side. The beam steering unit 200 may be disposed at one side of the laser emitting unit 100 and steer the laser beam emitted from the laser emitting unit 100. The beam steering unit 200 may steer the emitted laser beam on the basis of a nanopattern formed by a plurality of nanopillars 10. Accordingly, a flight path of the laser beam emitted from the laser emitting unit 100 may be determined by the nanopattern. The nanopattern may have the same meaning as a subwavelength pattern.

The laser emitting unit 100 may emit laser beams having various wavelengths. For example, the laser emitting unit 100 may emit a laser beam whose wavelength is 905 nm. Alternatively, the laser emitting unit 100 may emit a laser beam having a wavelength of 1550 nm.

The laser emitting unit 100 may be provided in the form of a flat panel.

The laser emitting unit 100 may include a support surface and an emission surface. The support surface and the emission surface may be parallel to each other.

The laser emitting unit 100 may emit a laser beam in a direction perpendicular to the support surface. Alternatively, the laser emitting unit 100 may emit a laser beam in a direction perpendicular to the emission surface.

The beam steering unit 200 may generate laser beams of various forms from the laser beam provided from one side. For example, the beam steering unit 200 may generate a laser beam in the form of a linear beam from a laser beam in the form of a point light source. As another example, the beam steering unit 200 may generate a laser beam in the form of a planar beam from a laser beam in the form of a point light source. As still another example, the beam steering unit 200 may generate a laser beam in the form of a planar beam from a laser beam in the form of a linear beam.

The beam steering unit 200 may refract the laser beam emitted from the laser emitting unit 100. For example, the beam steering unit 200 may refract the emitted laser beam on the basis of a nanopattern formed by the plurality of nanopillars 10. An angle-after-refraction of the refracted laser beam may be set on the basis of the nanopattern.

The beam steering unit 200 may include the plurality of nanopillars 10.

The plurality of nanopillars 10 may have a subwavelength size. For example, a pitch between the plurality of nanopillars 10 may be less than a wavelength of the laser beam emitted from the laser emitting unit 100. Alternatively, a width, diameter, and height of the nanopillars 10 may be less than a size of the wavelength of the laser beam.

The beam steering unit 200 may be a metasurface.

The beam steering unit 200 may adjust a phase of a laser beam emitted from the laser emitting unit 100 to refract the laser beam.

The beam steering unit 200 may be disposed on the laser emitting unit 100. For example, the beam steering unit 200 may be disposed at the emission surface side of the laser emitting unit 100.

Alternatively, the beam steering unit 200 may be deposited on the laser emitting unit 100. The plurality of nanopillars 10 may be formed on an upper portion of the laser emitting unit 100. The plurality of nanopillars 10 may form various nanopatterns on the laser emitting unit 100.

The nanopillars 10 may have various shapes. For example, the nanopillars 10 may have a cylindrical shape, a polygonal column shape, a conical shape, a polypyramid shape, or the like. Furthermore, the nanopillars 10 may have an irregular shape.

Figure 2:
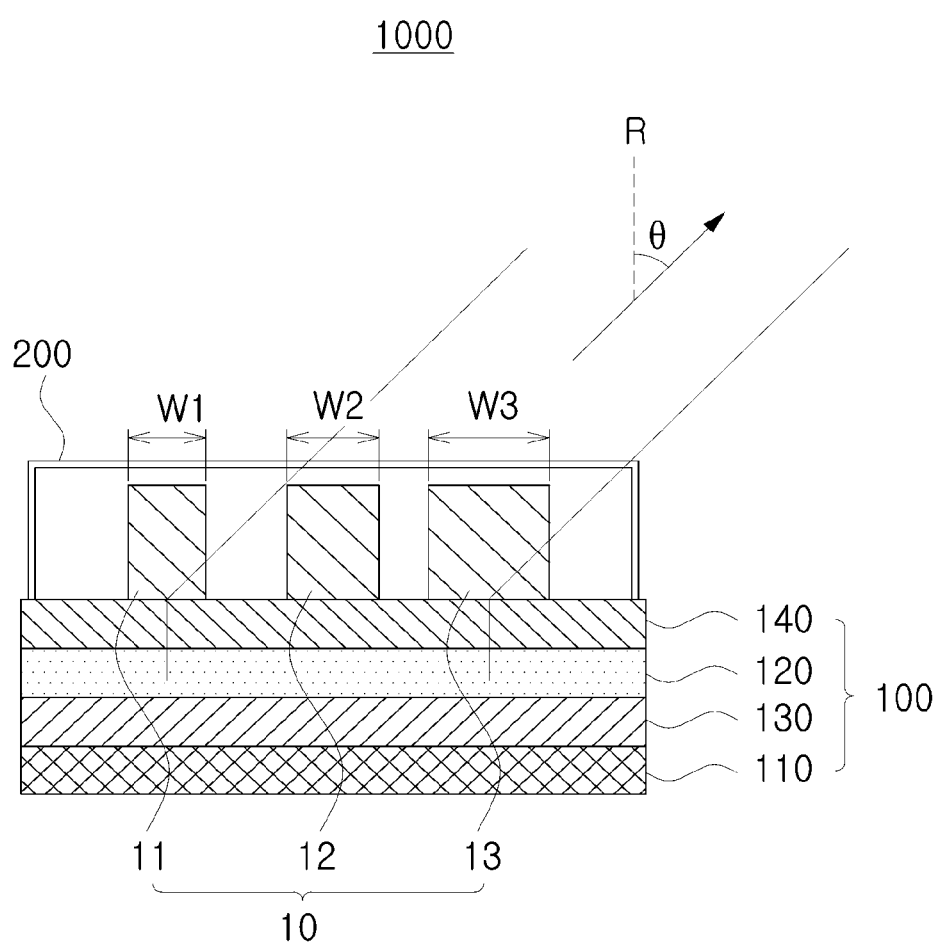
FIGS. 2 to 7 are cross-sectional views of a laser emitting device according to various embodiments.

FIG. 2 is a cross-sectional view of a laser emitting device 1000 according to an embodiment.

As illustrated in FIG. 2, the laser emitting device 1000 according to an embodiment may include a laser emitting unit 100 and a beam steering unit 200.

Each configuration of the laser emitting device 1000 will be described in detail below.

The laser emitting unit 100 according to an embodiment may include a substrate 110 electrically connected to an external power source, a light source unit 120 configured to emit a laser beam, and reflection units 130 and 140 configured to reflect the laser beam emitted from the light source unit 120.

The laser beam emitted from the light source unit 120 may oscillate by being reflected by the reflection units 130 and 140. The emitted laser beam may be repeatedly reflected by a first reflection unit 130 and a second reflection unit 140 and then pass through the second reflection unit 140 to be emitted to the outside of the laser emitting unit 100.

The light source unit 120 may emit laser beams of various wavelengths. For example, the light source unit 120 may emit a laser beam whose wavelength is 905 nm. Alternatively, the light source unit 120 may emit a laser beam having a wavelength of 1550 nm.

The light source unit 120 may be formed of various materials. For example, the light source unit 120 may include GaAs, AlGaAs, GaAlAs, and Si.

A wavelength of a laser beam emitted from the light source unit 120 may vary according to materials constituting the light source unit 120.

An intensity of a laser beam emitted from the light source unit 120 may vary according to a strength of power received from the outside.

The light source unit 120 may be disposed between the first reflection unit 130 and the second reflection unit 140.

The first reflection unit 130 may reflect a laser beam provided to one side. For example, the first reflection unit 130 may reflect a laser beam emitted from the light source unit 120 toward the light source unit 120. The first reflection unit 130 may reflect a laser beam reflected from the second reflection unit 140 toward the light source unit 120.

The first reflection unit 130 may include a plurality of layers. The plurality of layers may have a structure in which a layer having a relatively high refractive index and a layer having a relatively low refractive index are alternately disposed. Each of the plurality of layers may have a thickness that is ¼ of a wavelength of a laser beam emitted from the light source unit 120.

As illustrated, the first reflection unit 130 may be disposed on an upper portion of the substrate 110. For example, the first reflection unit 130 may be deposited on the substrate 110. Of course, another configuration may be included between the substrate 110 and the first reflection unit 130.

The first reflection unit 130 may be a distributed Bragg reflector (DBR).

The first reflection unit 130 may include GaAs, indium tin oxide (ITO), indium zinc oxide (IZO), Ga—In—Zn-oxide (GIZO), Al—Zn-oxide (AZO), Ga—Zn-oxide (GZO), and ZnO.

The second reflection unit 140 may reflect a laser beam provided to one side. For example, the second reflection unit 140 may reflect a laser beam emitted from the light source unit 120 toward the light source unit 120. The second reflection unit 140 may reflect the laser beam reflected from the first reflection unit 130 toward the light source unit 120.

The second reflection unit 140 may include a plurality of layers. The plurality of layers may have a structure in which a layer having a relatively high refractive index and a layer having a relatively low refractive index are alternately disposed. Each of the plurality of layers may have a thickness that is ¼ of a wavelength of a laser beam emitted from the light source unit 120.

A laser beam that is emitted from the light source unit 120 and then reflected by the first reflection unit 130 and the second reflection unit 140 may pass through the second reflection unit 140 and be emitted toward the nanopillars 10. The laser beam may be emitted in a direction perpendicular to the substrate 110.

The second reflection unit 140 may be disposed on an upper portion of the light source unit 120. For example, the second reflection unit 140 may be deposited on the light source unit 120. Of course, another configuration may be included between the substrate 110 and the second reflection unit 140.

The second reflection unit 140 may be a distributed Bragg reflector (DBR).

The second reflection unit 140 may include GaAs, CuAl2O, NiO, and CuO.

An electrical attribute of the first reflection unit 130 may differ from an electrical attribute of the second reflection unit 140. For example, the first reflection unit 130 may be an n-type semiconductor, and the second reflection unit 140 may be a p-type semiconductor.

The first reflection unit 130 may include more layers than the second reflection unit 140.

A reflectivity of the first reflection unit 130 may be higher than a reflectivity of the second reflection unit 140.

The laser emitting unit 100 according to an embodiment may be a vertical cavity surface emitting laser (VCSEL) element. A laser beam emitted from the laser emitting unit 100 may be emitted in the direction perpendicular to the substrate 110. The emitted laser beam may be emitted in the direction perpendicular to the support surface of the laser emitting unit 100.

In FIG. 2, the first reflection unit 130 is illustrated as being disposed between the substrate 110 and the light source unit 120. However, this is merely an example, and the locations of the first reflection unit 130 and the second reflection unit 140 may also be reversed. The laser emitting unit 100 may also include configurations other than the illustrated configurations.

Meanwhile, in FIG. 2, the nanopillars 10 and the second reflection unit 140 are illustrated as being in contact with each other. However, this is merely for convenience of the description, and another configuration may be disposed between the nanopillars 10 and the second reflection unit 140. For example, a transparent electrode layer may be disposed between the nanopillars 10 and the second reflection unit 140.

The beam steering unit 200 may refract a laser beam emitted from the laser emitting unit 100. For example, the beam steering unit 200 may control a phase of the laser beam to steer the laser beam. Also, the beam steering unit 200 may control a light quantity of the laser beam to steer the laser beam.

The beam steering unit 200 may include the plurality of nanopillars 10.

A height of the nanopillars 10 may be at least half or more of a height of a wavelength of a laser beam emitted from the laser emitting unit 100.

The nanopillars 10 may be formed of various materials. For example, the nanopillars 10 may be formed of metals such as As, Au, Al, and Pt or metal nitrides such as TiN and TaN.

A refractive index of the nanopillars 10 may be higher than the refractive index of the second reflection unit 140.

The plurality of nanopillars 10 may form various nanopatterns. The beam steering unit 200 may steer a laser beam emitted from the laser emitting unit 100 on the basis of the nanopatterns.

The nanopillars 10 may form nanopatterns on the basis of various attributes. The attributes may include a width W, a pitch P, a height H, and a number per unit length of the nanopillars 10.

Hereinafter, nanopatterns formed on the basis of various attributes and laser beam steering according to the nanopatterns will be described.

The plurality of nanopillars 10 may form nanopatterns on the basis of the width W thereof. For example, the plurality of nanopillars 10 may be disposed such that widths W1, W2, and W3 thereof gradually increase in one direction. In this case, a laser beam emitted from the laser emitting unit 100 may be steered in the direction in which the width W of the nanopillars 10 increases.

For example, the beam steering unit 200 may include a first nanopillar 11 having a first width W1, a second nanopillar 12 having a second width W2, and a third nanopillar 13 having a third width W3. The third width W3 may be greater than the first width W1 and the second width W2. The second width W2 may be greater than the first width W1. That is, the width W of the nanopillars 10 may gradually increase from the first nanopillar 11 toward the third nanopillar 13. In this case, a laser beam emitted from the laser emitting unit 100 may be steered in a third direction, which is a direction between a first direction, in which the laser beam is emitted from the laser emitting unit 100, and a second direction, which is a direction from the first nanopillar 11 to the third nanopillar 13. The third direction may be calculated on the basis of the sum of a first vector having the first direction and a second vector having the second direction. The second direction may be perpendicular to the first direction.

Meanwhile, a steering angle θ of the laser beam may vary according to a change rate of the width W of the nanopillars 10. Here, the change rate of the width W of the nanopillars 10 may refer to a numerical value indicating, on average, a degree of change in the width W of the plurality of nanopillars 10 which are adjacent to each other. Here, the steering angle θ may refer to an angle between a laser beam steered by the beam steering unit 200 and a virtual reference line R. The reference line R may relate to an emission direction of a laser beam emitted from the laser emitting unit 100. For example, the reference line R may be parallel to the emission direction.

The change rate of the width W of the nanopillars 10 may be calculated on the basis of a difference between the first width W1 and the second width W2 and a difference between the second width W2 and the third width W3.

The difference between the first width W1 and the second width W2 may be different from the difference between the second width W2 and the third width W3.

The steering angle θ of the laser beam may vary according to the width W of the nanopillars 10.

Specifically, the steering angle θ may increase as the change rate of the width W of the nanopillars 10 increases.

For example, the nanopillars 10 may form, on the basis of the width W thereof, a first pattern having a first change rate. Also, the nanopillars 10 may form, on the basis of the width W thereof, a second pattern having a second change rate which is lower than the first change rate.

In this case, a first steering angle due to the first pattern may be larger than a second steering angle due to the second pattern.

Meanwhile, the steering angle θ may be in a range of −90° to 90°.

The plurality of nanopillars 10 may form nanopatterns on the basis of a change in the pitch P between the nanopillars P adjacent to each other. The beam steering unit 200 may steer a laser beam emitted from the laser emitting unit 100 on the basis of the nanopatterns formed on the basis of the change in the pitch P between the nanopillars 10.

Figure 3:
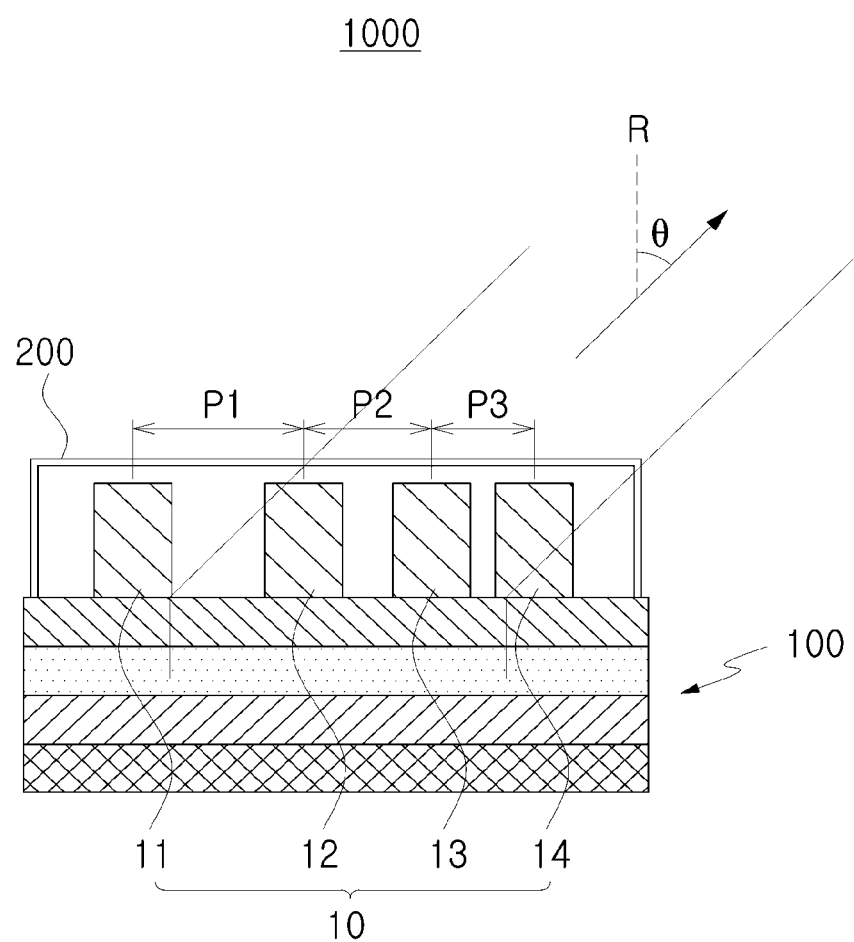

FIG. 3 is a cross-sectional view for describing beam steering according to changes in pitches P1, P2, and P3 between nanopillars 10. A laser emitting device 1000 may include a laser emitting unit 100 and a beam steering unit 200. The beam steering unit 200 may include a plurality of nanopillars 10.

The laser emitting unit 100 of FIG. 3 may correspond to the laser emitting unit 100 described above with reference to FIGS. 1 and 2. Accordingly, detailed description thereof will be omitted, and differences from the laser emitting device 1000 of FIG. 2 will mainly be described.

According to an embodiment, a pitch P between the nanopillars 10 may gradually decrease in one direction. Here, the pitch P may refer to a distance between centers of two nanopillars 10 adjacent to each other. For example, a first pitch P1 may be defined as a distance between a center of a first nanopillar 11 and a center of a second nanopillar 12. Alternatively, the first pitch P1 may be defined as the shortest distance between the first nanopillar 11 and the second nanopillar 12.

A laser beam emitted from the laser emitting unit 100 may be steered in a direction in which the pitch P between the nanopillars 10 decreases.

The beam steering unit 200 may include a first nanopillar 11, a second nanopillar 12, a third nanopillar 13, and a fourth nanopillar 14. In this case, a first pitch P1 may be obtained on the basis of a distance between the first nanopillar 11 and the second nanopillar 12. Likewise, a second pitch P2 may be obtained on the basis of a distance between the second nanopillar 12 and the third nanopillar 13. Also, a third pitch P3 may be obtained on the basis of a distance between the third nanopillar 13 and the fourth nanopillar 14. In this case, the first pitch P1 may be greater than the second pitch P2 and the third pitch P3. The second pitch P2 may be greater than the third pitch P3. That is, the pitch P gradually decreases from the first nanopillar 11 toward the fourth nanopillar 14.

In this case, a laser beam emitted from the laser emitting unit 100 may be steered in a direction between a first direction in which the laser beam is emitted from the laser emitting unit 100 and a second direction from the first nanopillar 11 to the third nanopillar 13.

The steering angle θ of the laser beam may vary according to the pitch P between the nanopillars 10.

Specifically, the steering angle θ of the laser beam may vary according to a change rate of the pitch P between the nanopillars 10. Here, the change rate of the pitch P between the nanopillars 10 may refer to a numerical value indicating, on average, a degree of change in the pitch P between the nanopillars 10 adjacent to each other.

The steering angle θ of the laser beam may increase as the change rate of the pitch P between the nanopillars 10 increases.

For example, the nanopillars 10 may form, on the basis of the pitch P therebetween, a first pattern having a first change rate. Also, the nanopillars 10 may form, on the basis of the pitch P therebetween, a second pattern having a second change rate which is lower than the first change rate.

In this case, a first steering angle due to the first pattern may be larger than a second steering angle due to the second pattern.

Meanwhile, the above-described laser beam steering principle according to a change in the pitch P between the nanopillars 10 may be similarly applied even when the number of nanopillars 10 per unit length changes.

For example, when the number of nanopillars 10 per unit length changes, a laser beam emitted from the laser emitting unit 100 may be steered in a direction between a first direction in which the laser beam is emitted from the laser emitting unit 100 and a second direction in which the number of nanopillars 10 per unit length increases.

Meanwhile, the plurality of nanopillars 10 may form nanopatterns on the basis of a change in a height H of the nanopillars 10.

Figure 4:
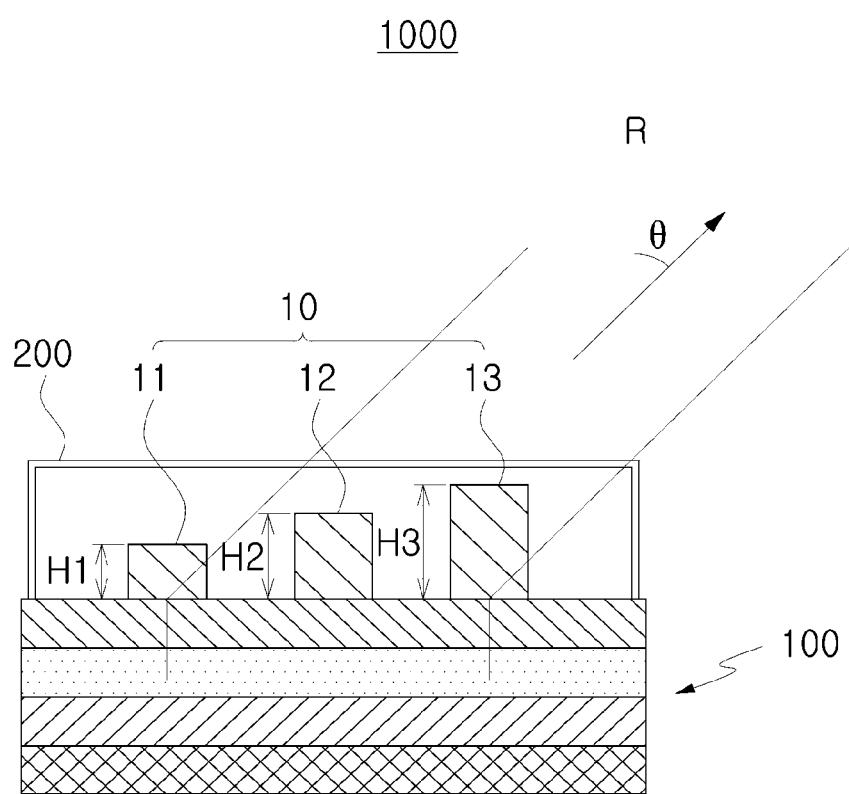

FIG. 4 is a cross-sectional view for describing beam steering according to a change in a height H of the nanopillars 10. Referring to FIG. 4, a laser emitting device 1000 may include a laser emitting unit 100 and a beam steering unit 200. The beam steering unit 200 may include a plurality of nanopillars 10.

The laser emitting unit 100 of FIG. 4 may correspond to the laser emitting unit 100 described above with reference to FIGS. 1 and 2. Accordingly, detailed description thereof will be omitted, and differences from the laser emitting device 1000 of FIG. 2 will be mainly described.

According to an embodiment, heights H1, H2, and H3 of the plurality of nanopillars 10 may gradually increase in one direction. A laser beam emitted from the laser emitting unit 100 may be steered in a direction in which the height H of the nanopillars 10 increases.

For example, the beam steering unit 200 may include a first nanopillar 11 having a first height H1, a second nanopillar 12 having a second height H2, and a third nanopillar 13 having a third height H3. The third height H3 may be higher than the first height H1 and the second height H2. The second height H2 may be higher than the first height H1. That is, the height H of the nanopillars 10 may gradually increase from the first nanopillar 11 to the third nanopillar 13. In this case, a laser beam emitted from the laser emitting unit 100 may be steered in a direction between a first direction in which the laser beam is emitted from the laser emitting unit 100 and a second direction from the first nanopillar 11 to the third nanopillar 13.

The steering angle θ of the laser beam may vary according to the height H of the nanopillars 10.

Specifically, the steering angle θ of the laser beam may vary according to a change rate of the height H of the nanopillars 10. Here, the change rate of the height H of the nanopillars 10 may refer to a numerical value indicating, on average, a degree of change in the height H of the nanopillars 10 adjacent to each other.

The change rate of the height H of the nanopillars 10 may be calculated on the basis of a difference between the first height H1 and the second height H2 and a difference between the second height H2 and the third height H3. The difference between the first height H1 and the second height H2 may be different from the difference between the second height H2 and the third height H3.

The steering angle θ of the laser beam may increase as the change rate of the height H of the nanopillars 10 increases.

For example, the nanopillars 10 may form, on the basis of the height H thereof, a first pattern having a first change rate. Also, the nanopillars 10 may form, on the basis of the height H thereof, a second pattern having a second change rate which is lower than the first change rate.

In this case, a first steering angle due to the first pattern may be larger than a second steering angle due to the second pattern.

Meanwhile, although in FIGS. 2 to 4, the first to fourth nanopillars 11, 12, 13, and 14 are illustrated as being formed as one set on the laser emitting unit 100, a plurality of sets of nanopillars 10 may also form nanopatterns on a single laser emitting unit 100. For example, a new nanopattern in which the nanopatterns formed in FIGS. 2 to 4 are repeated may be formed on the laser emitting unit 100.

Also, the nanopatterns formed in FIGS. 2 to 4 may be formed in combination with each other on a single laser emitting unit 100.

Hereinafter, a laser emitting device having various nanopatterns and laser beam steering according to the nanopatterns will be described.

Figure 5:
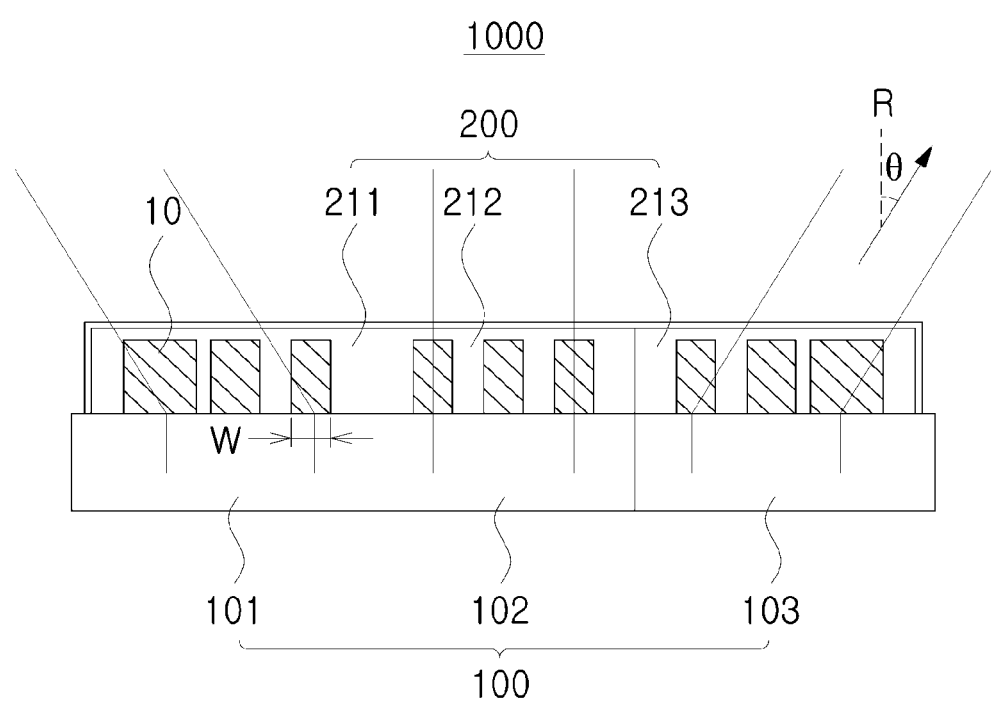

FIG. 5 is a cross-sectional view for describing a laser emitting device 1000 according to an embodiment. Referring to FIG. 5, the laser emitting device 1000 may include a plurality of laser emitting units 101, 102, and 103. Also, the laser emitting device 1000 may include a beam steering unit 200 including a plurality of nanopillars 10.

Laser beams emitted from the plurality of laser emitting units 101, 102, and 103 may be steered by the plurality of nanopillars 10 disposed on the plurality of laser emitting units 101, 102, and 103.

Each configuration of the laser emitting device 1000 will be described in detail below.

The laser emitting device 1000 may include a first laser emitting unit 101, a second laser emitting unit 102, and a third laser emitting unit 103. Meanwhile, the first to third laser emitting units 101, 102, and 103 may correspond to the laser emitting unit 100 described above with reference to FIGS. 1 and 2. Accordingly, detailed description thereof will be omitted.

The laser emitting unit 100 may be provided in the form of an array. For example, the laser emitting unit 100 may be provided in the form of a 1×3 array. In this case, the first to third laser emitting units 101, 102, and 103 may be respectively disposed in a first column to a third column of an array.

The first to third laser emitting units 101, 102, and 103 may emit a laser beam in the same direction. For example, the first to third laser emitting units 101, 102, and 103 may emit a laser beam in a direction perpendicular to an emission surface of the laser emitting device 1000.

The beam steering unit 200 may be provided in the form of an array. The beam steering unit 200 may include a plurality of beam steering cells 210. The beam steering cells 210 may include a first beam steering cell 211, a second beam steering cell 212, and a third beam steering cell 213. The plurality of beam steering cells 210 may be arranged in the form of an array.

The first to third beam steering cells 211, 212, and 213 may control phases of laser beams emitted from the plurality of laser emitting units 101, 102, and 103, respectively, to change irradiation directions of the laser beams.

Also, the first to third beam steering cells 211, 212, and 213 may control transmittances of laser beams emitted from the plurality of laser emitting units 101, 102, and 103, respectively, to change irradiation directions of the laser beams.

Each of the first to third beam steering cells 211, 212, and 213 may include the plurality of nanopillars 10 forming nanopatterns. A laser beam emitted from the laser emitting unit 100 may be steered by the nanopillars 10.

The nanopillars 10 may steer a laser beam emitted from the laser emitting unit 100 to form laser beams of various shapes.

For example, the nanopillars 10 may form a laser beam having a shape diverging from a center of the laser emitting unit 100. As another example, the nanopillars 10 may form a laser beam having a shape converging toward an irradiation path of laser beams emitted from the laser emitting unit 100 disposed at the center of the array. As still another example, the nanopillars 10 may form a laser beam irradiated in a direction perpendicular to a support surface of the laser emitting device 1000.

Hereinafter, for convenience of description, the case in which a laser beam steered by the nanopillars 10 has a form of diverging from the center of the laser emitting unit 100 will be mainly described.

Meanwhile, the plurality of nanopillars 10 may form nanopatterns on the basis of locations of beam steering cells 210. For example, the nanopillars 10 may form nanopatterns that cause a steering angle θ due to a beam steering cell 210 far from the center of the beam steering unit 200 to be larger than a steering angle θ due to a beam steering cell 210 close to the center of the beam steering unit 200.

Such nanopatterns may be formed on the basis of abovedescribed width W of the nanopillars 10, pitch P between the nanopillars 10, and height H of the nanopillars 10.

Referring to FIG. 5, the nanopillars 10 may form nanopatterns on the basis of a change in the width W thereof and locations of the beam steering cells 210.

Specifically, the second beam steering cell 212 located at a central portion of the beam steering unit 200 may include a plurality of nanopillars 10 having the same width W.

Also, the first beam steering cell 211 located farther from the center of the beam steering unit 200 than the second beam steering cell 212 may include a plurality of nanopillars 10 whose width W gradually increases away from the center of the beam steering unit 200.

Likewise, the third beam steering cell 213 located farther from the center of the beam steering unit 200 than the second beam steering cell 212 may include a plurality of nanopillars 10 whose width W gradually increases away from the center of the beam steering unit 200.

Accordingly, the beam steering unit 200 may form a laser beam having a diverging shape.

Meanwhile, a first steering angle of the first beam steering cell located far from the center of the beam steering unit 200 may be larger than a second steering angle of the second beam steering cell located close to the center of the beam steering unit 200.

In this case, a change rate of a width W of the nanopillars 10 included in the first beam steering cell may be higher than a change rate of a width W of the nanopillars 10 included in the second beam steering cell.

Meanwhile, in FIG. 5, laser beams steered by the first beam steering cell 211 and the third beam steering cell 213 are each illustrated as not crossing an extension line extending in an emission direction of a laser beam steered by the second beam steering cell 212. However, embodiments are not limited thereto, and the laser beams steered by the first beam steering cell 211 and the third beam steering cell 213, may also each cross the extension line.

Accordingly, the laser beam steered by the first beam steering cell 211 may be steered in a direction between a first direction in which the laser beam is emitted from the laser emitting unit 100 and a second direction from the first beam steering cell 211 to the center of the beam steering unit 200.

Likewise, the laser beam steered by the third beam steering cell 213 may be steered in a direction between a third direction in which the laser beam is emitted from the laser emitting unit 100 and a fourth direction from the third beam steering cell 213 to the center of the beam steering unit 200.

Meanwhile, the plurality of nanopillars 10 forming nanopatterns may form patterns which are symmetrical about the center of the beam steering unit 200. For example, a first nanopattern formed by the nanopillars 10 included in the first beam steering cell 211 and a third nanopattern formed by the nanopillars 10 included in the third beam steering cell 213 may be symmetrical to each other.

Accordingly, the first steering angle due to the first beam steering cell 211 may be equal in size to the third steering angle due to the third beam steering cell 213.

Meanwhile, the shapes of the nanopillars 10 included in the plurality of beam steering cells 210 may be different from each other. For example, the nanopillars 10 included in the first beam steering cell 211 may have a cylindrical shape, and the nanopillars 10 included in the second beam steering cell 212 may have a polygonal column shape.

Also, the shapes of the plurality of nanopillars 10 included in the same beam steering cell 210 may be different from each other. For example, some of the plurality of nanopillars 10 included in the first beam steering cell 211 may have a cylindrical shape, and the remaining nanopillars 10 may have a polygonal column shape.

Meanwhile, steering angles θ of the plurality of beam steering cells 210 may be different from each other. For example, the first steering angle of the first beam steering cell 211 and a third steering angle of the third beam steering cell 213 may be different from each other.

Meanwhile, the plurality of laser emitting units 100 may be controlled independently. For example, attributes (wavelength, intensity, shooting cycle, and the like) of laser beams emitted from each of the laser emitting units 100 may be different. Also, the on/off state of each of the laser emitting units 100 may be controlled separately.

For example, the laser emitting unit 100 may include a plurality of VCSEL elements arranged in the form of an array. In this case, the on/off states of the plurality of VCSEL elements may be controlled independently. That is, the laser emitting unit 100 may include an addressable VCSEL array.

The laser emitting device 1000 may adjust the on/off state and intensity of each of the plurality of laser emitting units 100 to adjust steering angles of laser beams.

Alternatively, the plurality of laser emitting units 100 may be linked. For example, the on/off states of the first laser emitting unit 101 and the second laser emitting unit 102 may be controlled together.

The laser emitting device 1000 may emit laser beams of various wavelengths. For example, the first laser emitting unit 101 may emit a first laser beam having a first wavelength, and the second laser emitting unit 102 may emit a second laser beam having a second wavelength.

Figure 6:
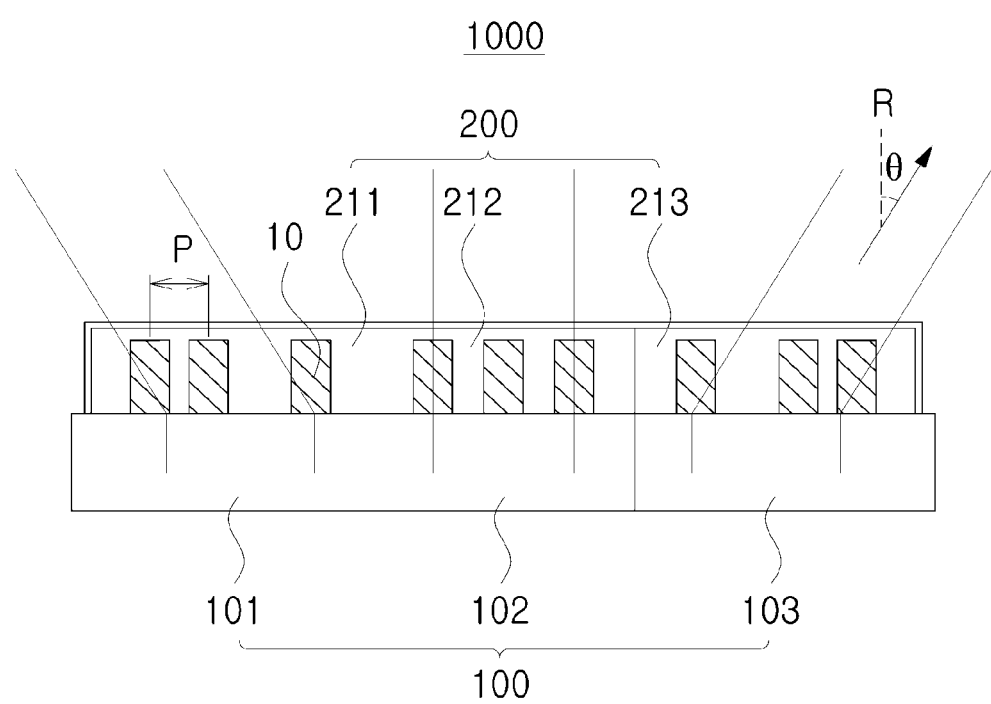

FIG. 6 is a cross-sectional view for describing a laser emitting device 1000 according to another embodiment. Referring to FIG. 6, the laser emitting device 1000 may include a plurality of laser emitting units 100. Also, the laser emitting device 1000 may include a beam steering unit 200 including a plurality of nanopillars 10. The beam steering unit 200 may include a plurality of beam steering cells 210.

Laser beams emitted from the plurality of laser emitting units 100 may be steered by a plurality of nanopillars 10 included in the plurality of beam steering cells 210.

Each configuration of the laser emitting device 1000 will be described in detail below.

The laser emitting device 1000 may include a first laser emitting unit 101, a second laser emitting unit 102, and a third laser emitting unit 103. The beam steering cells 210 may include a first beam steering cell 211, a second beam steering cell 212, and a third beam steering cell 213.

Meanwhile, the first to third laser emitting units 101, 102, and 103 may correspond to the laser emitting unit 100 described above with reference to FIGS. 1, 2, and 5. Accordingly, detailed description thereof will be omitted, and differences from the laser emitting device 1000 of FIG. 5 will be mainly described.

Referring to FIG. 6, the nanopillars 10 may form nanopatterns on the basis of a change in a pitch P therebetween and locations of the beam steering cells 210.

Specifically, the second beam steering cell 212 located at the central portion of the beam steering unit 200 may include a plurality of nanopillars 10 disposed at equal pitches P.

Also, the first beam steering cell 211 located farther from the center of the beam steering unit 200 than the second beam steering cell 212 may include a plurality of nanopillars 10 which are disposed at a pitch P which gradually increases away from the center of the beam steering unit 200.

Likewise, the third beam steering cell 213 located farther from the center of the beam steering unit 200 than the second beam steering cell 212 may include a plurality of nanopillars 10 which are disposed at a pitch P which gradually increases away from the center of the beam steering unit 200.

Accordingly, the beam steering unit 200 may form a laser beam having a diverging shape.

Meanwhile, a first steering angle of the first beam steering cell located far from the center of the beam steering unit 200 may be larger than a second steering angle of the second beam steering cell located close to the beam steering unit 200.

In this case, a change rate of a pitch P between the nanopillars 10 included in the first beam steering cell may be higher than a change rate of a pitch P between the nanopillars 10 included in the second beam steering cell.

Meanwhile, the above-described laser beam steering principle according to a change in the pitch P between the nanopillars 10 may be similarly applied even when the number of nanopillars 10 per unit length changes.

For example, the plurality of nanopillars 10 included in the first beam steering cell 211 may form a nanopattern in which the number of nanopillars 10 per unit length gradually increases away from the center of the beam steering unit 200.

Likewise, the plurality of nanopillars 10 included in the third beam steering cell 213 may form a nanopattern in which the number of nanopillars 10 per unit length gradually increases away from the center of the beam steering unit 200.

Also, the plurality of nanopillars 10 included in the second beam steering cell 212 located at the central portion of the beam steering unit 200 may form a nanopattern in which the number of nanopillars 10 per unit length is constant.

Figure 7:
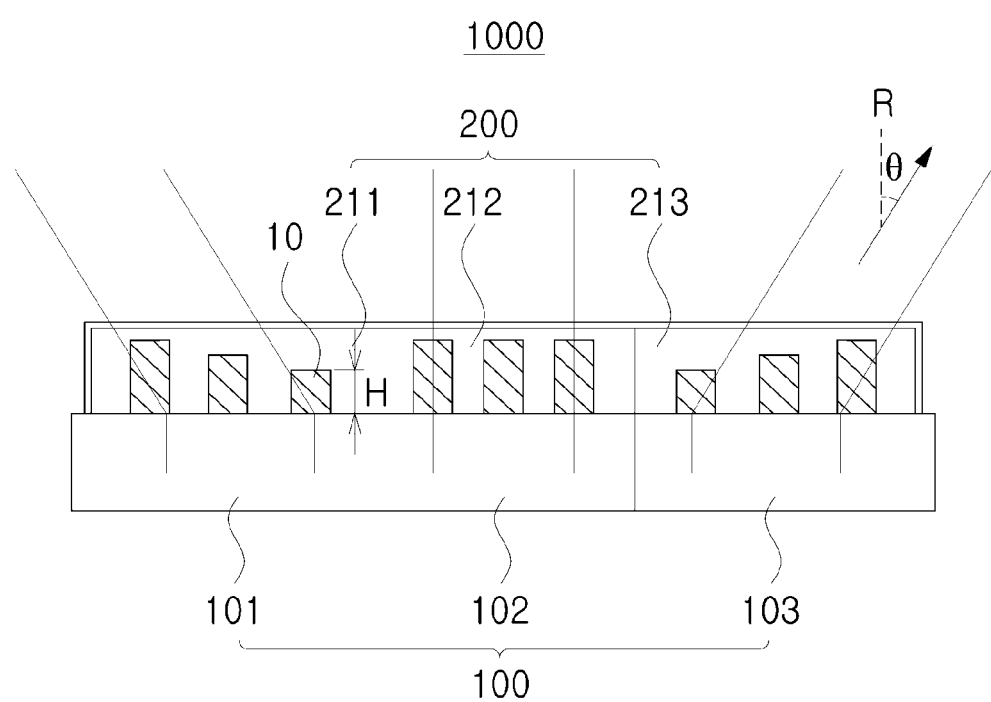

FIG. 7 is a cross-sectional view for describing a laser emitting device 1000 according to still another embodiment. Referring to FIG. 7, the laser emitting device 1000 may include a plurality of laser emitting units 100. Also, the laser emitting device 1000 may include a beam steering unit 200 including a plurality of nanopillars 10. The beam steering unit 200 may include a plurality of beam steering cells 210.

Laser beams emitted from the plurality of laser emitting units 100 may be steered by a plurality of nanopillars 10 included in the plurality of beam steering cells 210.

Each configuration of the laser emitting device 1000 will be described in detail below.

The laser emitting device 1000 may include a first laser emitting unit 101, a second laser emitting unit 102, and a third laser emitting unit 103. The beam steering cells 210 may include a first beam steering cell 211, a second beam steering cell 212, and a third beam steering cell 213.

Meanwhile, the first to third laser emitting units 101, 102, and 103 may correspond to the laser emitting unit 100 described above with reference to FIGS. 1, 2, and 5. Accordingly, detailed description thereof will be omitted, and differences from the laser emitting device 1000 of FIG. 5 will be mainly described.

Referring to FIG. 7, the nanopillars 10 may form nanopatterns on the basis of a change in a height H thereof and locations of the beam steering cells 210.

Specifically, the second beam steering cell 212 located at the central portion of the beam steering unit 200 may include a plurality of nanopillars 10 having the same height H.

Also, the first beam steering cell 211 located farther from the center of the beam steering unit 200 than the second beam steering cell 212 may include a plurality of nanopillars 10 whose height H gradually increases away from the center of the beam steering unit 200.

Likewise, the third beam steering cell 213 located farther from the center of the beam steering unit 200 than the second beam steering cell 212 may include a plurality of nanopillars 10 whose height H gradually increases away from the center of the beam steering unit 200.

Accordingly, the beam steering unit 200 may form a laser beam having a diverging shape.

Meanwhile, a first steering angle of the first beam steering cell located far from the center of the beam steering unit 200 may be larger than a second steering angle of the second beam steering cell located close to the center of the beam steering unit 200.

In this case, a change rate of a height H of the nanopillars 10 included in the first beam steering cell may be higher than a change rate of a height H of the nanopillars 10 included in the second beam steering cell.

Meanwhile, for convenience of description, nanopillars 10 have been described as forming nanopatterns by using only one of above attributes W, P, and H. However, embodiments are not limited thereto, and the nanopillars 10 may form nanopatterns by using more than one of the attributes. For example, the plurality of nanopillars 10 included in the first beam steering cell 211 may form nanopatterns on the basis of a change in the width W thereof, and the plurality of nanopillars 10 included in the third beam steering cell 213 may form nanopatterns on the basis of a change in the pitch P therebetween.

Also, the plurality of nanopillars 10 may form nanopatterns on a single beam steering cell 210 by using multiple attributes. For example, the plurality of nanopillars 10 included in the first beam steering cell 211 may form nanopatterns on the basis of changes in the width W thereof and the pitch P therebetween.

Meanwhile, although in FIGS. 5 to 7, the plurality of nanopillars 10 forming nanopatterns are illustrated as having shapes symmetrical about the center of the array, the nanopatterns may also have asymmetrical shapes. Accordingly, a first steering angle of the first beam steering cell 211 may be different from a third steering angle of a laser beam emitted from the third beam steering cell 213.

Also, the plurality of nanopillars 10 included in each of the plurality of beam steering cells 210 may form the same nanopattern. Accordingly, laser beams emitted from the plurality of laser emitting units 100 may be steered in the same direction.

Meanwhile, although it is illustrated in FIGS. 5 to 7 that a single nanopattern is formed in each beam steering cell 210, nanopatterns in which the same pattern is repeated may also be formed in a single beam steering cell 210.

Meanwhile, the second beam steering cell 212 may not include the nanopillars 10. Accordingly, a laser beam passing through the second beam steering cell 212 may be irradiated in a direction which is the same as an emission direction in which the laser beam is emitted from the laser emitting unit 100.

Hereinafter, beam steering by beam steering cells arranged in the form of a two-dimensional array will be described.

Figure 8:
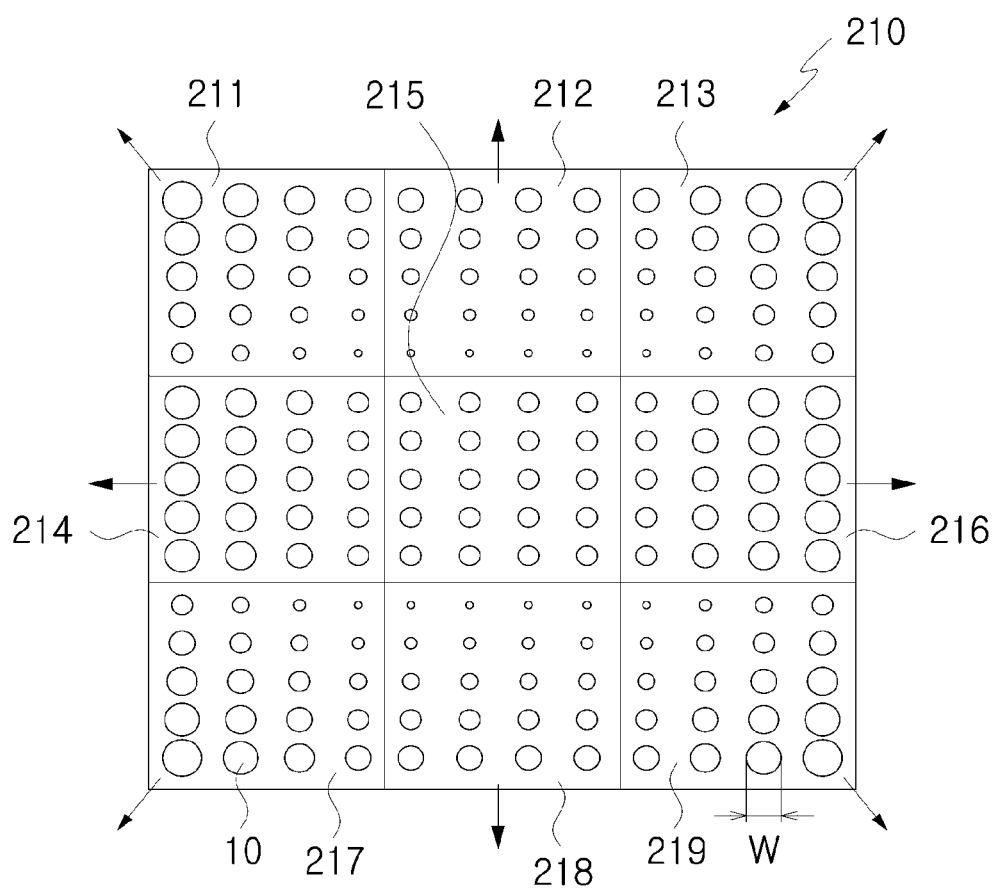
FIGS. 8 to 14 are views for describing a beam steering unit according to various embodiments.

FIG. 8 is a view for describing a beam steering unit according to an embodiment.

Referring to FIG. 8, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to a vertical direction and a column direction corresponding to a horizontal direction.

The beam steering cells 210 may use a plurality of nanopillars 10 forming nanopatterns to steer laser beams emitted from the laser emitting units.

The beam steering cells 210 may steer the laser beams emitted from the laser emitting units 100 to form laser beams of various shapes.

For example, the beam steering cells 210 may form a laser beam having a shape diverging from the center of the laser emitting unit 100.

The plurality of nanopillars 10 may form nanopatterns on the basis of locations of the beam steering cells 210. For example, the plurality of nanopillars 10 may form a nanopattern in which a width W thereof gradually increases away from the center of the beam steering unit 200. Accordingly, laser beams emitted from the laser emitting unit 100 may have a shape diverging from the center of the beam steering unit 200.

Referring to FIG. 8, the plurality of nanopillars 10 may form nanopatterns on the basis of locations of the beam steering cells 210.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a width W thereof gradually increases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a width W thereof gradually increases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a width W thereof gradually increases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a width W thereof gradually increases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215. In this case, the plurality of nanopillars 10 included in the first beam steering cell 211 may form a nanopattern in which a width W thereof gradually increases away from the center of the beam steering unit 200. Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215. In this case, the plurality of nanopillars 10 included in the third beam steering cell 213 may form a nanopattern in which a width W thereof gradually increases away from the center of the beam steering unit 200. Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215. In this case, the plurality of nanopillars 10 included in the seventh beam steering cell 217 may form a nanopattern in which a width W thereof gradually increases away from the center of the beam steering unit 200. Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215. In this case, the plurality of nanopillars 10 included in the ninth beam steering cell 219 may form a nanopattern in which a width W thereof gradually increases away from the center of the beam steering unit 200. Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, a beam steering unit 200 according to another embodiment may steer a laser beam on the basis of a change in a pitch P between nanopillars 10, i.e., the number of nanopillars 10 per unit length.

Figure 9:
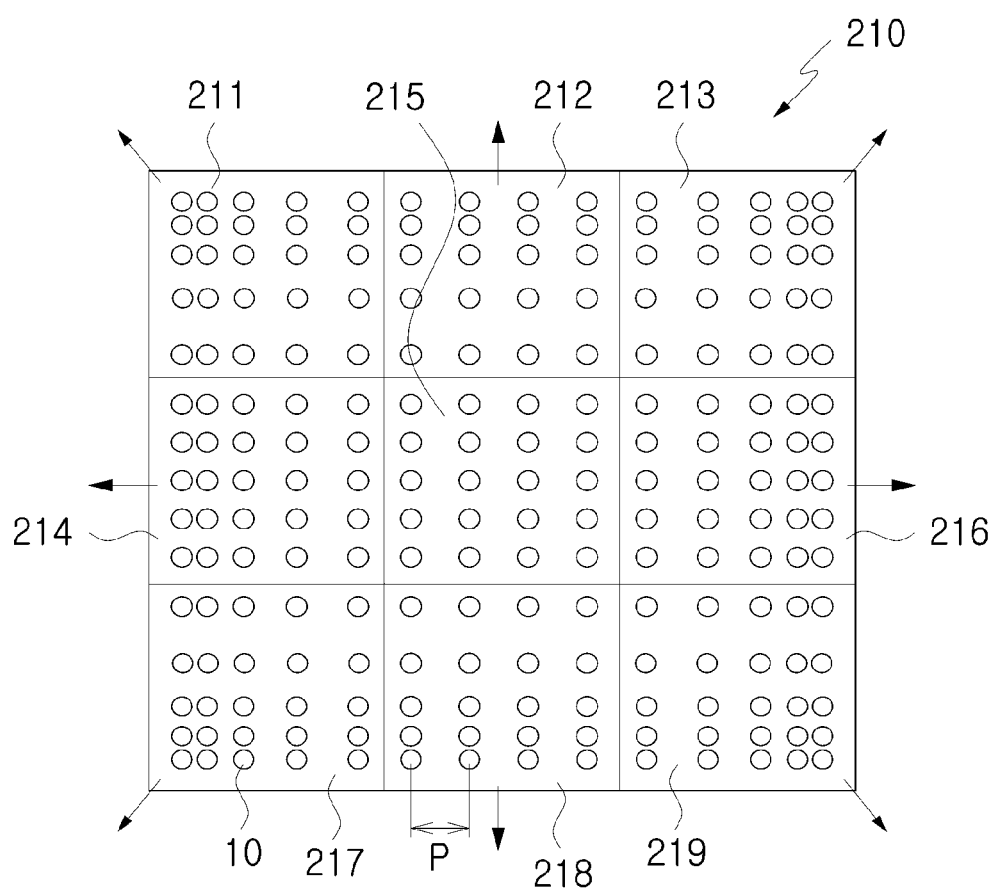

FIG. 9 is a view for describing a beam steering unit according to another embodiment.

Referring to FIG. 9, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

The plurality of nanopillars 10 may form nanopatterns on the basis of locations of the beam steering cells 210. For example, the plurality of nanopillars 10 may form a nanopattern in which a pitch P therebetween gradually decreases away from the center of the beam steering unit 200. Alternatively, the plurality of nanopillars 10 may form a nanopattern in which the number of nanopillars 10 per unit length gradually increases away from the center of the beam steering unit 200. Accordingly, a laser beam emitted from the laser emitting unit 100 may have a shape diverging from the center of the beam steering unit 200.

Referring to FIG. 9, the plurality of nanopillars 10 may form nanopatterns on the basis of locations of the beam steering cells 210.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a pitch P therebetween gradually decreases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a pitch P therebetween gradually decreases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a pitch P therebetween gradually decreases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a pitch P therebetween gradually decreases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215. In this case, the plurality of nanopillars 10 included in the first beam steering cell 211 may form a nanopattern in which a pitch P therebetween gradually decreases away from the center of the beam steering unit 200. Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215. In this case, the plurality of nanopillars 10 included in the third beam steering cell 213 may form a nanopattern in which a pitch P therebetween gradually decreases away from the center of the beam steering unit 200. Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215. In this case, the plurality of nanopillars 10 included in the seventh beam steering cell 217 may form a nanopattern in which a pitch P therebetween gradually decreases away from the center of the beam steering unit 200. Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215. In this case, the plurality of nanopillars 10 included in the ninth beam steering cell 219 may form a nanopattern in which a pitch P therebetween gradually decreases away from the center of the beam steering unit 200. Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, a beam steering unit 200 according to still another embodiment may steer a laser beam on the basis of a change in a height H of the nanopillars 10.

Figure 10:
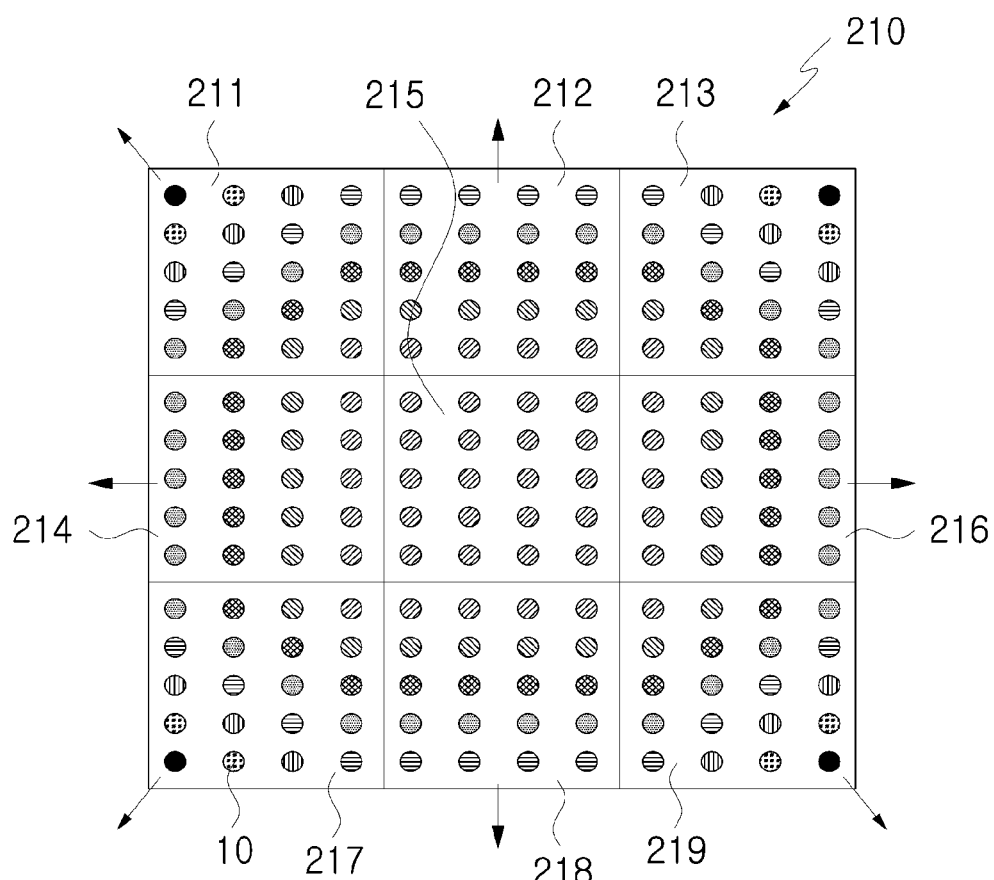

FIG. 10 is a view for describing a beam steering unit according to still another embodiment.

Referring to FIG. 10, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

The plurality of nanopillars 10 may form nanopatterns on the basis of locations of the beam steering cells 210. For example, the plurality of nanopillars 10 may form a nanopattern in which a height H thereof gradually increases away from the center of the beam steering unit 200. Accordingly, laser beams emitted from the laser emitting unit 100 may have a shape diverging from the center of the beam steering unit 200.

As illustrated in FIG. 10, first to eighth heights H1, H2, H3, H4, H5, H6, H7, and H8 may have values gradually increasing from the first height H1 to the eighth height H8.

Referring to FIG. 10, the plurality of nanopillars 10 may form nanopatterns on the basis of locations of the beam steering cells 210.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a height H thereof gradually increases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a height H thereof gradually increases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a height H thereof gradually increases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a height H thereof gradually increases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215. In this case, the plurality of nanopillars 10 included in the first beam steering cell 211 may form a nanopattern in which a height H thereof gradually increases away from the center of the beam steering unit 200. Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215. In this case, the plurality of nanopillars 10 included in the third beam steering cell 213 may form a nanopattern in which a height H thereof gradually increases away from the center of the beam steering unit 200. Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215. In this case, the plurality of nanopillars 10 included in the seventh beam steering cell 217 may form a nanopattern in which a height H thereof gradually increases away from the center of the beam steering unit 200. Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215. In this case, the plurality of nanopillars 10 included in the ninth beam steering cell 219 may form a nanopattern in which a height H thereof gradually increases away from the center of the beam steering unit 200. Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, for convenience of description, nanopatterns formed on the basis of any one attribute of the width W, pitch P, and height H have been described above with reference to FIGS. 8 to 10.

Hereinafter, nanopatterns formed on the basis of multiple attributes will be described.

Figure 11:
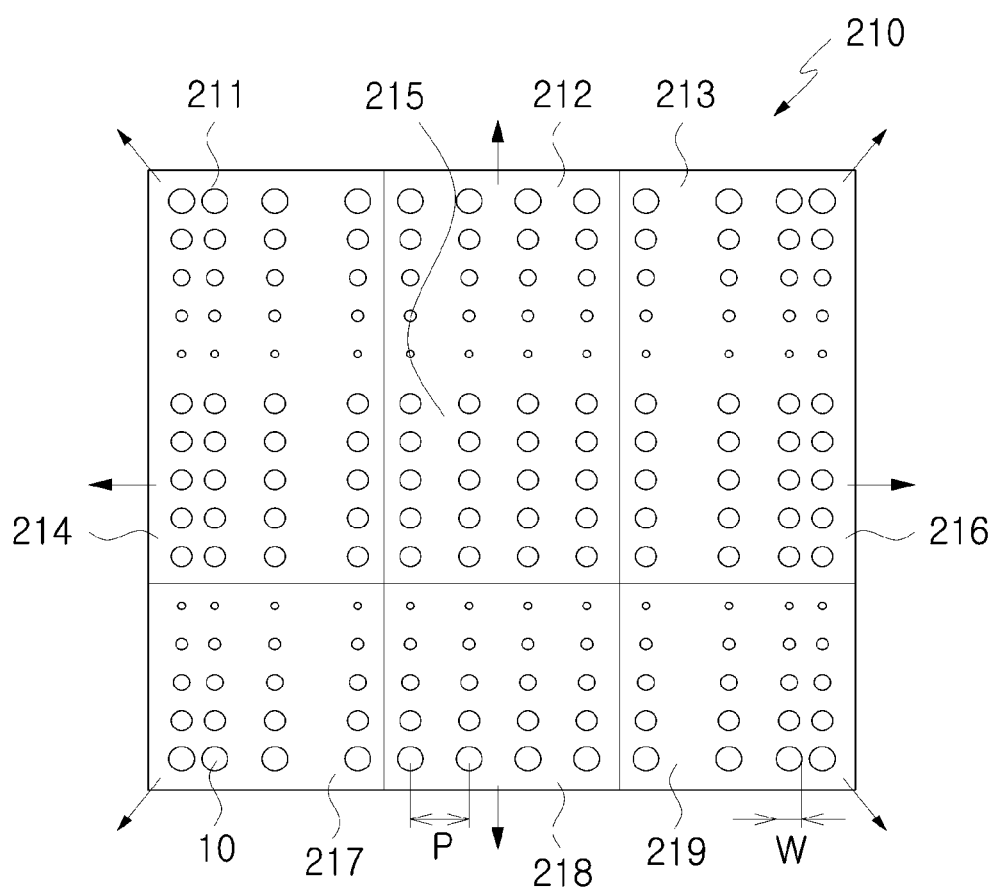

FIG. 11 is a view for describing a beam steering unit according to yet another embodiment.

Referring to FIG. 11, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

The plurality of nanopillars 10 included in the beam steering cells 210 may form nanopatterns on the basis of a width W and a pitch P. Specifically, the plurality of nanopillars 10 may form nanopatterns on the basis of the width W in the row direction and on the basis of the pitch P in the column direction.

The plurality of nanopillars 10 may form nanopatterns on the basis of locations of the beam steering cells 210.

For example, the plurality of nanopillars 10 may form a nanopattern in which the width W of the plurality of nanopillars 10 gradually increases in a direction from the center of the beam steering unit 200 toward a location of a row in which the beam steering cell 210 including the plurality of nanopillars 10 is included.

Also, the plurality of nanopillars 10 may form a nanopattern in which the pitch P between the plurality of nanopillars 10 gradually decreases in a direction from the center of the beam steering unit 200 toward a location of a column in which the beam steering cell 210 including the plurality of nanopillars 10 is included. That is, the plurality of nanopillars 10 may form a nanopattern in which the number of nanopillars 10 per unit length gradually increases in a direction from the center of the beam steering unit 200 toward a location of a column in which the beam steering cell 210 including the plurality of nanopillars 10 is included.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a pitch P therebetween gradually decreases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a pitch P therebetween gradually decreases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a width W thereof gradually increases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a width W thereof gradually increases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215.

In this case, the plurality of nanopillars 10 included in the first beam steering cell 211 may form a nanopattern in which a pitch P therebetween gradually decreases away from the center of the beam steering unit 200 in the column direction.

Also, the plurality of nanopillars 10 included in the first beam steering cell 211 may form a nanopattern in which a width W thereof gradually increases away from the center of the beam steering unit 200 in the row direction.

Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215.

In this case, the plurality of nanopillars 10 included in the third beam steering cell 213 may form a nanopattern in which a pitch P therebetween gradually decreases away from the center of the beam steering unit 200 in the column direction.

Also, the plurality of nanopillars 10 included in the third beam steering cell 213 may form a nanopattern in which a width W thereof gradually increases away from the center of the beam steering unit 200 in the row direction.

Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215.

In this case, the plurality of nanopillars 10 included in the seventh beam steering cell 217 may form a nanopattern in which a pitch P therebetween gradually decreases away from the center of the beam steering unit 200 in the column direction.

Also, the plurality of nanopillars 10 included in the seventh beam steering cell 217 may form a nanopattern in which a width W thereof gradually increases away from the center of the beam steering unit 200 in the row direction.

Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215.

In this case, the plurality of nanopillars 10 included in the ninth beam steering cell 219 may form a nanopattern in which a pitch P therebetween gradually decreases away from the center of the beam steering unit 200 in the column direction.

Also, the plurality of nanopillars 10 included in the ninth beam steering cell 219 may form a nanopattern in which a width W thereof gradually increases away from the center of the beam steering unit 200 in the row direction.

Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, unlike in FIG. 11, the plurality of nanopillars 10 may form nanopatterns on the basis of the pitch P in the row direction and on the basis of the width W in the column direction.

Figure 12:
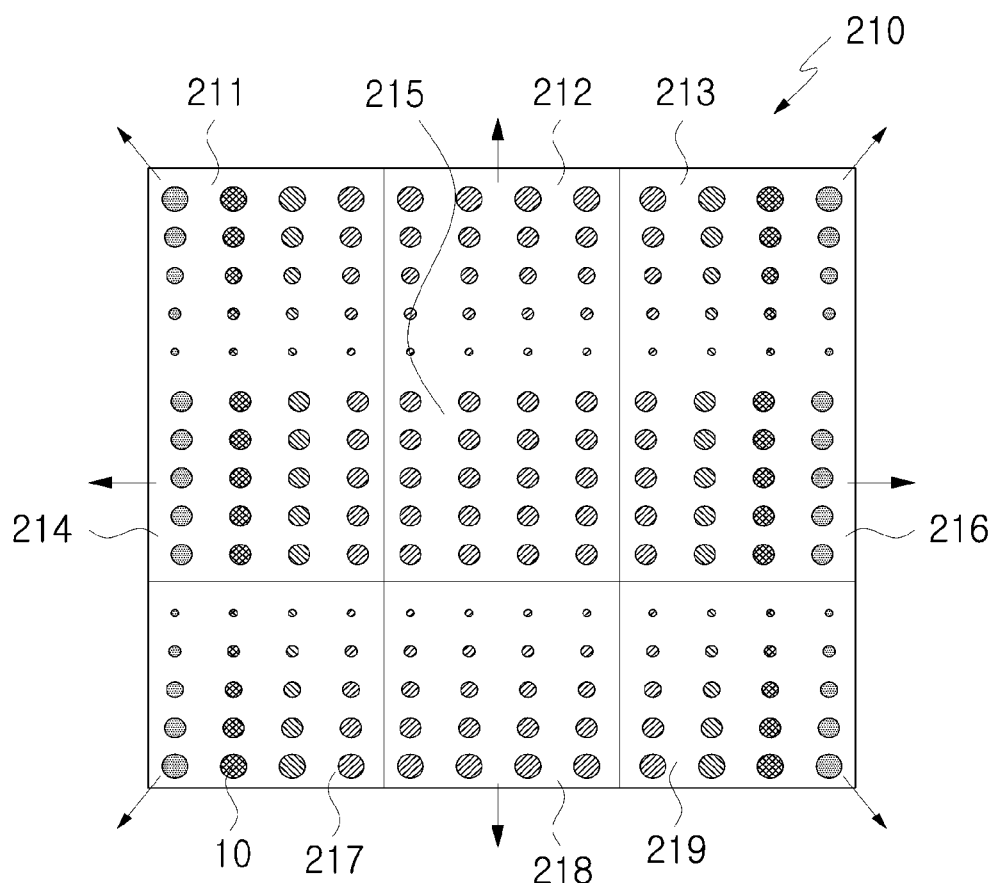

FIG. 12 is a view for describing a beam steering unit according to yet another embodiment.

Referring to FIG. 12, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

The plurality of nanopillars 10 included in the beam steering cells 210 may form nanopatterns on the basis of a width W and a height H. Specifically, the plurality of nanopillars 10 may form nanopatterns on the basis of the width W in the row direction and on the basis of the height H in the column direction.

The plurality of nanopillars 10 may form nanopatterns on the basis of locations of the beam steering cells 210.

For example, the plurality of nanopillars 10 may form a nanopattern in which the width W of the plurality of nanopillars 10 gradually increases in a direction from the center of the beam steering unit 200 toward a location of a row in which the beam steering cell 210 including the plurality of nanopillars 10 is included.

Also, the plurality of nanopillars 10 may form a nanopattern in which the height H of the plurality of nanopillars 10 gradually increases in a direction from the center of the beam steering unit 200 toward a location of a column in which the beam steering cell 210 including the plurality of nanopillars 10 is included.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a height H thereof gradually increases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a height H thereof gradually increases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a width W thereof gradually increases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a width W thereof gradually increases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215.

In this case, the plurality of nanopillars 10 included in the first beam steering cell 211 may form a nanopattern in which a height H thereof gradually increases away from the center of the beam steering unit 200 in the column direction.

Also, the plurality of nanopillars 10 included in the first beam steering cell 211 may form a nanopattern in which a width W thereof gradually increases away from the center of the beam steering unit 200 in the row direction.

Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215.

In this case, the plurality of nanopillars 10 included in the third beam steering cell 213 may form a nanopattern in which a height H thereof gradually increases away from the center of the beam steering unit 200 in the column direction.

Also, the plurality of nanopillars 10 included in the third beam steering cell 213 may form a nanopattern in which a width W thereof gradually increases away from the center of the beam steering unit 200 in the row direction.

Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215.

In this case, the plurality of nanopillars 10 included in the seventh beam steering cell 217 may form a nanopattern in which a height H thereof gradually increases away from the center of the beam steering unit 200 in the column direction.

Also, the plurality of nanopillars 10 included in the seventh beam steering cell 217 may form a nanopattern in which a width W thereof gradually increases away from the center of the beam steering unit 200 in the row direction.

Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215.

In this case, the plurality of nanopillars 10 included in the ninth beam steering cell 219 may form a nanopattern in which a height H thereof gradually increases away from the center of the beam steering unit 200 in the column direction.

Also, the plurality of nanopillars 10 included in the ninth beam steering cell 219 may form a nanopattern in which a width W thereof gradually increases away from the center of the beam steering unit 200 in the row direction.

Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, unlike in FIG. 12, the plurality of nanopillars 10 may form nanopatterns on the basis of the height H in the row direction and on the basis of the width W in the column direction.

Figure 13:
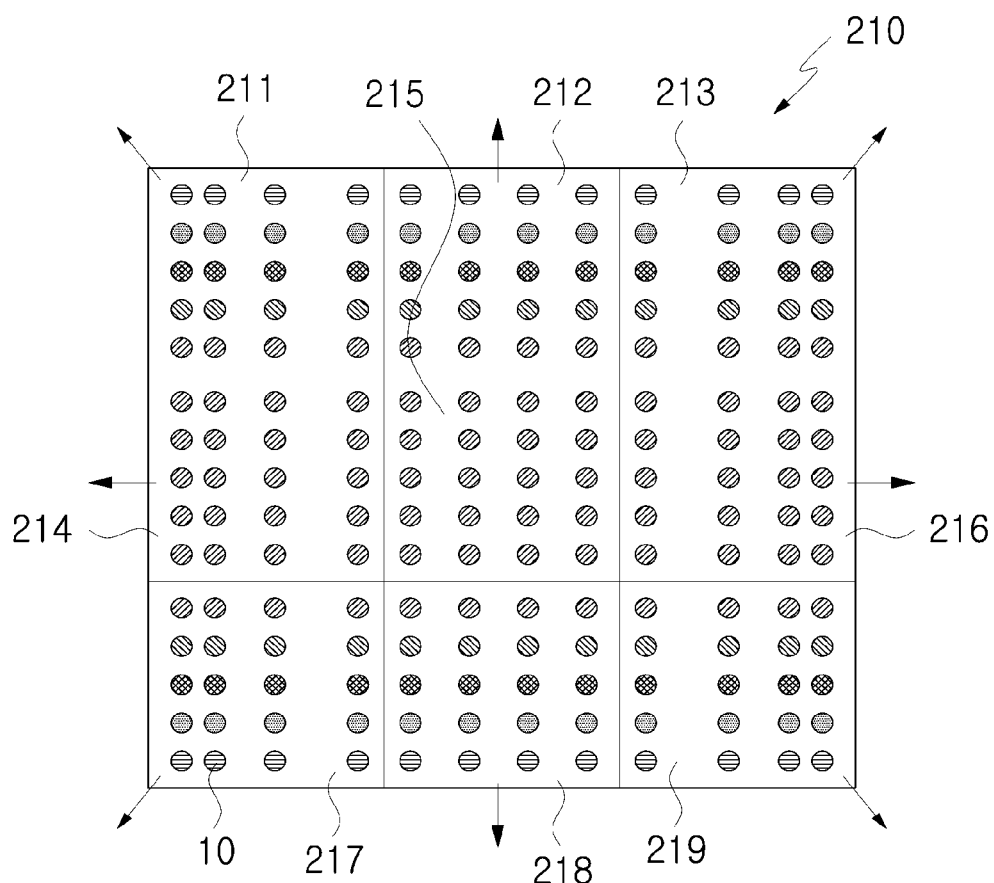

FIG. 13 is a view for describing a beam steering unit according to yet another embodiment.

Referring to FIG. 13, a beam steering unit 200 may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

The plurality of nanopillars 10 included in the beam steering cells 210 may form nanopatterns on the basis of a pitch P and a height H. Specifically, the plurality of nanopillars 10 may form nanopatterns on the basis of the height H in the row direction and on the basis of the pitch P in the column direction.

The plurality of nanopillars 10 may form nanopatterns on the basis of locations of the beam steering cells 210.

For example, the plurality of nanopillars 10 may form a nanopattern in which the height H of the plurality of nanopillars 10 gradually increases in a direction from the center of the beam steering unit 200 toward a location of a row in which the beam steering cell 210 including the plurality of nanopillars 10 is included.

Also, the plurality of nanopillars 10 may form a nanopattern in which the pitch P between the plurality of nanopillars 10 gradually decreases in a direction from the center of the beam steering unit 200 toward a location of a column in which the beam steering cell 210 including the plurality of nanopillars 10 is included.

For example, a plurality of nanopillars 10 included in the fifth beam steering cell 215 located at the central portion of the beam steering unit 200 may have the same size and be disposed at constant pitches. Accordingly, a laser beam steered by the fifth beam steering cell 215 may pass the nanopillars 10, which are disposed as above, as it is without being refracted by the nanopillars 10.

Meanwhile, the fifth beam steering cell 215 may not include the nanopillars 10. Accordingly, a laser beam emitted from the laser emitting unit 100 may pass through the fifth beam steering cell 215 while an emission direction of the laser beam is maintained.

The fourth beam steering cell 214 may be disposed in the same row as the fifth beam steering cell 215 but in a column that is further to the left than a column in which the fifth beam steering cell 215 is disposed. In this case, a plurality of nanopillars 10 included in the fourth beam steering cell 214 may form a nanopattern in which a pitch P therebetween gradually decreases away from the center of the beam steering unit 200. Accordingly, a steering direction of the fourth beam steering cell 214 may be the same as a direction from the center of the beam steering unit 200 toward the fourth beam steering cell 214.

Likewise, a plurality of nanopillars 10 included in the sixth beam steering cell 216, which is disposed in the same row as the fifth beam steering cell 215 but in a column that is further to the right than the column in which the fifth beam steering cell 215 is disposed, may form a nanopattern in which a pitch P therebetween gradually decreases away from the center of the beam steering unit 200. Accordingly, a steering direction of the sixth beam steering cell 216 may be the same as a direction from the center of the beam steering unit 200 toward the sixth beam steering cell 216.

Meanwhile, when the fourth beam steering cell 214 and the sixth beam steering cell 216 are disposed to be symmetrical about the center of the beam steering unit 200, steering angles of the fourth beam steering cell 214 and the sixth beam steering cell 216 may be equal in size.

The second beam steering cell 212 may be disposed in the same column as the fifth beam steering cell 215 but in a row that is further to the top than a row in which the fifth beam steering cell 215 is disposed. In this case, a plurality of nanopillars 10 included in the second beam steering cell 212 may form a nanopattern in which a height H thereof gradually increases away from the center of the beam steering unit 200. Accordingly, a steering direction of the second beam steering cell 212 may be the same as a direction from the center of the beam steering unit 200 toward the second beam steering cell 212.

Likewise, a plurality of nanopillars 10 included in the eighth beam steering cell 218, which is disposed in the same column as the fifth beam steering cell 215 but in a row that is further to the bottom than the row in which the fifth beam steering cell 215 is disposed, may form a nanopattern in which a height H thereof gradually increases away from the center of the beam steering unit 200. Accordingly, a steering direction of the eighth beam steering cell 218 may be the same as a direction from the center of the beam steering unit 200 toward the eighth beam steering cell 218.

Meanwhile, when the second beam steering cell 212 and the eighth beam steering cell 218 are disposed to be symmetrical about the center of the beam steering unit 200, steering angles of the second beam steering cell 212 and the eighth beam steering cell 218 may be equal in size.

The first beam steering cell 211 may be disposed at an upper left side of the fifth beam steering cell 215.

In this case, the plurality of nanopillars 10 included in the first beam steering cell 211 may form a nanopattern in which a pitch P therebetween gradually decreases away from the center of the beam steering unit 200 in the column direction.

Also, the plurality of nanopillars 10 included in the first beam steering cell 211 may form a nanopattern in which a height H thereof gradually increases away from the center of the beam steering unit 200 in the row direction.

Accordingly, a steering direction of the first beam steering cell 211 may be the same as a direction from the center of the beam steering unit 200 toward the first beam steering cell 211.

The third beam steering cell 213 may be disposed at an upper right side of the fifth beam steering cell 215.

In this case, the plurality of nanopillars 10 included in the third beam steering cell 213 may form a nanopattern in which a pitch P therebetween gradually decreases away from the center of the beam steering unit 200 in the column direction.

Also, the plurality of nanopillars 10 included in the third beam steering cell 213 may form a nanopattern in which a height H thereof gradually increases away from the center of the beam steering unit 200 in the row direction.

Accordingly, a steering direction of the third beam steering cell 213 may be the same as a direction from the center of the beam steering unit 200 toward the third beam steering cell 213.

The seventh beam steering cell 217 may be disposed at a lower left side of the fifth beam steering cell 215.

In this case, the plurality of nanopillars 10 included in the seventh beam steering cell 217 may form a nanopattern in which a pitch P therebetween gradually decreases away from the center of the beam steering unit 200 in the column direction.

Also, the plurality of nanopillars 10 included in the seventh beam steering cell 217 may form a nanopattern in which a height H thereof gradually increases away from the center of the beam steering unit 200 in the row direction.

Accordingly, a steering direction of the seventh beam steering cell 217 may be the same as a direction from the center of the beam steering unit 200 toward the seventh beam steering cell 217.

The ninth beam steering cell 219 may be disposed at a lower right side of the fifth beam steering cell 215.

In this case, the plurality of nanopillars 10 included in the ninth beam steering cell 219 may form a nanopattern in which a pitch P therebetween gradually decreases away from the center of the beam steering unit 200 in the column direction.

Also, the plurality of nanopillars 10 included in the ninth beam steering cell 219 may form a nanopattern in which a height H thereof gradually increases away from the center of the beam steering unit 200 in the row direction.

Accordingly, a steering direction of the ninth beam steering cell 219 may be the same as a direction from the center of the beam steering unit 200 toward the ninth beam steering cell 219.

Meanwhile, nanopatterns formed by the plurality of nanopillars 10 included in the beam steering cells 210, which are spaced apart from the center of the beam steering unit 200 at equal distances, may be related to each other.

For example, the first beam steering cell 211 and the third beam steering cell 213 may be spaced apart from the center of the beam steering unit 200 at equal distances. In this case, the plurality of nanopillars 10 included in the first beam steering cell 211 may form a first nanopattern. Also, the plurality of nanopillars 10 included in the third beam steering cell 213 may form a third nanopattern.

In this case, when the first nanopattern is rotated by a predetermined angle about the center of the beam steering unit 200 as an axis, the first nanopattern and the third nanopattern may have the same shape. The predetermined angle may be obtained on the basis of locations of the first beam steering cell 211 and the third beam steering cell 213 relative to the center of the beam steering unit 200.

Meanwhile, unlike in FIG. 13, the plurality of nanopillars 10 may form nanopatterns on the basis of the pitch P in the row direction and on the basis of the height H in the column direction.

Figure 14:
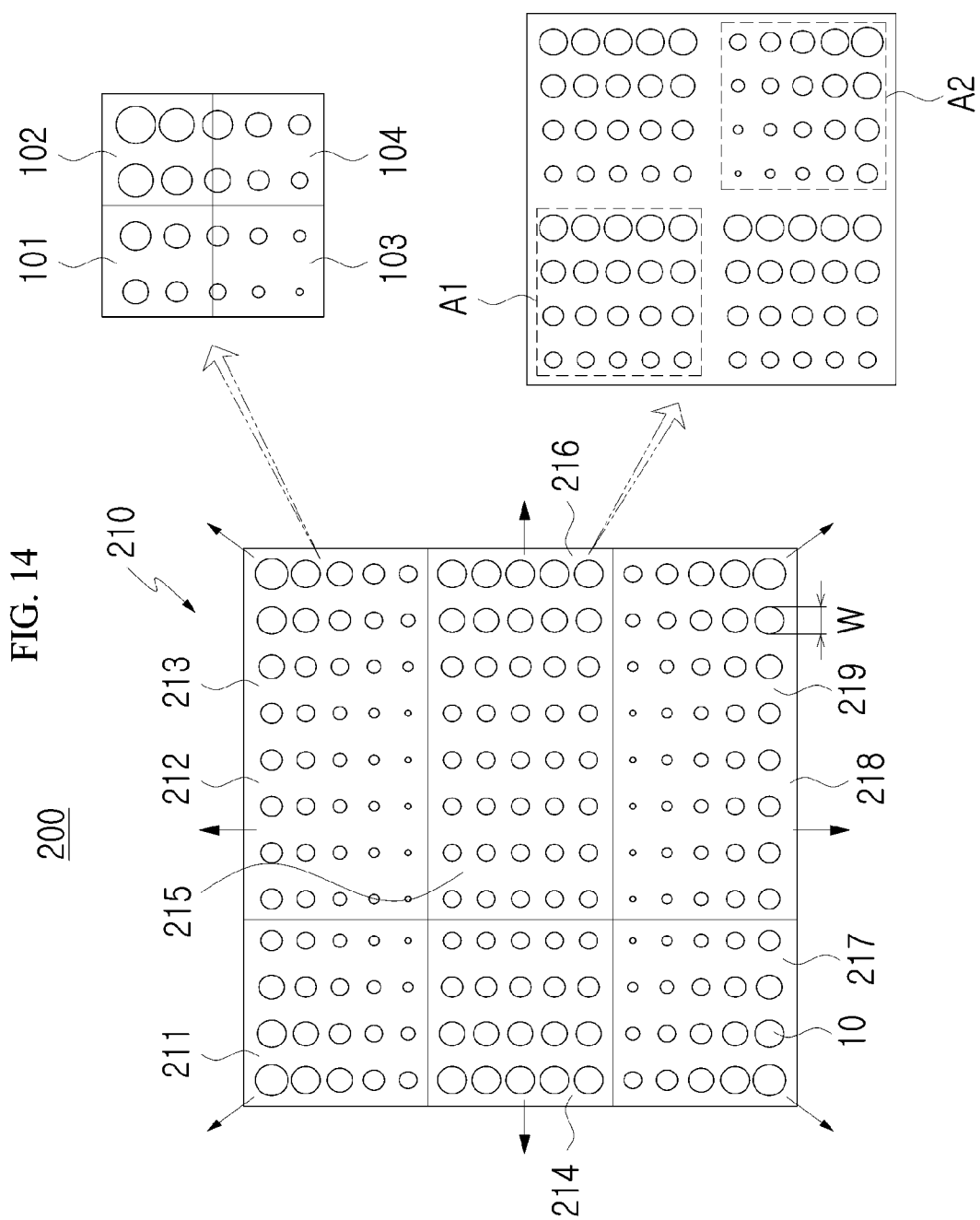

FIG. 14 is a top view for describing a beam steering unit according to an embodiment.

Referring to FIG. 14, a beam steering unit 200 according to an embodiment may include a plurality of beam steering cells 210 and a plurality of nanopillars 10. The beam steering cells 210 may include first to ninth beam steering cells 211, 212, 213, 214, 215, 216, 217, 218, and 219.

The beam steering cells 210 according to an embodiment may be provided in the form of a two-dimensional array. For example, laser emitting units 100 may be provided in the form of a 3×3 array. The first to ninth beam steering cells 211, 212, 213, 214, 215, 216, 217, 218, and 219 may be arranged in the two-dimensional array in a row direction corresponding to the vertical direction and a column direction corresponding to the horizontal direction.

A plurality of laser emitting units 100 may be disposed at a lower portion of at least one of the plurality of beam steering cells 210.

For example, first to fourth laser emitting units 101, 102, 103, and 104 may be disposed at a lower portion of the third beam steering cell 213.

The first to fourth laser emitting units 101, 102, 103, and 104 may be controlled separately.

Attributes of a laser beam emitted from the first laser emitting unit 101 and attributes of a laser beam emitted from the second laser emitting unit 102 may be different.

For example, a wavelength of a laser beam emitted from the first laser emitting unit 101 and a wavelength of a laser beam emitted from the second laser emitting unit 102 may be different.

As another example, an intensity of a laser beam emitted from the first laser emitting unit 101 and an intensity of a laser beam emitted from the second laser emitting unit 102 may be different.

As still another example, laser beam emission time points of the first laser emitting unit 101 and the second laser emitting unit 102 may be different. Specifically, while the first laser emitting unit 101 emits a laser beam, the second laser emitting unit 102 may be turned off.

Meanwhile, the plurality of nanopillars 10 included in the beam steering cells 210 may form a plurality of nanopatterns. For example, the plurality of nanopatterns may include a first nanopattern A1 and a second nanopattern A2.

At least one of the plurality of nanopatterns may be repeatedly formed on the beam steering cell 210. For example, a plurality of nanopillars 10 included in the sixth beam steering cell 216 of FIG. 14 may repeatedly form the first nanopattern A1. Specifically, the first nanopattern A1 may have a pattern in which the width W of the nanopillars 10 repeatedly increases.

The second nanopattern A2 may have a different form from the first nanopattern A1. For example, the first nanopattern A1 may have a form in which the width W of the nanopillars 10 gradually increases away from the center of the beam steering unit 200 while the width W of the nanopillars is constant in the row direction. On the other hand, the second nanopattern A2 may have a form in which the width W of the nanopillars 10 gradually increases away from the center of the beam steering unit 200 while the width W of the nanopillars 10 changes in the row direction.

Meanwhile, by the on/off state of each laser emitting unit being adjusted, laser beams of various shapes may be formed. For example, the shape of a laser beam emitted from the laser emitting device 1000 may vary according to the on/off states of the first laser emitting unit 101 and the second laser emitting unit 102.

By the on/off states of a plurality of light source units included in the laser emitting unit being adjusted, laser beams of various shapes may be formed. For example, the shape of a laser beam which is emitted from the third laser emitting unit 103 and passes the nanopillars 10 may vary according to the on/off states of a first light source unit and a second light source unit included in the third laser emitting unit 103.

By an intensity of a laser beam emitted from each laser emitting unit being adjusted, laser beams of various shapes may be formed. For example, the shape of a laser beam emitted from the laser emitting device 1000 may vary as intensities of laser beams emitted from the first laser emitting unit 101 and the second laser emitting unit 102 are adjusted.

By an intensity of a laser beam emitted from a plurality of light source units included in the laser emitting unit being adjusted, laser beams of various shapes may be formed. For example, the shape of a laser beam which is emitted from the third laser emitting unit 103 and passes the nanopillars 10 may vary as intensities of laser beams emitted from a first light source unit 1131 and a second light source unit 1132 are adjusted.

Meanwhile, the nanopatterns have been described above as being formed for each beam steering cell 210 as a unit, but the nanopatterns may also be formed in the entire beam steering unit 200 regardless of boundaries of the plurality of beam steering cells 210. Accordingly, the nanopillars 10 may be disposed on a boundary line between two adjacent beam steering cells 210.

The number of nanopillars 10 disposed on each beam steering cell 210 may be different.

For convenience of description, the case in which the beam steering unit 200 is provided as a 3×3 array, i.e., an N×N array, has been described above as an example, but the beam steering unit 200 may also be provided as an N×M array (here, the N and M are different numbers).

Figure 15:
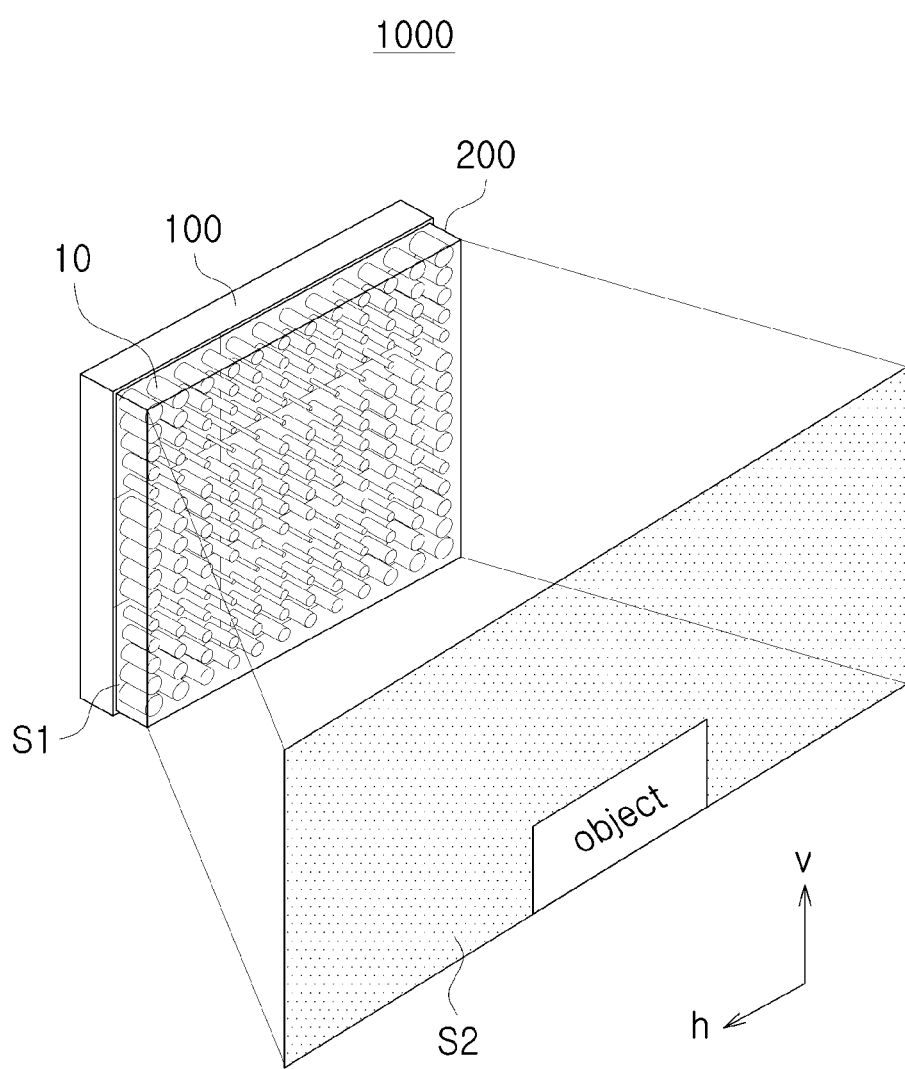
FIG. 15 is a pictorial diagram illustrating a laser beam emitted from a laser emitting device according to an embodiment.

FIG. 15 is a pictorial diagram illustrating a laser beam emitted from a laser emitting device according to an embodiment.

Referring to FIG. 15, a laser emitting device 1000 may include a laser emitting unit 100, a beam steering unit 200, and a plurality of nanopillars 10. Meanwhile, at least one of the plurality of nanopillars 10 illustrated in FIG. 15 may include a plurality of nanostructures. For example, the nanopillar 10 may include one or more nanostructure having an irregular shape.

The laser emitting device 1000 may emit a laser beam toward an object.

The laser emitting device 1000 may generate a plurality of scanning points distributed in an h-direction, which is the horizontal direction, and a v-direction, which is the vertical direction. The laser emitting device 1000 may have a field of view (FOV) formed by the plurality of scanning points. For example, the laser emitting device 1000 may have the FOV in a range of −N° to N° in the h-direction. Also, the laser emitting device 1000 may have the FOV in a range of −M° to M° in the v-direction. Specifically, the laser emitting device 1000 may have the FOV in a range of −60° to 60° in the h-direction and the FOV in a range of −15° to 15° in the v-direction.

The N may be greater than the M. That is, the laser emitting device 1000 may have the FOV in a wider range in the h-direction than in the v-direction.

Regarding the laser emitting unit 100, since the description given above on the laser emitting unit 100 may be applied without change, detailed description thereof will be omitted.

The beam steering unit 200 may include a plurality of nanopillars 10.

The beam steering unit 200 may include the plurality of beam steering cells. The plurality of beam steering cells may be arranged in the form of a two-dimensional array. The plurality of beam steering cells may be arranged in the two-dimensional array in a row direction corresponding to the vertical direction and a column direction corresponding to the horizontal direction.

Each of the plurality of beam steering cells may include a plurality of nanopillars 10.

The plurality of beam steering cells may guide a laser beam emitted from the laser emitting unit 100 to correspond to the plurality of scanning points. In this case, the plurality of beam steering cells may guide the laser beam using the plurality of nanopillars 10.

Meanwhile, a beam steering surface S1 may be defined as a surface included in a region in which a laser beam emitted from the laser emitting unit 100 is steered. Specifically, the beam steering surface S1 may refer to a cross-section of the beam steering unit 200.

Also, a beam projection surface S2 may be defined as a surface included in a region in which a laser beam emitted from the laser emitting device 1000 is projected to an object.

The beam steering surface S1 may be parallel to the beam projection surface S2.

As described above, the plurality of nanopillars 10 included in the beam steering unit 200 may form nanopatterns on the basis of locations of the beam steering cells. That is, the plurality of nanopillars 10 may form nanopatterns on the basis of locations thereof on the beam steering surface S1.

Unlike this, the plurality of nanopillars 10 may form nanopatterns on the basis of a steering direction in which the plurality of beam steering cells guide a laser beam emitted from the laser emitting unit 100. That is, the plurality of nanopillars 10 may form nanopatterns on the basis of locations thereof on the beam projection surface S2.

Hereinafter, the nanopatterns formed on the basis of locations on the beam steering surface S1 and the beam projection surface S2 will be described.

Figure 16:
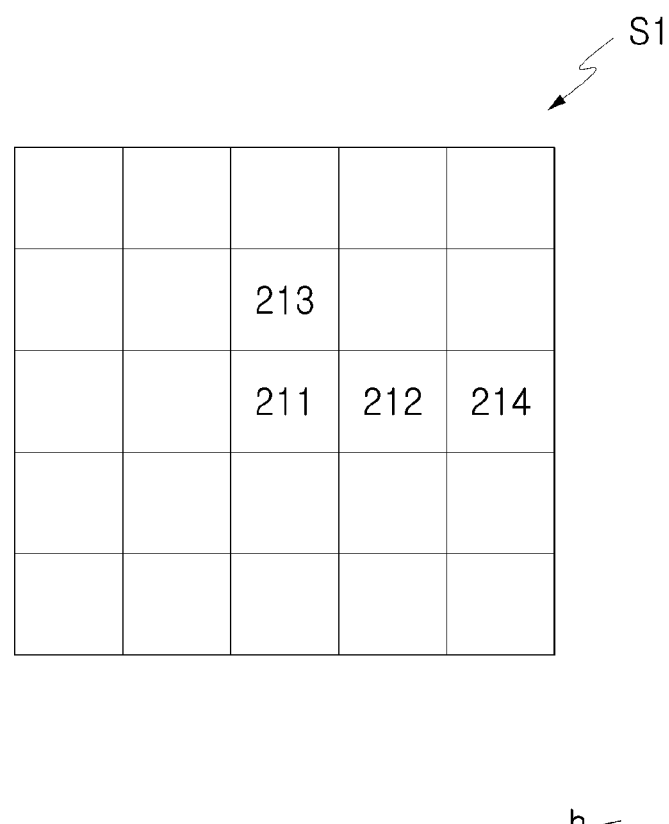
FIG. 16 is a view illustrating a beam steering unit according to an embodiment.

FIG. 16 is a view illustrating a beam steering unit 200 according to an embodiment.

Specifically, FIG. 16 is a view for describing the nanopatterns formed on the basis of locations on the beam steering surface S1.

The beam steering unit 200 may include first to fourth beam steering cells 211, 212, 213, and 214. The first to fourth beam steering cells 211, 212, 213, and 214 may include a plurality of nanopillars forming nanopatterns.

The first beam steering cell 211 may be arranged at the center of the beam steering unit 200.

An h-coordinate of the second beam steering cell 212 may be greater than an h-coordinate of the first beam steering cell 211. In this case, the plurality of nanopillars included in the second beam steering cell 212 may form, from the center of the beam steering unit 200 toward the second beam steering cell 212, a nanopattern in which a first attribute related to at least one of the width W, height H, and number per unit length of the nanopillars repeatedly increases.

A v-coordinate of the third beam steering cell 213 may be greater than a v-coordinate of the first beam steering cell 211. In this case, the plurality of nanopillars included in the third beam steering cell 213 may form, from the center of the beam steering unit 200 toward the third beam steering cell 213, a nanopattern in which an attribute related to at least one of the width W, height H, and number per unit length of the nanopillars repeatedly increases.

Meanwhile, as a distance from the center of the beam steering unit 200 to a beam steering cell becomes larger, a change rate of an attribute of a plurality of nanopillars included in the beam steering cell may increase.

For example, an h-coordinate of the fourth beam steering cell 214 may be greater than an h-coordinate of the second beam steering cell 212. Accordingly, a distance from the center of the beam steering unit 200 to the fourth beam steering cell 214 may be larger than a distance from the center of the beam steering unit 200 to the second beam steering cell 212.

In this case, the plurality of nanopillars included in the fourth beam steering cell 214 may form, from the center of the beam steering unit 200 toward the fourth beam steering cell 214, a nanopattern in which a second attribute related to at least one of the width W, height H, and number per unit length of the nanopillars repeatedly increases. A change rate of an attribute may be higher than the change rate of the first attribute.

Figure 17:
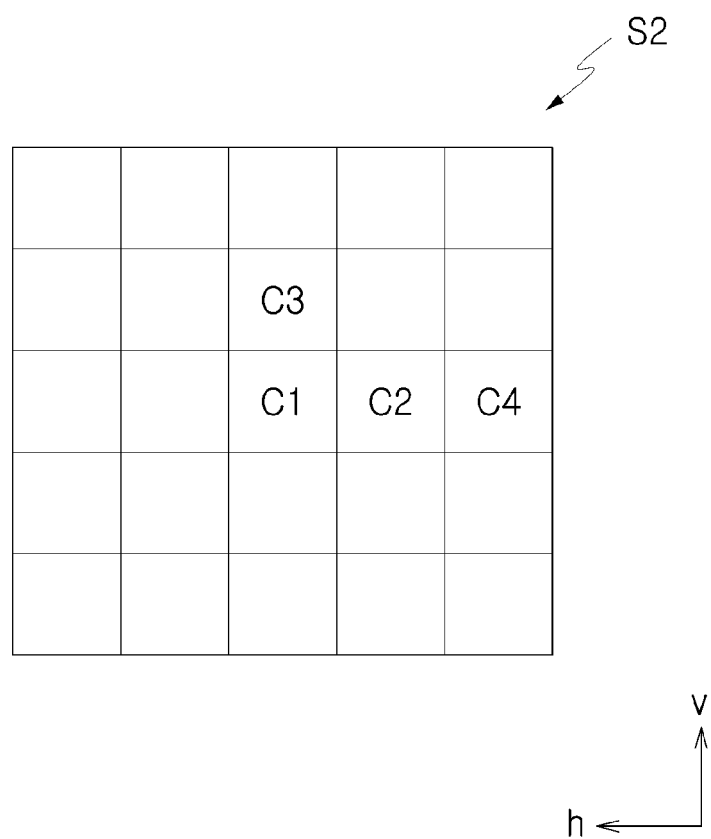
FIG. 17 is a view illustrating a beam projection surface according to an embodiment.

FIG. 17 is a view illustrating a beam projection surface S2 according to an embodiment.

Specifically, FIG. 17 is a view for describing the nanopatterns formed on the basis of locations on the beam projection surface S2.

The beam projection surface S2 may be expressed in the form of a two-dimensional array in the h-direction corresponding to the horizontal direction and the v-direction corresponding to the vertical direction.

A first projection cell C1 may be located at the center of the beam projection surface S2. In this case, a first laser beam projected to the first projection cell C1 may have been steered by a first beam steering cell. The plurality of nanopillars included in the first beam steering cell may form a nanopattern in which a first attribute related to at least one of the width W, height H, and number per unit length of the nanopillars is the same.

An h-coordinate of a second projection cell C2 may be greater than an h-coordinate of the first projection cell C1. In this case, a second laser beam projected to the second projection cell C2 may have been steered by a second beam steering cell. The plurality of nanopillars included in the second beam steering cell may form, in a direction of an h-axis component of a steering direction of the second beam steering cell, nanopatterns in which a second attribute related to at least one of the width W, height H, and number per unit length of the nanopillars repeatedly increases.

A v-coordinate of a third projection cell C3 may be greater than a v-coordinate of the first projection cell C1. In this case, a third laser beam projected to the third projection cell C3 may have been steered by a third beam steering cell. The plurality of nanopillars included in the third beam steering cell may form, in a direction of a v-axis component of a steering direction of the third beam steering cell, nanopatterns in which a third attribute related to at least one of the width W, height H, and number per unit length of the nanopillars repeatedly increases.

Meanwhile, as a location of a cell becomes farther from the center of the beam projection surface S2, a change rate of an attribute of a plurality of nanopillars included in a beam steering cell, which steers a laser beam projected to the cell, may increase.

For example, a fourth projection cell C4 may have an h-coordinate greater than that of the first projection cell C1 but may be located farther from the center of the beam projection surface S2 than the second projection cell C2. A fourth laser beam projected to the fourth projection cell C4 may have been steered by a fourth beam steering cell. The plurality of nanopillars included in the fourth beam steering cell may form, in a direction of an h-axis component of a steering direction of the fourth beam steering cell, nanopatterns in which a fourth attribute related to at least one of the width W, height H, and number per unit length of the nanopillars repeatedly increases.

In this case, a change rate of the fourth attribute may be higher than the change rate of the second attribute.

Meanwhile, such a relationship between the rates of change may remain the same even when sizes of v-axis components of steering directions change.

Meanwhile, a location on the beam steering surface S1 may be related to a location on the beam projection surface S2.

For example, a location on the beam steering surface S1 may correspond to a location on the beam projection surface S2.

Specifically, the first to fourth projection cells C1, C2, C3, and C4 may respectively correspond to the first to fourth beam steering cells 211, 212, 213, and 214 of FIG. 16. That is, a first laser beam irradiated to the first projection cell C1 may have been steered by the first beam steering cell 211. The same applies for the second to fourth projection cells C2, C3, and C4.

Alternatively, a location on the beam steering surface S1 may not correspond to a location on the beam projection surface S2.

Specifically, the first to fourth projection cells C1, C2, C3, and C4 may not respectively correspond to the first to fourth beam steering cells 211, 212, 213, and 214. For example, a third laser beam irradiated to the third projection cell C3 may have been steered by the second beam steering cell 212.

Figure 18:
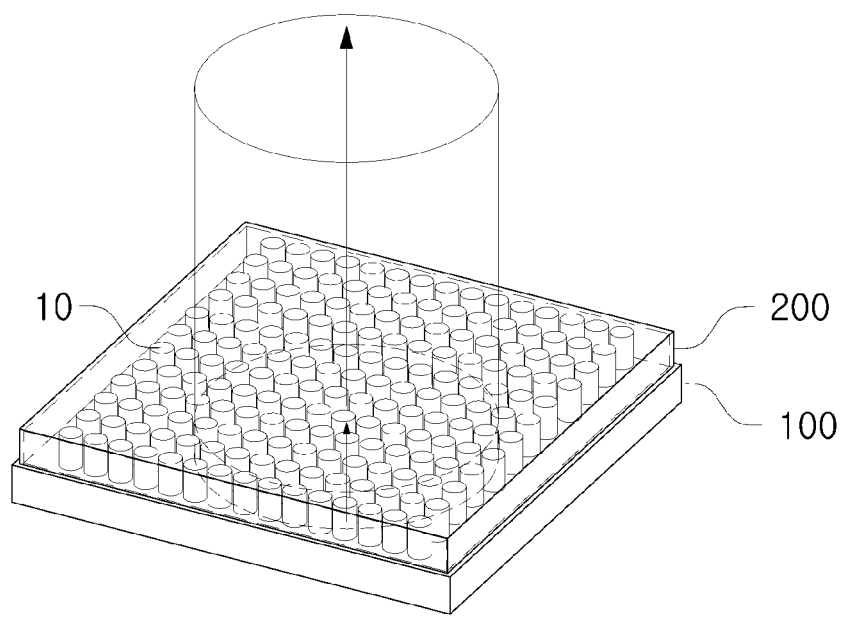
FIG. 18 is a pictorial diagram illustrating a laser emitting device according to an embodiment.

Meanwhile, referring to FIG. 18, sizes of the plurality of nanopillars 10 included in the beam steering unit 200 of the laser emitting device 1000 may be the same. For example, widths W and heights H of the plurality of nanopillars 10 may be the same. Alternatively, pitches P between the plurality of nanopillars 10 may be the same.

In this case, a steering angle θ of a laser beam may be 0°. That is, a first angle, which is an emission angle of a laser beam emitted from the laser emitting unit 100, may be equal to a second angle, which is an irradiation angle of a laser beam that has passed the beam steering unit 200 after being emitted from the laser emitting unit 100.

The laser emitting device 1000 in which the beam steering unit 200 is configured of a single layer has been described above.

Hereinafter, a laser emitting device 1000 in which the beam steering unit 200 is configured of a plurality of layers will be described.

Figure 19:
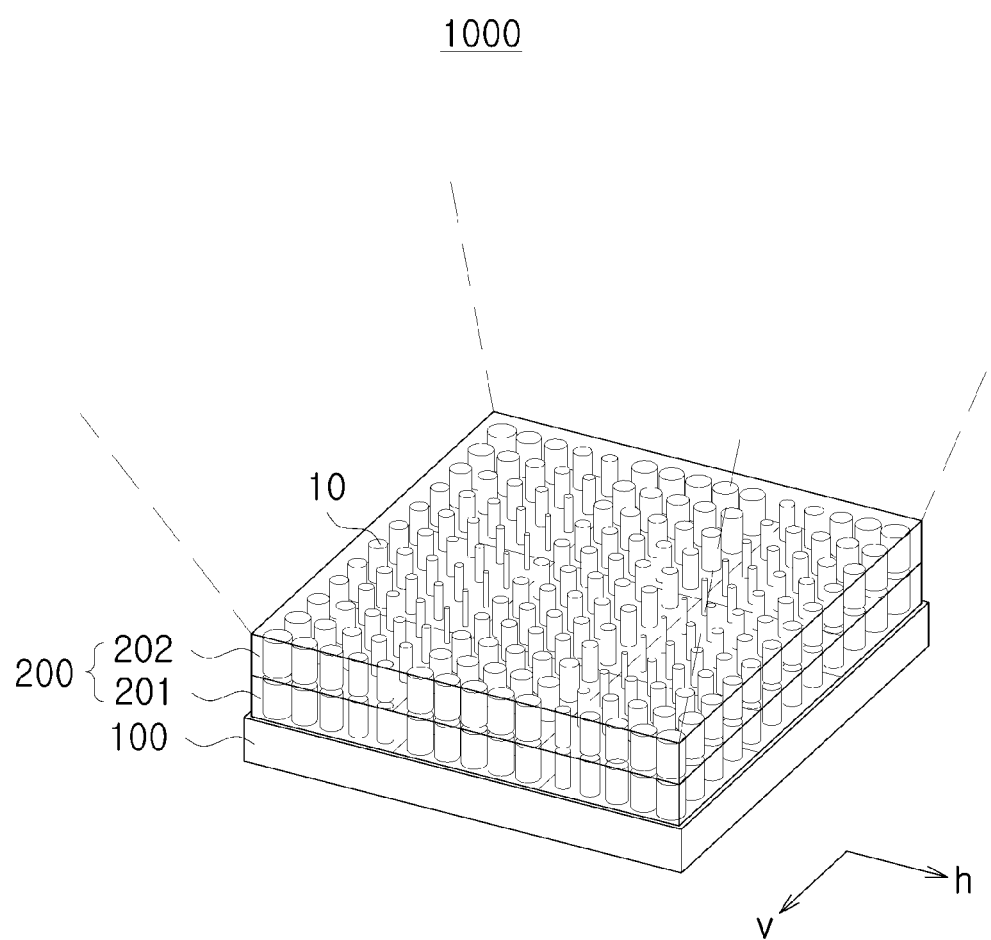
FIG. 19 is a pictorial diagram illustrating a laser emitting device according to an embodiment.

FIG. 19 is a pictorial diagram illustrating a laser emitting device according to an embodiment.

Referring to FIG. 19, a laser emitting device 1000 may include a laser emitting unit 100 and a beam steering unit 200.

Meanwhile, the laser emitting device 1000 may operate identically or similarly to the laser emitting device 1000 described above with reference to FIGS. 1 to 18. Accordingly, detailed description of points in common will be omitted, and differences therebetween will be mainly described.

The laser emitting device 1000 may generate laser beams of various shapes from a laser beam emitted from the laser emitting unit 100 by using the beam steering unit 200. For example, the laser emitting device 1000 may generate a laser beam having a shape diverging from the center thereof.

Each configuration of the laser emitting device 1000 will be described in detail below.

The laser emitting unit 100 may operate identically or similarly to the laser emitting unit 100 described above with reference to FIGS. 1 to 18. For example, the laser emitting unit 100 may be arranged in the form of an array and include a plurality of VCSEL elements.

The beam steering unit 200 may steer a laser beam emitted from the laser emitting unit 100. The beam steering unit 200 may generate laser beams of various shapes by steering the emitted laser beam.

For example, the beam steering unit 200 may form, from the emitted laser beam, a laser beam having an h-direction, which is the horizontal direction, and a v-direction, which is the vertical direction.

The beam steering unit 200 may include a first beam steering unit 201 and a second beam steering unit 202. Each of the first beam steering unit 201 and the second beam steering unit 202 may include a plurality of nanopillars 10.

The first beam steering unit 201 may steer a laser beam emitted from the laser emitting unit 100. The plurality of nanopillars 10 included in the first beam steering unit 201 may form a nanopattern. The first beam steering unit 201 may steer, on the basis of the nanopattern, a laser beam emitted from the laser emitting unit 100.

The laser beam steered by the first beam steering unit 201 may be projected toward the second beam steering unit 202.

The second beam steering unit 202 may obtain the laser beam emitted from the first beam steering unit 201. The second beam steering unit 202 may steer the obtained laser beam.

The plurality of nanopillars 10 included in the second beam steering unit 202 may form a nanopattern. The second beam steering unit 202 may steer the obtained laser beam on the basis of the nanopattern.

The laser beam steered by the second beam steering unit 202 may be projected toward an object.

The first beam steering unit 201 may be disposed at an upper portion of the laser emitting unit 100. Specifically, the first beam steering unit 201 may be disposed at an emission surface side at which a laser beam is emitted from the laser emitting unit 100.

The second beam steering unit 202 may be disposed at an upper portion of the first beam steering unit 201.

Accordingly, laser beams emitted from the laser emitting unit 100 may sequentially pass through the first beam steering unit 201 and the second beam steering unit 202.

Figure 20:
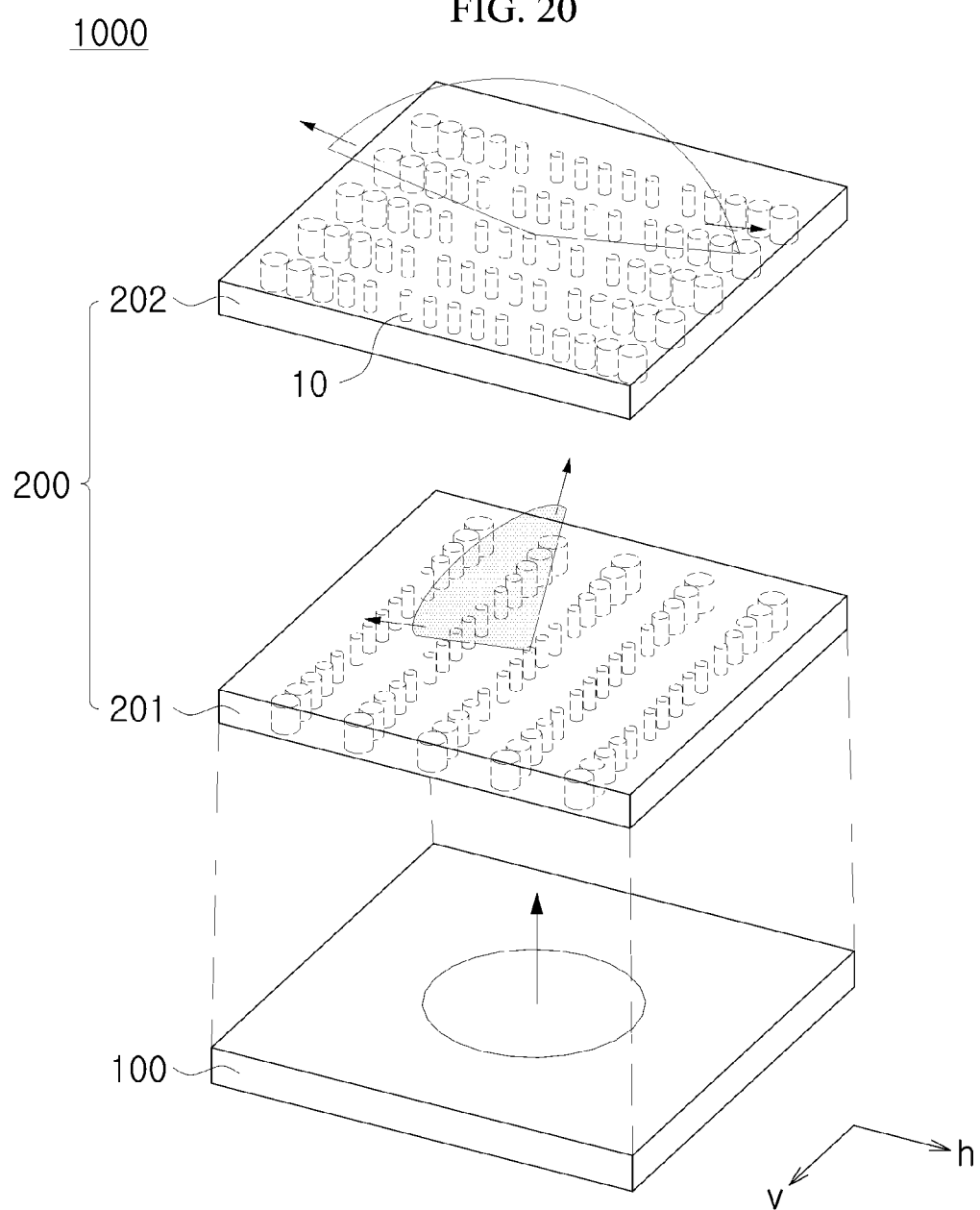
FIG. 20 is an exploded perspective view of a laser emitting device according to an embodiment.

FIG. 20 is an exploded perspective view of a laser emitting device according to an embodiment.

Referring to FIG. 20, a laser emitting device 1000 may include a laser emitting unit 100 and a beam steering unit 200. The beam steering unit 200 may include a first beam steering unit 201 and a second beam steering unit 202.

The laser emitting device 1000 may generate a plurality of scanning points distributed in the horizontal direction and vertical direction. The laser emitting device 1000 may have the FOV formed in the horizontal direction and the vertical direction.

The laser emitting unit 100 may be disposed at a lower portion of the first beam steering unit 201 and may irradiate a laser beam toward the first beam steering unit 201. Meanwhile, since the laser emitting unit 100 may operate identically or similarly to the laser emitting unit 100 described above with reference to FIGS. 1 to 18, detailed description thereof will be omitted.

The first beam steering unit 201 may be disposed at an upper portion of the laser emitting unit 100 and obtain a laser beam emitted from the laser emitting unit 100. The first beam steering unit 201 may generate laser beams of various shapes by steering the obtained laser beam.

Specifically, the first beam steering unit 201 may steer the obtained laser beam using a plurality of nanopillars 10. The first beam steering unit 201 may include a metasurface.

The first beam steering unit 201 may steer a laser beam in the h-direction corresponding to the horizontal direction and the v-direction corresponding to the vertical direction.

For example, the first beam steering unit 201 may generate a laser beam having a shape diverging in the v-direction. A vertical steering angle θv of the first beam steering unit 201 may be in a range of −15° to 15°. Here, the steering angle may refer to an angle in a clockwise direction from a virtual reference line which is perpendicular to an emission surface. That is, a steering direction having a positive steering angle may be located at a right side of the reference line, and a steering direction having a negative steering angle may be located at a left side of the reference line.

In this case, the plurality of nanopillars 10 included in the first beam steering unit 201 may form a subwavelength pattern in which at least one attribute of the width W, height H, and number per unit length repeatedly increases in the v-direction.

The second beam steering unit 202 may be disposed at an upper portion of the first beam steering unit 201 and obtain a laser beam steered by the first beam steering unit 201. The second beam steering unit 202 may generate laser beams of various shapes by steering the laser beam obtained from the first beam steering unit 201.

Specifically, the second beam steering unit 202 may steer the obtained laser beam using a plurality of nanopillars 10. The second beam steering unit 202 may include a metasurface.

The second beam steering unit 202 may steer a laser beam in the h-direction corresponding to the horizontal direction and the v-direction corresponding to the vertical direction.

For example, the second beam steering unit 202 may generate a laser beam having a shape diverging in the h-direction. A horizontal steering angle θh of the second beam steering unit 202 may be in a range of −60° to 60°.

In this case, the plurality of nanopillars 10 included in the second beam steering unit 202 may form a subwavelength pattern in which at least one attribute of the width W, height H, and number per unit length repeatedly increases in the h-direction.

Meanwhile, each of the first beam steering unit 201 and the second beam steering unit 202 may include the plurality of beam steering cells including the plurality of nanopillars 10. The plurality of beam steering cells may be arranged in the form of an array along the v-axis or h-axis.

In this case, an arrangement direction of the plurality of beam steering cells included in the first beam steering unit 201 and an arrangement direction of the plurality of beam steering cells included in the second beam steering unit 202 may be different.

For example, the plurality of beam steering cells included in the first beam steering unit 201 may be arranged in the form of an array along the v-axis. On the other hand, the plurality of beam steering cells included in the second beam steering unit 202 may be arranged in the form of an array along the h-axis.

Meanwhile, although some of the laser beams steered by the first beam steering unit 201 are seen in FIG. 20 as being projected to the outside of the second beam steering unit 202, this is merely for convenience of description, and some of the laser beams are not projected to the outside of the second beam steering unit 202 in reality.

Figure 21:
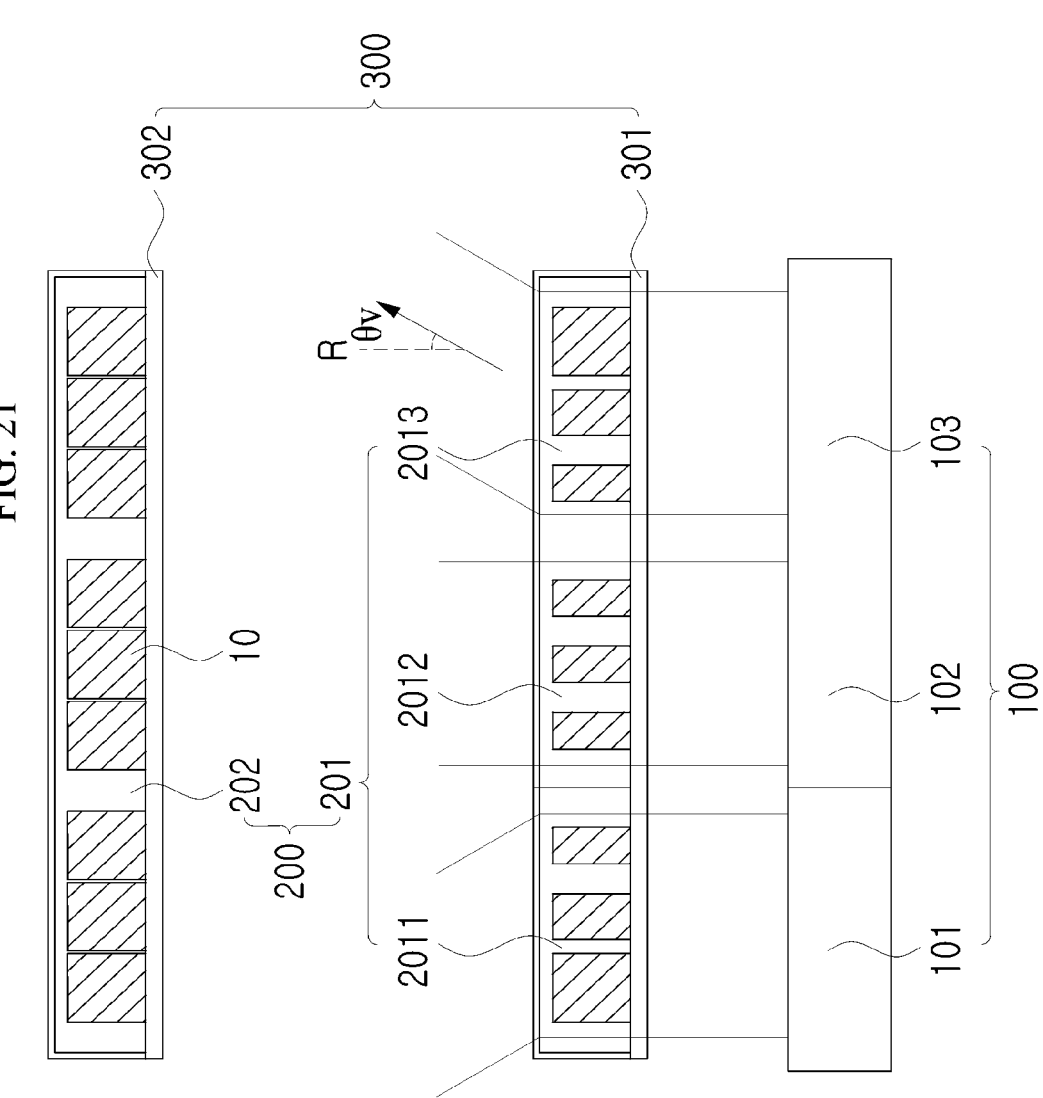
FIGS. 21 to 23 are exploded perspective views of a laser emitting device according to various embodiments viewed from the side.
Figure 22:
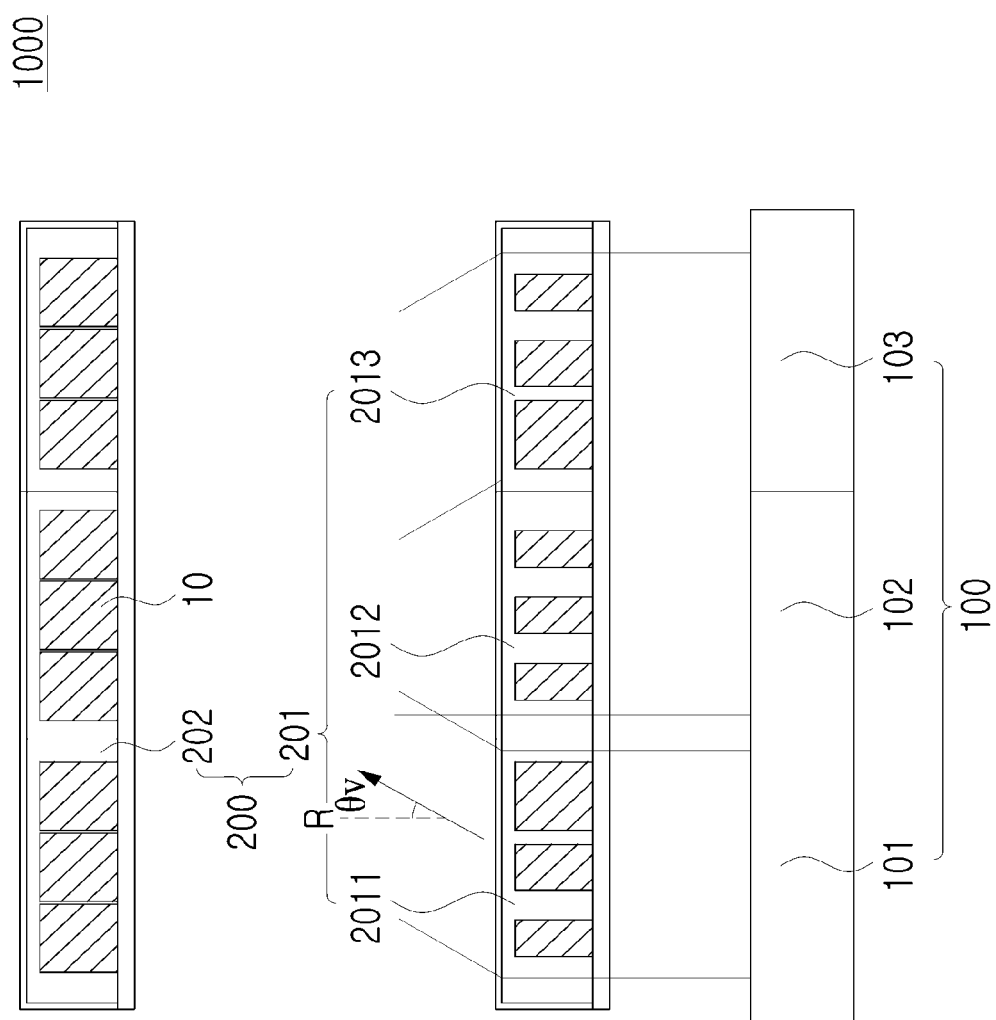
Figure 23:
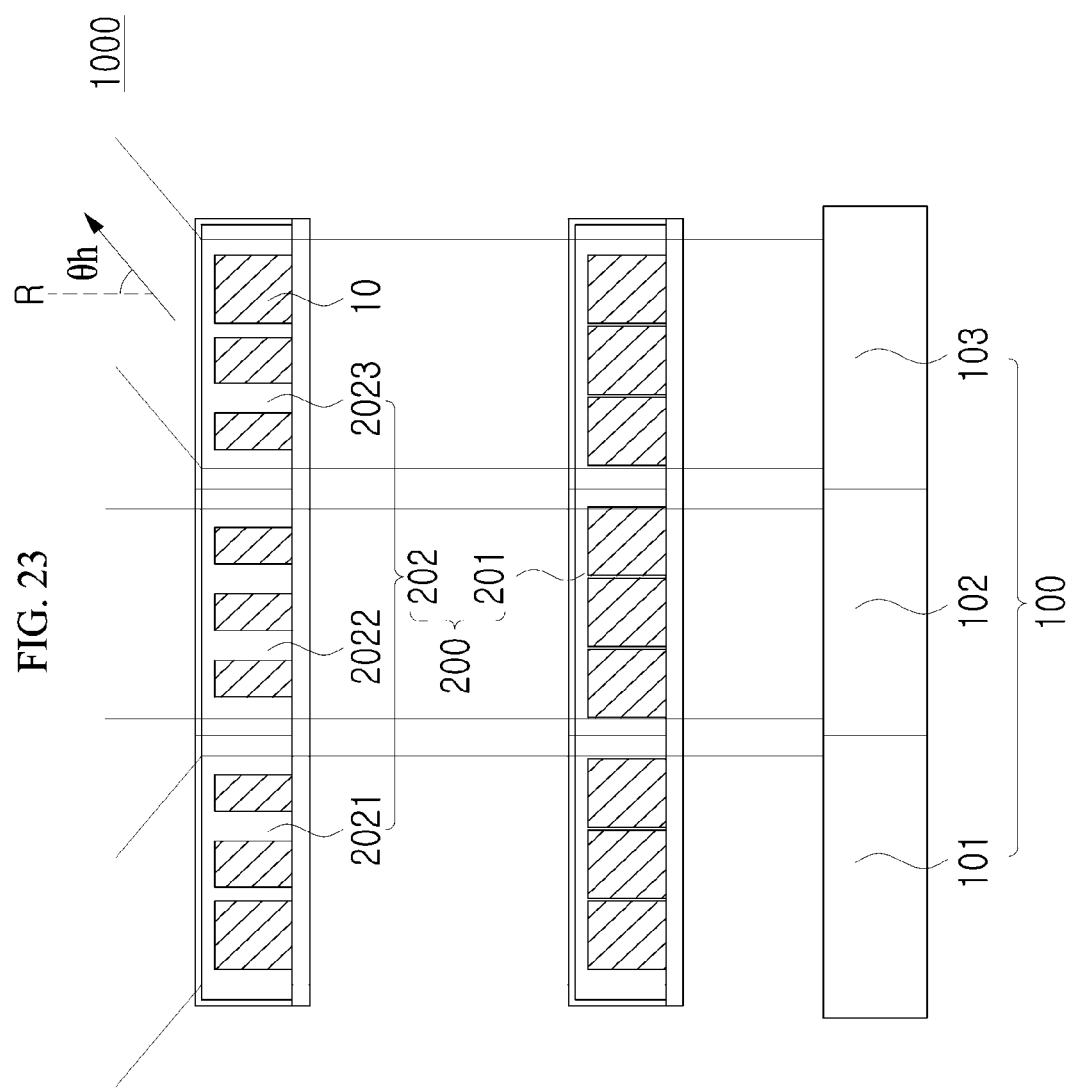

FIGS. 21 to 23 are exploded perspective views of a laser emitting device according to various embodiments viewed from the side.

Specifically, FIGS. 21 and 22 are exploded perspective views of a laser emitting device viewed along the h-axis. FIG. 23 is an exploded perspective view of a laser emitting device viewed along the v-axis.

Referring to FIG. 21, a laser emitting device 1000 may include a laser emitting unit 100 and a beam steering unit 200. The beam steering unit 200 may include a first beam steering unit 201 and a second beam steering unit 202. Each of the first beam steering unit 201 and the second beam steering unit 202 may include a plurality of nanopillars 10.

The laser emitting device 1000 may include a support unit 300 configured to support the beam steering unit 200.

The support unit 300 may support the nanopillars 10 included in the beam steering unit 200. Alternatively, the support unit 300 may support a metasurface including the plurality of nanopillars 10. Accordingly, the plurality of nanopillars 10 may be deposited on the support unit 300.

A light transmittance of the support unit 300 may be at least 90% or higher.

The support unit 300 may be formed of various materials. For example, the support unit 300 may include glass, metamaterial, and the like.

The support unit 300 may be provided in the form of a flat panel.

The support unit 300 may include a first support unit 301 and a second support unit 302.

The first support unit 301 may be disposed between the laser emitting unit 100 and the first beam steering unit 201 to support the first beam steering unit 201.

The second support unit 302 may be disposed between the first beam steering unit 201 and the second beam steering unit 202 to support the second beam steering unit 202.

The first support unit 301 and the second support unit 302 may be formed of different materials.

A refractive index of the first support unit 301 may be lower than a refractive index of the nanopillars 10 included in the first beam steering unit 201.

The laser emitting unit 100 may include a plurality of laser emitting units 101, 102, and 103 arranged in the form of a one-dimensional array in the v-direction.

Each of the plurality of laser emitting units 101, 102, and 103 may emit a laser beam toward the beam steering unit 200.

The first beam steering unit 201 may obtain a laser beam emitted from the laser emitting unit 100.

The first beam steering unit 201 may steer the obtained laser beam using the plurality of nanopillars 10.

The first beam steering unit 201 may generate a laser beam having a shape diverging in the v-direction. For example, a vertical steering angle θv of the first beam steering unit 201 may be in the range of −15° to 15°

In this case, the plurality of nanopillars 10 included in the first beam steering unit 201 may form a subwavelength pattern in which a width W thereof increases along the v-axis.

Specifically, the plurality of nanopillars 10 included in the first beam steering unit 201 may form, in a direction away from the center of the first beam steering unit 201 along the v-axis, a nanopattern in which the width W thereof increases.

Meanwhile, the first beam steering unit 201 may include a first beam steering cell 2011, a second beam steering cell 2012, and a third beam steering cell 2013. A plurality of nanopillars 10 included in each of the plurality of beam steering cells 2011, 2012, and 2013 may form a nanopattern on the basis of locations of the plurality of beam steering cells 2011, 2012, and 2013.

For example, the plurality of nanopillars 10 included in the second beam steering cell 2012 located at the center of the first beam steering unit 201 may form a nanopattern in which an attribute related to at least one of the width W, height H, and number per unit length is uniform. Accordingly, a steering angle of the second beam steering cell 2012 may be 0°.

In this case, the plurality of nanopillars 10 included in the first beam steering cell 2011 located at the left of the second beam steering cell 2012 may form a nanopattern in which an attribute related to at least one of the width W, height H, and number per unit length increases in a direction from the center of the first beam steering unit 201 toward the first beam steering cell 2011. Accordingly, a vertical steering angle θv of the first beam steering cell 2011 may have a negative value.

Likewise, the plurality of nanopillars 10 included in the third beam steering cell 2013 located at the right of the second beam steering cell 2012 may form a nanopattern in which an attribute related to at least one of the width W, height H, and number per unit length increases in a direction from the center of the first beam steering unit 201 toward the third beam steering cell 2013. Accordingly, a vertical steering angle θv of the third beam steering cell 2013 may have a positive value.

On the other hand, the plurality of nanopillars 10 may form a nanopattern in which an attribute decreases in a direction from the center of the first beam steering unit 201 toward each of the beam steering cells 2011, 2012, and 2013.

Referring to FIG. 22, the plurality of nanopillars 10 included in the second beam steering cell 2012 located at the center of the first beam steering unit 201 may form a nanopattern in which an attribute related to at least one of the width W, height H, and number per unit length is uniform. Accordingly, a steering angle of the second beam steering cell 2012 may be 0°.

In this case, the plurality of nanopillars 10 included in the first beam steering cell 2011 located at the left of the second beam steering cell 2012 may form a nanopattern in which an attribute related to at least one of the width W, height H, and number per unit length of the nanopillars 10 decreases in a direction from the center of the first beam steering unit 201 toward the first beam steering cell 2011. Accordingly, a vertical steering angle θv of the first beam steering cell 2011 may have a positive value.

Likewise, the plurality of nanopillars 10 included in the third beam steering cell 2013 located at the right of the second beam steering cell 2012 may form a nanopattern in which an attribute related to at least one of the width W, height H, and number per unit length of the nanopillars 10 decreases in a direction from the center of the first beam steering unit 201 toward the third beam steering cell 2013. Accordingly, a vertical steering angle θv of the third beam steering cell 2013 may have a negative value.

The second beam steering unit 202 may obtain a laser beam steered by the first beam steering unit 201.

The second beam steering unit 202 may include a plurality of beam steering cells 2021, 2022, and 2023.

The second beam steering unit 202 may steer the obtained laser beam using a plurality of nanopillars 10.

As illustrated in FIG. 23, the second beam steering unit 202 may generate a laser beam having a shape diverging along the h-axis. For example, a horizontal steering angle θh of the second beam steering unit 202 may be in the range of −60° to 60°.

In this case, the plurality of nanopillars 10 included in the second beam steering unit 202 may form a subwavelength pattern in which a width W thereof increases along the h-axis.

Specifically, the plurality of nanopillars 10 included in the second beam steering unit 202 may form, in a direction away from the center of the second beam steering unit 202 along the h-axis, a nanopattern in which the width W thereof increases.

Likewise, the plurality of nanopillars 10 included in the second beam steering unit 202 may form nanopatterns on the basis of locations of the plurality of beam steering cells 2021, 2022, and 2023.

Meanwhile, a vertical steering angle θv of FIG. 21 may be smaller than a horizontal steering angle θ of FIG. 23. Accordingly, a horizontal range of the FOV of the laser emitting device 1000 may be wider than a vertical range of the FOV.

Meanwhile, the steering performance of the second beam steering unit 202 may vary according to an angle of incidence of a laser beam incident on the second beam steering unit 202. Specifically, the steering performance of the second beam steering unit 202 may be improved as angle of incidence of the laser beam is closer to 90°. Here, angle of incidence may refer to an angle between the second support unit 302 and the incident laser beam.

In other words, the steering performance of the second beam steering unit 202 may be related to a steering angle of the first beam steering unit 201. Specifically, the steering performance of the second beam steering unit 202 may be improved as the steering angle of the first beam steering unit 201 becomes smaller.

Accordingly, the first steering angle of the first beam steering unit 201 may be smaller than the second steering angle of the second beam steering unit 202. That is, the first beam steering unit 201 may steer a laser beam in the vertical direction in which the steering angle is relatively small, and the second beam steering unit 202 may steer a laser beam in the horizontal direction in which the steering angle is relatively large.

Accordingly, the steering performance of the laser emitting device 1000 may be improved.

Meanwhile, although a nanopattern due to a change in the width W of the nanopillars 10 has been described as an example with reference to FIGS. 21 to 23, the plurality of nanopillars 10 included in the beam steering unit 200 may form a nanopattern on the basis of changes in the height H and number per unit length. This should be sufficiently understood from the principle described above with reference to FIGS. 2 to 7.

Meanwhile, steering directions of the first beam steering unit 201 and the second beam steering unit 202 may be switched with each other. That is, the first beam steering unit 201 may steer a laser beam in the h-direction, and the second beam steering unit 202 may steer a laser beam in the v-direction.

Figure 24:
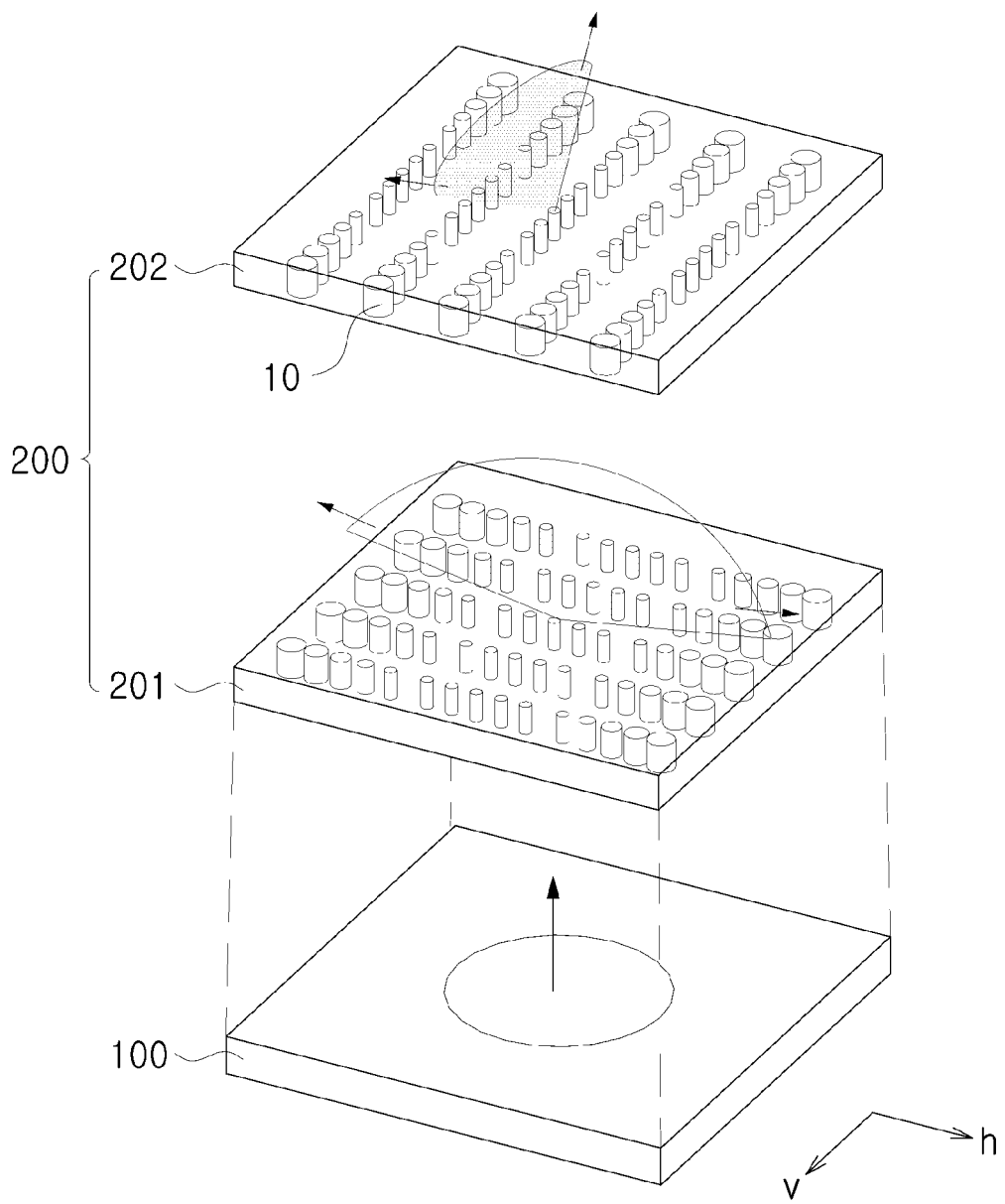
FIGS. 24 to 26 are exploded perspective views of a laser emitting device according to various embodiments.

FIG. 24 is an exploded perspective view of a laser emitting device according to another embodiment.

Referring to FIG. 24, a laser emitting device 1000 may include a laser emitting unit 100 and a beam steering unit 200. The beam steering unit 200 may include a first beam steering unit 201 and a second beam steering unit 202.

An operation principle of the laser emitting device 1000 may be the same as that of the laser emitting device 1000 of FIG. 20 except for steering directions of the first and second beam steering units 201 and 202. Accordingly, differences from the laser emitting device 1000 of FIG. 20 will be mainly described below.

The first beam steering unit 201 may generate a laser beam having a shape diverging in the h-direction. A horizontal steering angle θh of the first beam steering unit 201 may be in the range of −60° to 60°.

In this case, a plurality of nanopillars 10 included in the first beam steering unit 201 may form a subwavelength pattern in which at least one attribute of the width W, height H, and number per unit length repeatedly increases in the h-direction.

The second beam steering unit 202 may be disposed at an upper portion of the first beam steering unit 201 to obtain a laser beam steered by the first beam steering unit 201. The second beam steering unit 202 may generate laser beams of various shapes by steering the laser beam obtained from the first beam steering unit 201.

Specifically, the second beam steering unit 202 may steer the obtained laser beam using the plurality of nanopillars 10. The second beam steering unit 202 may include a metasurface.

The second beam steering unit 202 may steer a laser beam in the h-direction corresponding to the horizontal direction and the v-direction corresponding to the vertical direction.

For example, the second beam steering unit 202 may generate a laser beam having a shape diverging in the v-direction. A vertical steering angle θv of the second beam steering unit 202 may be in the range of −15° to 15°.

In this case, the plurality of nanopillars 10 included in the second beam steering unit 202 may form a subwavelength pattern in which at least one attribute of the width W, height H, and number per unit length repeatedly increases in the h-direction.

Meanwhile, although some of the laser beams steered by the first beam steering unit 201 are seen in FIG. 24 as being projected to the outside of the second beam steering unit 202, this is merely for convenience of description, and some of the laser beams are not projected to the outside of the second beam steering unit 202 in reality.

Figure 25:
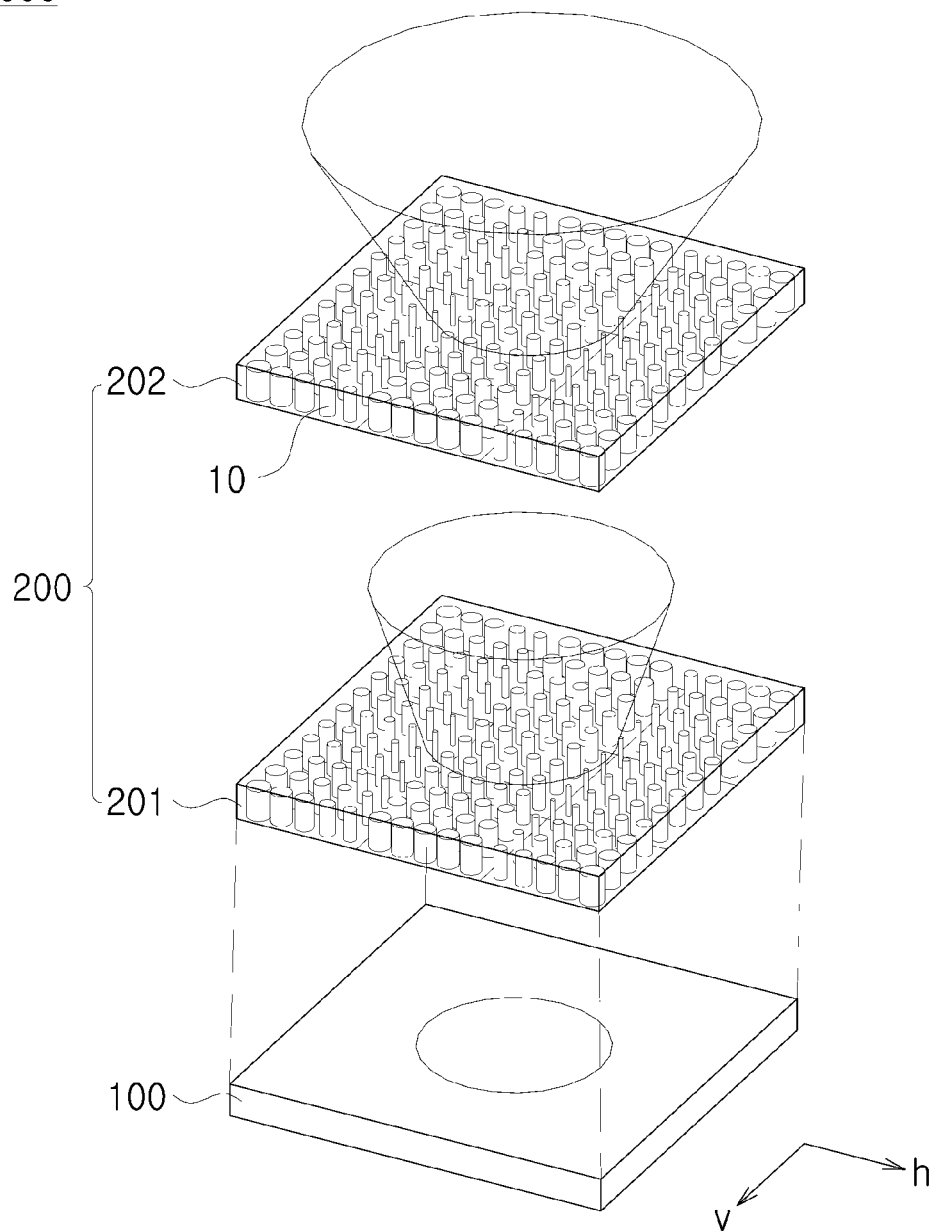

FIG. 25 is an exploded perspective view of a laser emitting device according to still another embodiment.

Referring to FIG. 25, a laser emitting device 1000 may include a laser emitting unit 100 and a beam steering unit 200. The beam steering unit 200 may include a first beam steering unit 201 and a second beam steering unit 202.

An operation principle of the laser emitting device 1000 may be the same as that of the laser emitting device 1000 of FIG. 20, except for steering directions and angles of the first and second beam steering units 201 and 202. Accordingly, differences from the laser emitting device 1000 of FIG. 20 will be mainly described below.

The first beam steering unit 201 may generate a laser beam having a shape diverging in the h-direction and v-direction. In this case, a horizontal steering angle θh of the first beam steering unit 201 may be in the range of −20° to 20°. Also, a vertical steering angle θv of the first beam steering unit 201 may be in the range of −5° to 5°.

In this case, a plurality of nanopillars 10 included in the first beam steering unit 201 may form a subwavelength pattern in which at least one attribute of the width W, height H, and number per unit length repeatedly increases in the h-direction.

Also, the plurality of nanopillars 10 included in the first beam steering unit 201 may form a subwavelength pattern in which at least one attribute of the width W, height H, and number per unit length repeatedly increases in the v-direction.

The second beam steering unit 202 may be disposed at an upper portion of the first beam steering unit 201 to obtain a laser beam steered by the first beam steering unit 201. The second beam steering unit 202 may generate laser beams of various shapes by steering the laser beam obtained from the first beam steering unit 201.

Specifically, the second beam steering unit 202 may steer the obtained laser beam using the plurality of nanopillars 10. The second beam steering unit 202 may include a metasurface.

The second beam steering unit 202 may steer a laser beam in the h-direction corresponding to the horizontal direction and the v-direction corresponding to the vertical direction.

The second beam steering unit 202 may generate a laser beam having a shape diverging in the v-direction and the h-direction.

For example, the second beam steering unit 202 may steer a laser beam steered by the first beam steering unit 201 in the range of −10° to 10° in the h-direction. Accordingly, the laser beam steered by the second beam steering unit 202 may be emitted at a steering angle in the range of −15° to 15°, which is the sum of the steering angle by the first beam steering unit 201 and the steering angle by the second beam steering unit 202.

Also, the second beam steering unit 202 may steer a laser beam steered by the first beam steering unit 201 in the range of −40° to 40° in the v-direction. Accordingly, the laser beam steered by the second beam steering unit 202 may be emitted at a steering angle in the range of −60° to 60°, which is the sum of the steering angle by the first beam steering unit 201 and the steering angle by the second beam steering unit 202.

The plurality of nanopillars 10 included in the second beam steering unit 202 may form a subwavelength pattern in which at least one attribute of the width W, height H, and number per unit length repeatedly increases in the h-direction.

Also, the plurality of nanopillars 10 included in the second beam steering unit 202 may form a subwavelength pattern in which at least one attribute of the width W, height H, and number per unit length repeatedly increases in the v-direction.

Meanwhile, although some of the laser beams steered by the first beam steering unit 201 are seen in FIG. 25 as being projected to the outside of the second beam steering unit 202, this is merely for convenience of description, and some of the laser beams are not projected to the outside of the second beam steering unit 202 in reality.

Sizes of the first beam steering unit 201 and the second beam steering unit 202 may be different. For example, a cross-sectional area along the h-axis of the second beam steering unit 202 may be larger than a cross-sectional area along the h-axis of the first beam steering unit 201.

Figure 26:
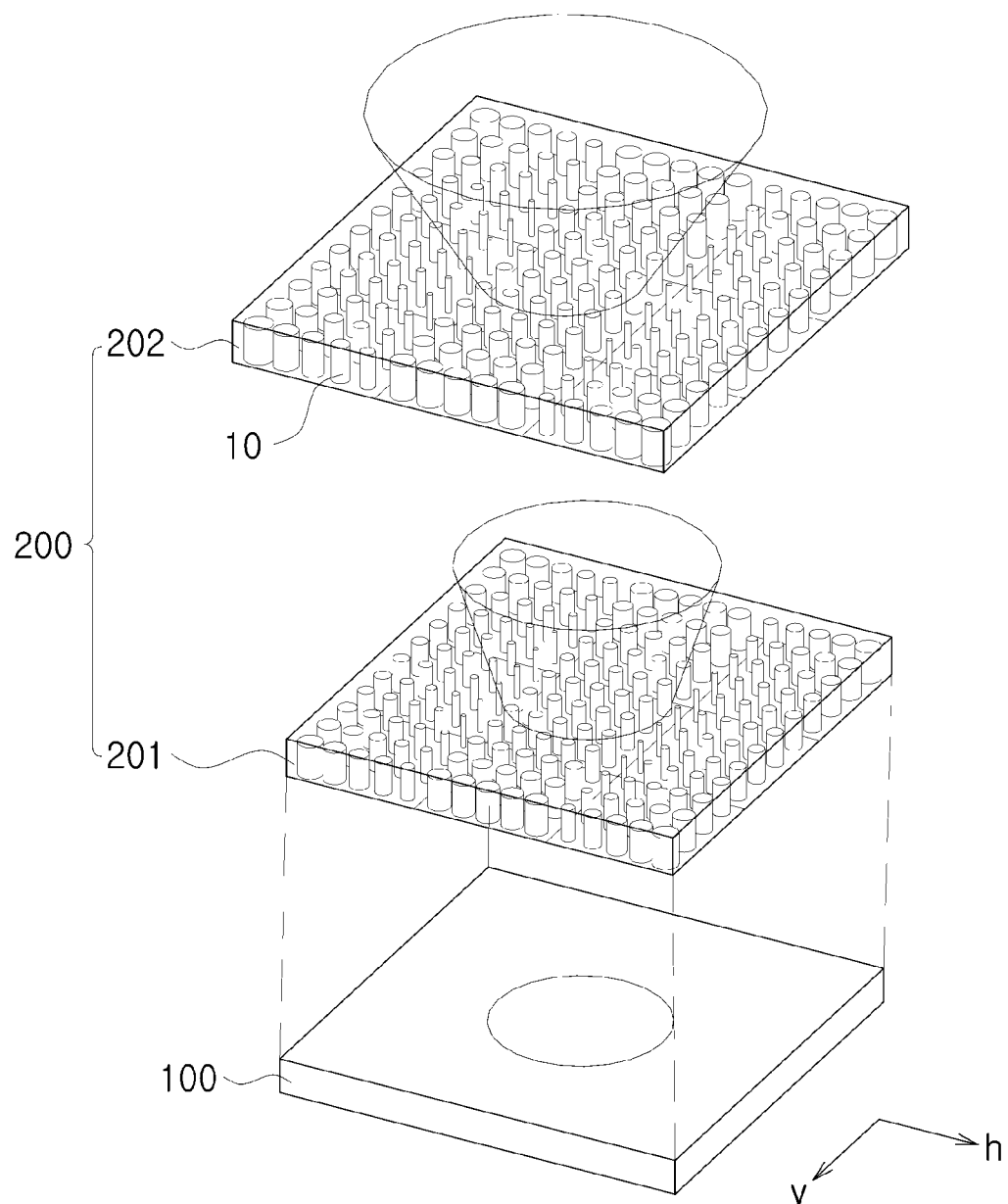

FIG. 26 is an exploded perspective view of a laser emitting device according to yet another embodiment.

Referring to FIG. 26, a laser emitting device 1000 may include a laser emitting unit 100 and a beam steering unit 200. The beam steering unit 200 may include a first beam steering unit 201 and a second beam steering unit 202.

An operation principle of the laser emitting device 1000 may be the same as that of the laser emitting device 1000 of FIG. 25, except for a size relationship between the first and second beam steering units 201 and 202. Accordingly, differences from the laser emitting device 1000 of FIG. 25 will be mainly described below.

Figure 27:
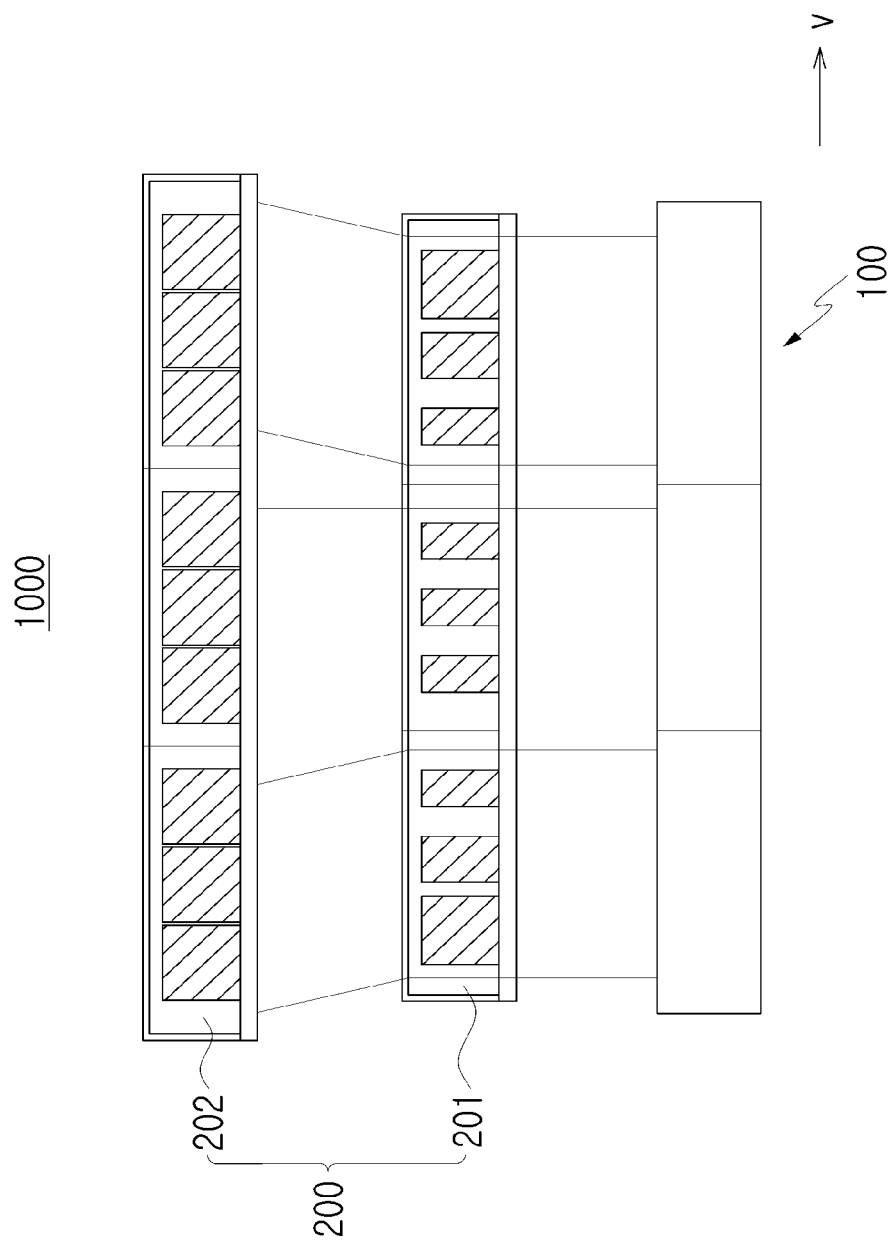
FIGS. 27 and 28 are exploded perspective views of the laser emitting device of FIG. 26 viewed from the side.
Figure 28:
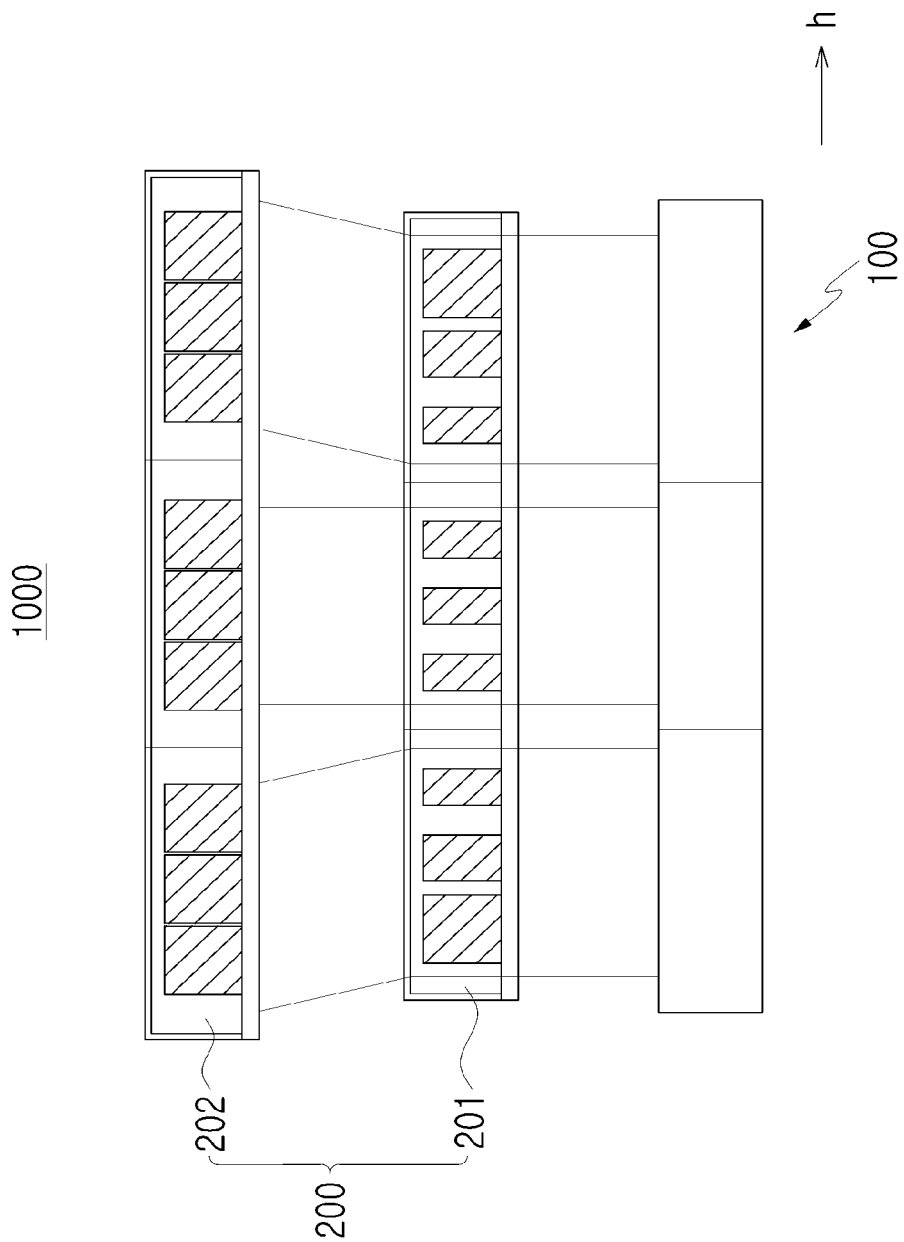

FIGS. 27 and 28 are exploded perspective views of the laser emitting device of FIG. 26 viewed from the side. Specifically, FIG. 27 is an exploded perspective view of the laser emitting device of FIG. 26 viewed along the h-axis. FIG. 28 is an exploded perspective view of the laser emitting device of FIG. 26 viewed along the v-axis.

Referring to FIG. 27, a length along the v-axis of the first beam steering unit 201 may be smaller than a length along the v-axis of the second beam steering unit 202.

Accordingly, the second beam steering unit 202 may easily obtain a laser beam steered by the first beam steering unit 201.

Specifically, when the first beam steering unit 201 generates a laser beam diverging along the v-axis, some of the diverged laser beams may be emitted to the outside of the second beam steering unit 202. Accordingly, light loss may occur due to beam steering by the first beam steering unit 201.

When the length along the v-axis of the second beam steering unit 202 is larger than the length along the v-axis of the first beam steering unit 201, the light loss may be prevented.

Likewise, as illustrated in FIG. 28, when viewed along the v-axis, a length along the h-axis of the first beam steering unit 201 may be smaller than a length along the h-axis of the second beam steering unit 202.

When the first beam steering unit 201 generates a laser beam diverging along the h-axis, some of the diverged laser beams may be emitted to the outside of the second beam steering unit 202. Accordingly, light loss may occur due to beam steering of the first beam steering unit 201.

When the length along the h-axis of the second beam steering unit 202 is larger than the length along the h-axis of the first beam steering unit 201, the light loss may be prevented.

Meanwhile, the length of the second beam steering unit 202 may be set on the basis of a steering direction of the first beam steering unit 201.

For example, when the first beam steering unit 201 steers a laser beam along the v-axis, the length along the v-axis of the second beam steering unit 202 viewed along the h-axis may be larger than the length along the v-axis of the first beam steering unit 201 viewed along the h-axis.

In this case, the length along the h-axis of the second beam steering unit 202 viewed along the v-axis may be equal to the length along the h-axis of the first beam steering unit 201 viewed along the v-axis.

As another example, when the first beam steering unit 201 steers a laser beam along the h-axis, a length along the h-axis of the second beam steering unit 202 viewed along the v-axis may be larger than a length along the h-axis of the first beam steering unit 201 viewed along the v-axis.

In this case, a length along the v-axis of the second beam steering unit 202 viewed along the h-axis may be equal to a length along the v-axis of the first beam steering unit 201 viewed along the h-axis.

As still another example, when the first beam steering unit 201 steers a laser beam along the h-axis and v-axis, lengths along the v-axis and h-axis of the second beam steering unit 202 viewed along the v-axis and h-axis may be larger than lengths along the v-axis and h-axis of the first beam steering unit 201 viewed along the v-axis and h-axis.

Meanwhile, a length of the second beam steering unit 202 may be set on the basis of a size of a steering angle of the first beam steering unit 201.

For example, a length of the second beam steering unit 202 when a steering angle of the first beam steering unit 201 is a first angle may be smaller than a length of the second beam steering unit 202 when the steering angle of the first beam steering unit 201 is a second angle which is larger than the first angle.

Meanwhile, in FIGS. 27 and 28, as the plurality of nanopillars 10 included in the first beam steering unit 201, portions of the nanopillars 10 in which changes in the width W are shown are illustrated. However, this is merely for convenience of description, and when the laser emitting device 1000 of FIG. 26 is viewed from the side in reality, the sizes of the plurality of nanopillars 10 may also look the same.

Meanwhile, the laser emitting device 1000 has been described above with reference to FIGS. 19 to 28 as including two beam steering units 201 and 202. However, embodiments are not limited thereto, and the laser emitting device 1000 may also include three or more beam steering units 200.

The operation principles of the laser emitting device 1000 according to various embodiments have been described above.

Hereinafter, implementations in which the laser emitting device 1000 is applied will be described.

Figure 29:
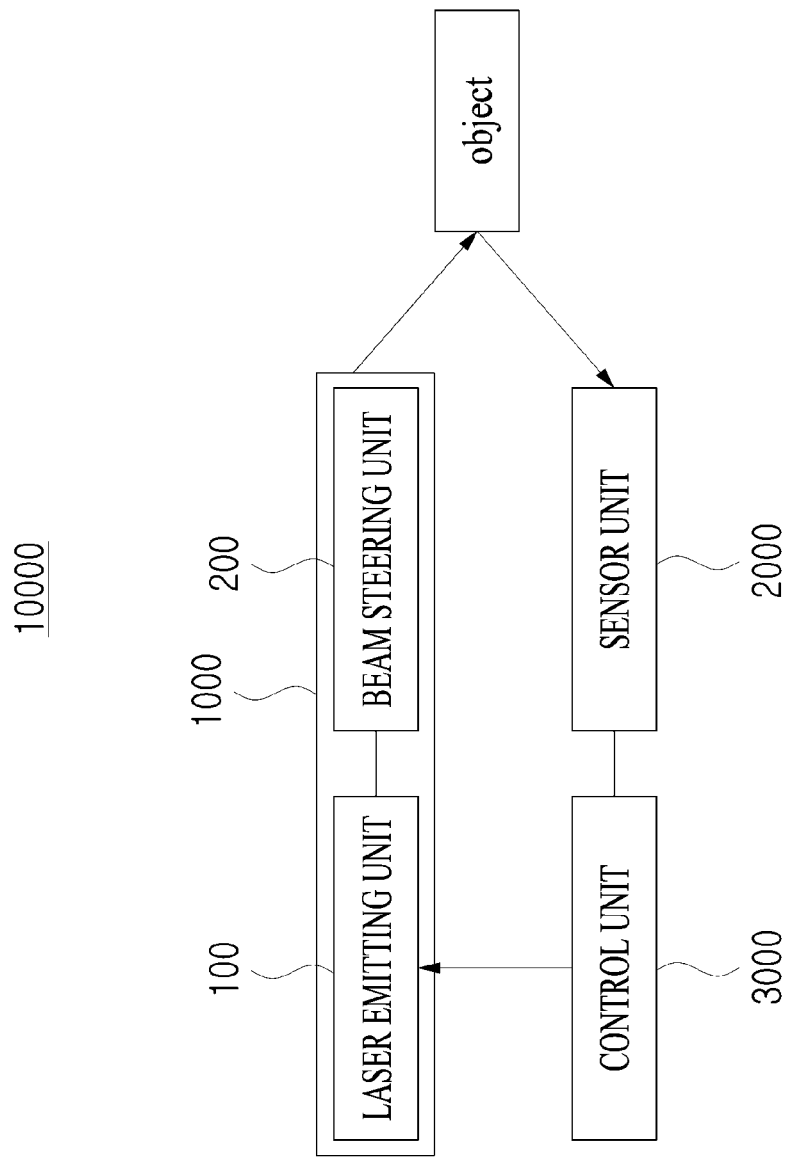
FIGS. 29 to 31 are block diagrams for describing a light detection and ranging (LiDAR) device according to various embodiments.

FIG. 29 is a block diagram for describing a light detection and ranging (LiDAR) device according to an embodiment. The lidar device may refer to a device for obtaining information on a distance to a surrounding object by using a laser.

Referring to FIG. 29, a lidar device 10000 according to an embodiment may include a laser emitting device 1000, a sensor unit 2000, and a control unit 3000.

A laser beam emitted from the laser emitting device 1000 may be irradiated to an object and then sensed by the sensor unit 2000. The control unit 3000 may obtain information on a distance from the object on the basis of a reception time point of the laser beam sensed by the sensor unit 2000 and an emission time point of the laser beam emitted from the laser emitting device 1000.

Each configuration of the lidar device 10000 will be described in detail below.

The laser emitting device 1000 may include a laser emitting unit 100 and a beam steering unit 200. Meanwhile, since the laser emitting device 1000 may operate identically or similarly to the laser emitting device described above with reference to FIGS. 1 to 28, detailed description thereof will be omitted.

The sensor unit 2000 may sense a laser beam reflected from an object.

The sensor unit 2000 may include a single sensor element or may also include a sensor array formed of a plurality of sensor elements. For example, the second unit 2000 may include an avalanche photodiode (APD) or may also include silicon photomultipliers (SiPM) formed of a plurality of single-photon avalanche diodes (SPADs).

The sensor unit 2000 may be provided as a single channel including a plurality of APDs. The sensor unit 2000 may also include a plurality of channels.

The sensor unit 2000 may include a charge-coupled device (CCD) and a complementary metal-oxide-semiconductor (CMOS) image sensor.

The control unit 3000 may control the laser emitting unit 100 and the sensor unit 2000. For example, the control unit 3000 may control an emission time point, an emission cycle, and an intensity of a laser beam emitted from the laser emitting unit 100.

The control unit 3000 may obtain an emission time point of a laser beam emitted from the laser emitting unit 100. The control unit 3000 may obtain a reception time point of a laser beam reflected from an object and sensed by a sensor 1100. The control unit 3000 may obtain the information on a distance from the object using the emission time point and the reception time point.

Figure 30:
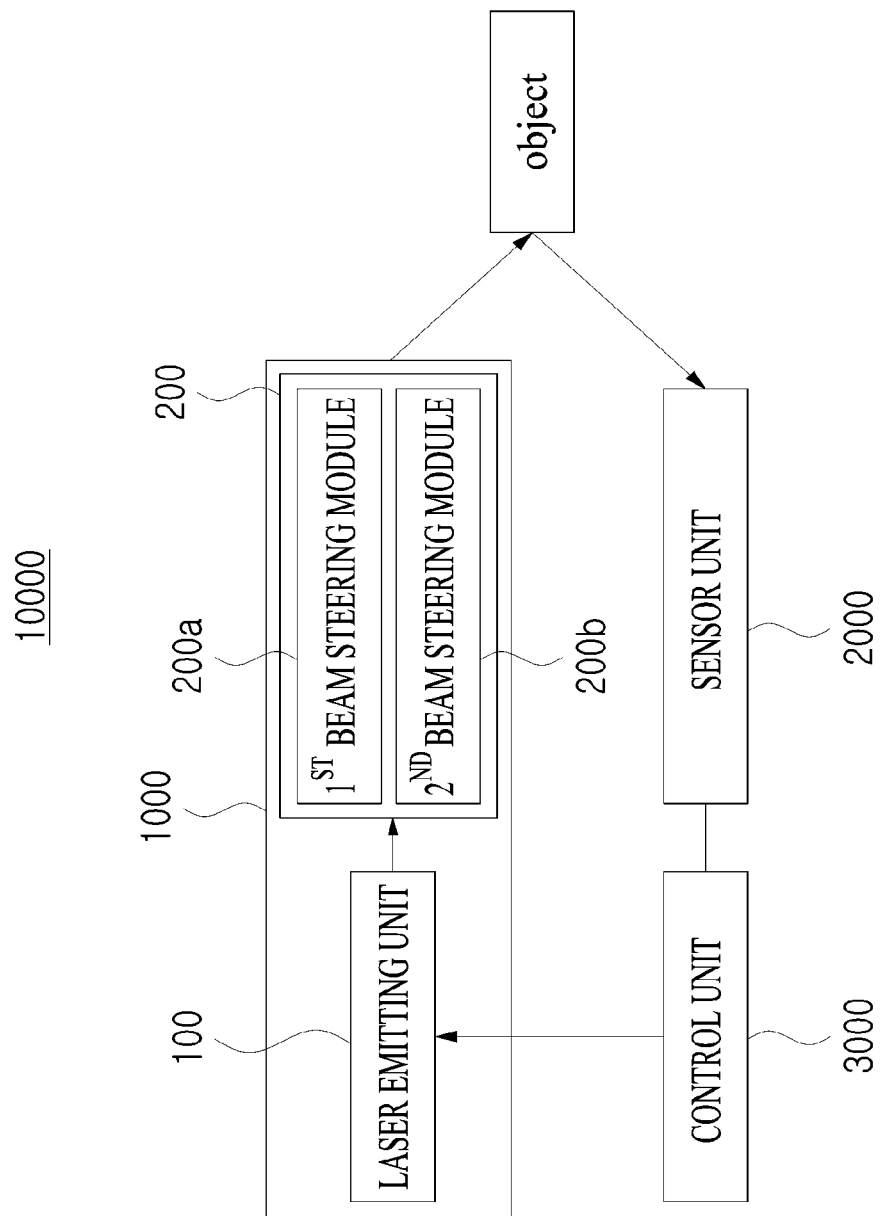

FIG. 30 is a block diagram for describing a lidar device according to another embodiment.

Referring to FIG. 30, a lidar device 10000 according to an embodiment may include a laser emitting unit 100, a beam steering unit 200, a sensor unit 2000, and a control unit 3000.

Meanwhile, except for the beam steering unit 200, the lidar device of FIG. 30 may operate identically to the lidar device of FIG. 29. Accordingly, detailed description on other configurations will be omitted, and the beam steering unit 200 will be mainly described.

The beam steering unit 200 may steer a laser beam emitted from the laser emitting unit 100 using a plurality of nanopillars.

The beam steering unit 200 may include a plurality of beam steering modules. For example, the beam steering unit 200 may include a first beam steering module 200a and a second beam steering module 200b.

Each of the first beam steering module 200a and the second beam steering module 200b may include a plurality of nanopillars.

The plurality of nanopillars may form a subwavelength pattern on the basis of at least one attribute of a width W, a pitch P, and a height H.

First nanopillars included in the first beam steering module 200a may form a subwavelength pattern on the basis of a first attribute.

Second nanopillars included in the second beam steering module 200b may form a subwavelength pattern on the basis of a second attribute.

The first attribute and the second attribute may be the same.

Meanwhile, the first beam steering module 200a and the second beam steering module 200b may be disposed on different planes. For example, the second beam steering module 200b may be disposed above the first beam steering module 200a.

Figure 31:
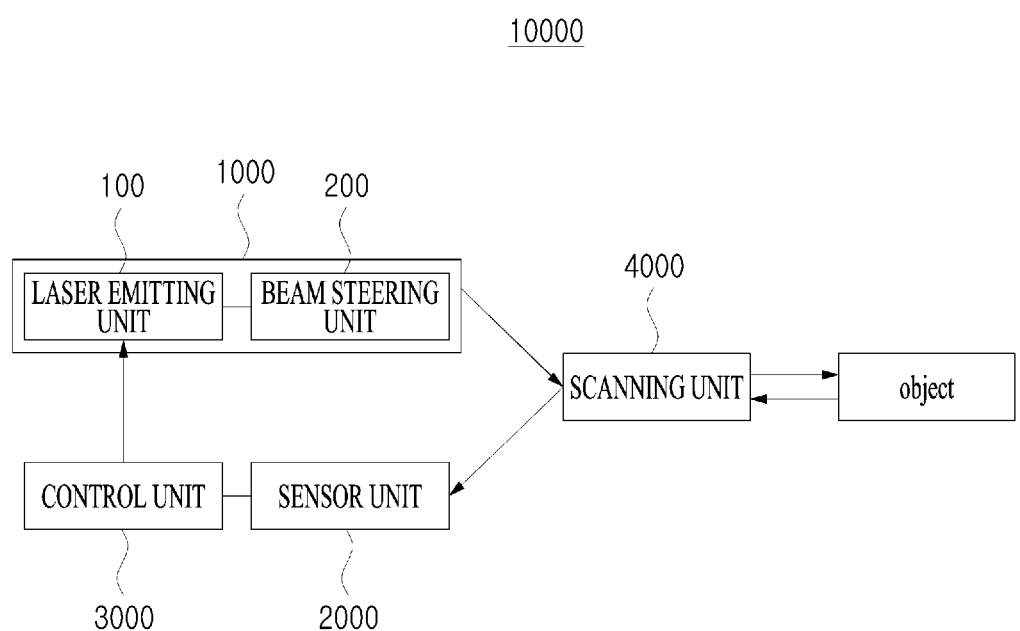

FIG. 31 is a block diagram for describing a lidar device according to still another embodiment.

Referring to FIG. 31, a lidar device 10000 according to an embodiment may include a laser emitting unit 100, a beam steering unit 200, a sensor unit 2000, a control unit 3000, and a scanning unit 4000.

Meanwhile, except for including the scanning unit 4000, the lidar device of FIG. 31 may operate identically to the lidar device of FIG. 29. Accordingly, detailed description on other configurations will be omitted, and the scanning unit 4000 will be mainly described.

A laser beam emitted from the laser emitting unit 100 may be steered by the beam steering unit 200. The beam steering unit 200 may irradiate the laser beam emitted from the laser emitting unit 100 toward an object through the scanning unit 4000. The sensor unit 2000 may receive the laser beam reflected from the object through the scanning unit 4000. The control unit 3000 may obtain a distance from the lidar device 10000 to the object using an emission time point of the emitted laser beam and a reception time point of the received laser beam.

The scanning unit 4000 according to an embodiment may obtain the laser beam emitted from the laser emitting device 1000. The scanning unit 4000 may reflect the obtained laser beam toward an object.

The scanning unit 4000 may obtain a laser beam reflected from the object. The scanning unit 4000 may reflect the obtained laser beam toward the sensor unit.

The scanning unit 4000 may steer a laser beam emitted from the laser emitting device 1000. For example, the scanning unit 4000 may change a flight path of the emitted laser beam by reflecting the emitted laser beam. Alternatively, the scanning unit 4000 may change the flight path of the emitted laser beam by refracting the emitted laser beam.

The scanning unit 4000 may form laser beams in various patterns. For example, the scanning unit 4000 may form a laser beam of a line pattern from a laser beam in the form of a point light source. Alternatively, the scanning unit 4000 may form a laser beam in a planar pattern from a laser beam of a line pattern.

The scanning unit 4000 may form the FOV including a plurality of scanning points distributed in the vertical direction and horizontal direction.

The scanning unit 4000 may include various optical configurations.

For example, the scanning unit 4000 may include a scanning mirror configured to reflect light. Specifically, the scanning mirror may include a plane mirror, a micro-electro-mechanical-system (MEMS) mirror, a galvano mirror, and a polygonal mirror.

Also, the scanning unit 4000 may include a lens and a collimator.

Figure 32:
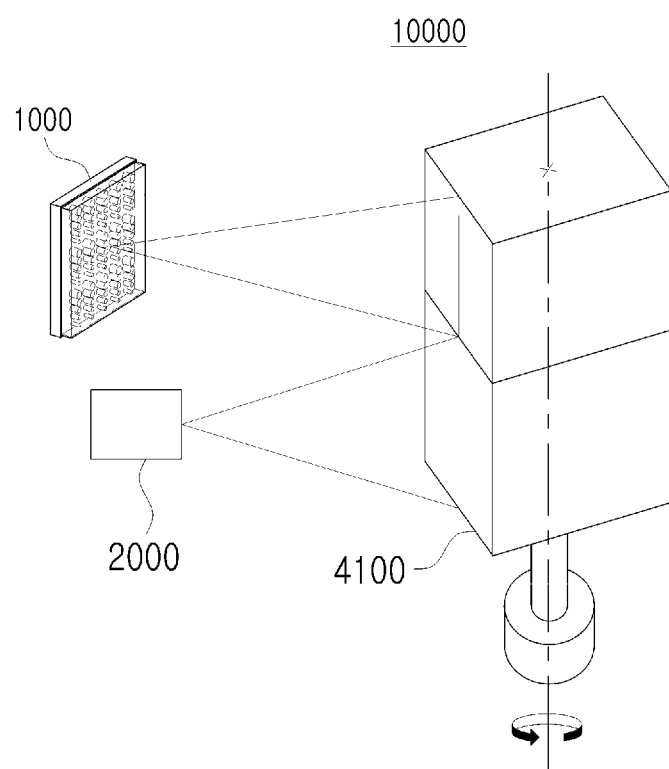
FIGS. 32 to 35 are pictorial diagrams illustrating a lidar device according to various implementations.

FIG. 32 is a pictorial diagram illustrating a lidar device according to an implementation.

Referring to FIG. 32, a lidar device 10000 may include a laser emitting device 1000, a sensor unit 2000, and a polygonal mirror 4100.

A laser beam emitted from the laser emitting device 1000 may be projected toward an object through the polygonal mirror 4100. A laser beam reflected from the object may be received by the sensor unit 2000 through the polygonal mirror 4100.

Each configuration of the lidar device will be described in detail below.

The laser emitting device 1000 may emit a laser beam toward the polygonal mirror 4100. Specifically, the laser emitting device 1000 may emit a laser beam to an upper portion of a reflective surface of the polygonal mirror 4100.

The laser emitting device 1000 may emit laser beams of various forms. For example, the laser emitting device 1000 may emit a beam of a line pattern extending along a rotation axis of the polygonal mirror 4100.

The laser beam emitted from the laser emitting device 1000 may be projected to a reflective surface of the polygonal mirror 4100.

The polygonal mirror 4100 may change a flight path of the laser beam emitted from the laser emitting device 1000. For example, the polygonal mirror 4100 may change the flight path of the laser beam by reflecting the emitted laser beam.

The polygonal mirror 4100 may project the emitted laser beam toward an object by reflecting the emitted laser beam.

The polygonal mirror 4100 may rotate about one axis. The polygonal mirror 4100 may form laser beams in various patterns by rotating 360°. For example, the polygonal mirror 4100 may form a laser beam in a planar pattern from a laser beam of a line pattern by rotating. Alternatively, the polygonal mirror 4100 may form a laser beam in a linear form extending along an axis perpendicular to the one axis from a laser beam in the form of a point light source.

The polygonal mirror 4100 may obtain a laser beam reflected from the object. The polygonal mirror 4100 may reflect the obtained laser beam toward the sensor unit 2000.

The polygonal mirror 4100 may obtain laser beams reflected from the object through the reflective surface.

The polygonal mirror 4100 may reflect a laser beam obtained through a lower portion of the reflective surface among the obtained laser beams to the sensor unit 2000.

The polygonal mirror 4100 may have various shapes. For example, the polygonal mirror 4100 may have a polygonal column shape.

The polygonal mirror 4100 may include a plurality of reflective surfaces. For example, the polygonal mirror 4100 may include four reflective surfaces.

The sensor unit 2000 may receive a laser beam reflected from the polygonal mirror 4100. Specifically, the sensor unit 2000 may receive a laser beam reflected from an object through the polygonal mirror 4100.

The sensor unit 2000 may be located at the same side as the laser emitting device 1000 with respect to the polygonal mirror 4100. For example, the sensor unit 2000 may be disposed at a lower portion of the laser emitting device 1000.

Meanwhile, the laser emitting device 1000 may include a laser emitting unit including a plurality of VCSEL elements and a beam steering unit including a plurality of nanopillars.

Figure 33:
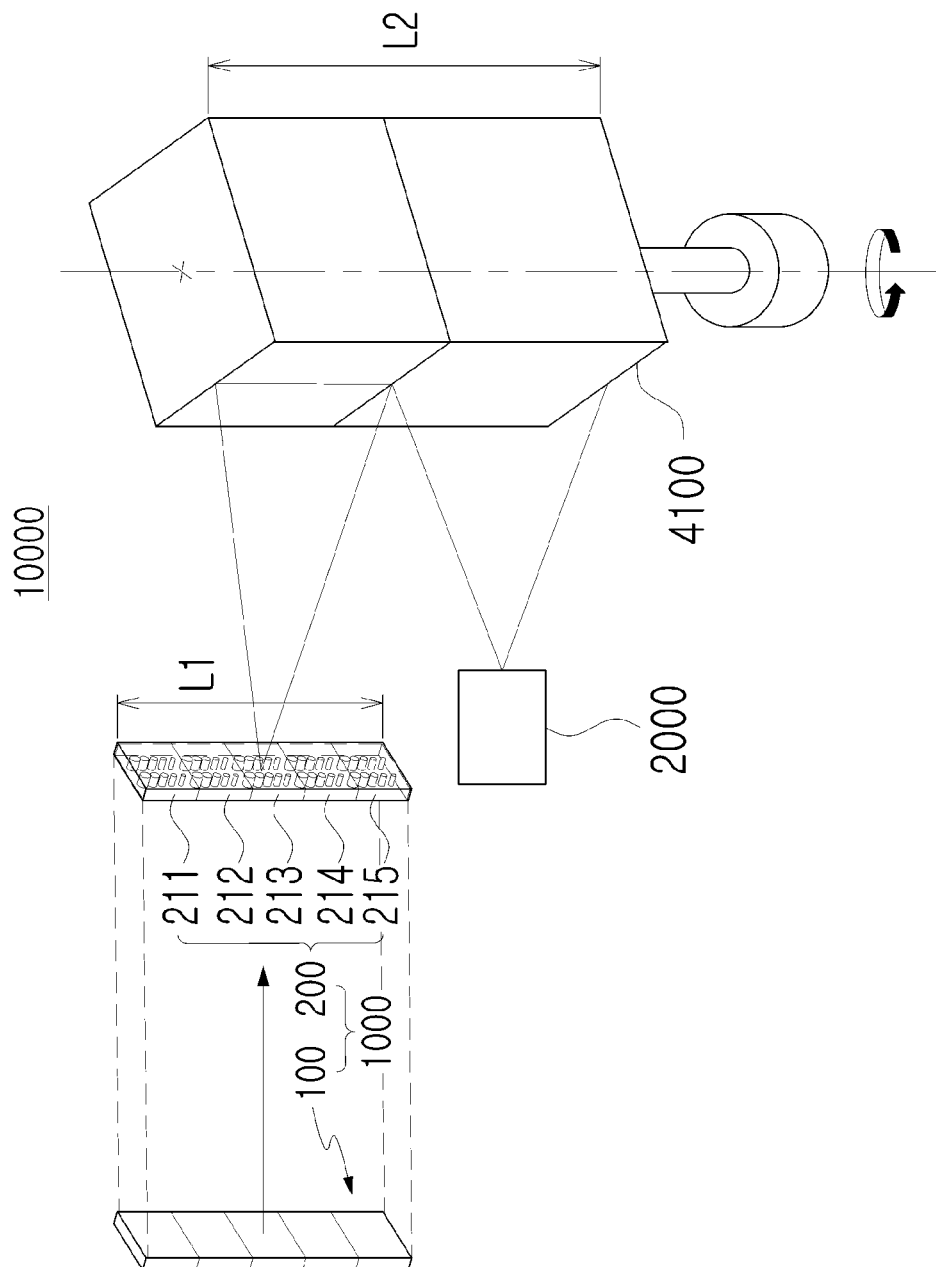

FIG. 33 is a view for describing a lidar device according to an implementation. Specifically, FIG. 33 is an exploded perspective view of the laser emitting device 1000 of FIG. 32.

Referring to FIG. 33, a lidar device 10000 may include a laser emitting device 1000, a sensor unit 2000, and a polygonal mirror 4100.

The laser emitting device 1000 may include a laser emitting unit 100 and a beam steering unit 200.

Each configuration of the laser emitting device 1000 may be described in detail below.

The laser emitting unit 100 according to an embodiment may include a plurality of VCSEL elements.

The plurality of VCSEL elements may be arranged in the form of an array along a rotation axis of the polygonal mirror 4100.

The plurality of VCSEL elements may emit a laser beam in a direction perpendicular to an emission surface of the laser emitting unit 100.

The laser emitting unit 100 may emit a laser beam toward the beam steering unit 200.

The laser emitting unit 100 may emit a laser beam in a direction perpendicular to the rotation axis of the polygonal mirror 4100.

The beam steering unit 200 according to an embodiment may steer a laser beam emitted from the laser emitting unit 100 along the rotation axis.

The beam steering unit 200 may generate a laser beam of a line pattern extending along the rotation axis from the laser beam emitted from the laser emitting unit 100.

The beam steering unit 200 may include a plurality of beam steering cells 210 each including a plurality of nanopillars 10.

For example, the beam steering cells 210 may include a first beam steering cell 211, a second beam steering cell 212, a third beam steering cell 213, a fourth beam steering cell 214, and a fifth beam steering cell 215.

Each of the first to fifth beam steering cells 211, 212, 213, 214, and 215 may steer a laser beam using the plurality of nanopillars 10. For example, each of the first to fifth beam steering cells 211, 212, 213, 214, and 215 may steer a laser beam emitted from the laser emitting unit 100 along the rotation axis of the polygonal mirror 4100 by using the plurality of nanopillars 10.

The first to fifth beam steering cells 211, 212, 213, 214, and 215 may be arranged in the form of an array along the rotation axis.

The plurality of nanopillars 10 may steer a laser beam emitted from the laser emitting unit 100.

The plurality of nanopillars 10 may form a subwavelength pattern on the basis of at least one attribute of the width W, height H, and number per unit length thereof. For example, the plurality of nanopillars 10 may form a subwavelength pattern on the basis of locations at which the plurality of beam steering cells 211, 212, 213, 214, and 215 are arranged in the array in which the plurality of beam steering cells 211, 212, 213, 214, and 215 are arranged.

Specifically, the plurality of nanopillars 10 may form, in a direction from the center of the array toward the beam steering cell 210 in which the plurality of nanopillars 10 are included, a subwavelength pattern in which an attribute repeatedly increases.

Accordingly, the plurality of nanopillars 10 which are included in the first beam steering cell 211 located at the top of the array may form a subwavelength pattern in which an attribute gradually increases toward the top of the array.

On the other hand, the plurality of nanopillars 10 which are included in the fifth beam steering cell 215 located at the bottom of the array may form a subwavelength pattern in which an attribute gradually increases toward the bottom of the array.

Also, the plurality of nanopillars 10 which are included in the third beam steering cell 213 located at the center of the array may form a subwavelength pattern in which an attribute is uniform.

Meanwhile, the plurality of nanopillars 10 may form a subwavelength pattern in which a change rate of an attribute becomes gradually higher the farther the beam steering cell 210 is from the center of the array. For example, a change rate of a first attribute of the plurality of nanopillars 10 included in the first beam steering cell 211 may be higher than a change rate of a second attribute of the plurality of nanopillars 10 included in the second beam steering cell 212.

Accordingly, a size of a rotation-axis component of a steering angle of the beam steering cell 210 may gradually increase away from the center of the array. For example, a size of a rotation-axis component of a first steering angle of the first beam steering cell 211 may be larger than a size of a rotation-axis component of a second steering angle of the second beam steering cell 212.

In this way, the size along the rotation axis of a laser beam emitted from the laser emitting device 1000 may gradually increase from the laser emitting device 1000 toward the polygonal mirror 4100.

Accordingly, a second length L2 along the rotation axis of the polygonal mirror 4100 may be larger than a first length L1 along the rotation axis of the array in which the plurality of beam steering cells 211, 212, 213, 214, and 215 are arranged.

That is, a length along the rotation axis of a laser beam reflected from the polygonal mirror 4100 and projected to an object may be larger than a length along the rotation axis of a laser beam emitted from the laser emitting unit 100.

Accordingly, among measurable ranges of the lidar device 10000, a range along the rotation axis may be increased. Accordingly, short-range object measurement performance of the lidar device 10000 may be improved.

Also, as the length along the rotation axis of the polygonal mirror 4100, that is, a height of the polygonal mirror 4100, increases, a reception amount of the laser beam reflected from an object may increase. Accordingly, a measurable distance of the lidar device 10000 may increase.

Meanwhile, a direction of a rotation-axis component of a steering direction of a beam steering cell 210 located at the top of the array in which the beam steering cells 210 are arranged may be opposite to a direction of a rotation-axis component of a steering direction of a beam steering cell 210 located at the bottom of the array.

For example, a direction of a rotation-axis component of a first steering direction of the first beam steering cell 211 may be opposite to a direction of a rotation-axis component of a fifth steering direction of the fifth beam steering cell 215.

The sensor unit 2000 may receive a laser beam reflected from the polygonal mirror 4100. Specifically, the sensor unit 2000 may receive a laser beam reflected from an object through the polygonal mirror 4100.

The sensor unit 2000 may be located at the same side as the laser emitting device 1000 with respect to the polygonal mirror 4100. For example, the sensor unit 2000 may be disposed at a lower portion of the laser emitting device 1000.

Meanwhile, although, for convenience of description, the plurality of beam steering cells 211, 212, 213, 214, and 215 have been illustrated in FIG. 33 as being arranged in one-dimension, embodiments are not limited thereto, and the plurality of beam steering cells 211, 212, 213, 214, and 215 may also be arranged in the form of a two-dimensional array. For example, the first to fourth beam steering cells 211, 212, 213, and 214 may be arranged in the form of a 2×2 array.

Figure 34:
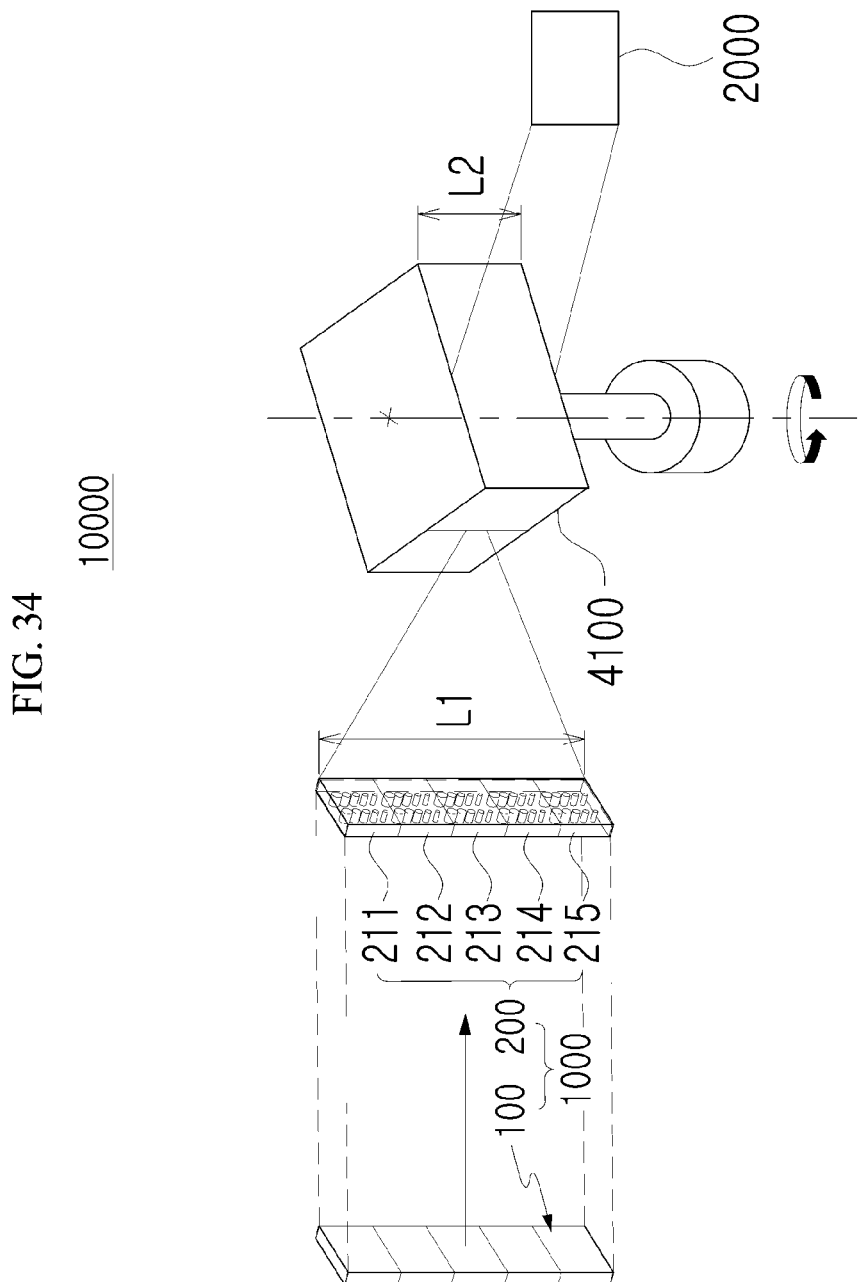

FIG. 34 is a view for describing a lidar device according to another implementation.

Referring to FIG. 34, a lidar device 10000 may include a laser emitting device 1000, a sensor unit 2000, and a polygonal mirror 4100.

The laser emitting device 1000 may include a laser emitting unit 100 and a beam steering unit 200.

Meanwhile, the laser emitting unit of FIG. 34 may correspond to the laser emitting unit of FIG. 33. Accordingly, detailed description thereof will be omitted, and differences from the lidar device of FIG. 33 will be mainly described below.

The beam steering unit 200 according to an embodiment may steer a laser beam emitted from the laser emitting unit 100 along the rotation axis.

The beam steering unit 200 may generate a laser beam of a line pattern extending along the rotation axis from the laser beam emitted from the laser emitting unit 100.

The beam steering unit 200 may include a plurality of beam steering cells 210 each including a plurality of nanopillars 10.

For example, the beam steering cells 210 may include a first beam steering cell 211, a second beam steering cell 212, a third beam steering cell 213, a fourth beam steering cell 214, and a fifth beam steering cell 215.

Each of the first to fifth beam steering cells 211, 212, 213, 214, and 215 may steer a laser beam using the plurality of nanopillars 10. For example, each of the first to fifth beam steering cells 211, 212, 213, 214, and 215 may steer a laser beam emitted from the laser emitting unit 100 along a rotation axis of a polygonal mirror 4100 by using the plurality of nanopillars 10.

The first to fifth beam steering cells 211, 212, 213, 214, and 215 may be arranged in the form of an array along the rotation axis.

The plurality of nanopillars 10 may steer a laser beam emitted from the laser emitting unit 100.

The plurality of nanopillars 10 may form a subwavelength pattern on the basis of at least one attribute of the width W, height H, and number per unit length thereof. For example, the plurality of nanopillars 10 may form a subwavelength pattern on the basis of locations at which the plurality of beam steering cells 211, 212, 213, 214, and 215 are arranged in the array in which the plurality of beam steering cells 211, 212, 213, 214, and 215 are arranged.

Specifically, the plurality of nanopillars 10 may form, in a direction from the center of the array toward the beam steering cell 210 in which the plurality of nanopillars 10 are included, a subwavelength pattern in which an attribute repeatedly decreases.

Accordingly, the plurality of nanopillars 10 which are included in the first beam steering cell 211 located at the top of the array may form a subwavelength pattern in which an attribute gradually decreases toward the top of the array.

On the other hand, the plurality of nanopillars 10 which are included in the fifth beam steering cell 215 located at the bottom of the array may form a subwavelength pattern in which an attribute gradually decreases toward the bottom of the array.

Also, the plurality of nanopillars 10 which are included in the third beam steering cell 213 located at the center of the array may form a subwavelength pattern in which an attribute is uniform.

Meanwhile, the plurality of nanopillars 10 may form a subwavelength pattern in which a change rate of attribute becomes gradually higher the farther the beam steering cell 210 is from the center of the array. For example, a change rate of a first attribute of the plurality of nanopillars 10 included in the first beam steering cell 211 may be higher than a change rate of a second attribute of the plurality of nanopillars 10 included in the second beam steering cell 212.

Accordingly, a size of a rotation-axis component of a steering angle of the beam steering cell 210 may gradually increase away from the center of the array. For example, a size of a rotation-axis component of a first steering angle of the first beam steering cell 211 may be larger than a size of a rotation-axis component of a second steering angle of the second beam steering cell 212.

In this way, the size along the rotation axis of a laser beam emitted from the laser emitting device 1000 may gradually decrease from the laser emitting device 1000 toward the polygonal mirror 4100.

Accordingly, a second length L2 along the rotation axis of the polygonal mirror 4100 may be smaller than a first length L1 along the rotation axis of the array in which the plurality of beam steering cells 211, 212, 213, 214, and 215 are arranged.

Accordingly, the polygonal mirror 4100 may be manufactured in a smaller size. That is, as the size of the polygonal mirror 4100 is reduced, the lidar device 10000 may be manufactured in a smaller size.

Also, as the size of the polygonal mirror 4100 is reduced, a load of a motor which provides a rotary force to the polygonal mirror 4100 may be reduced.

The sensor unit 2000 may receive a laser beam reflected from the polygonal mirror 4100. Specifically, the sensor unit 2000 may receive a laser beam reflected from an object through the polygonal mirror 4100.

Meanwhile, the sensor unit 2000 may be disposed at an opposite side from the laser emitting device 1000 with respect to the polygonal mirror 4100.

The sensor unit 2000 may receive a laser beam reflected from an object through a second reflective surface of the polygonal mirror 4100, which is different from a first reflective surface thereof to which a laser beam emitted from the laser emitting device 1000 is projected.

Accordingly, interference between a first laser beam projected to an object through the first reflective surface and a second laser beam reflected from the object to the second reflective surface may be prevented.

Figure 35:
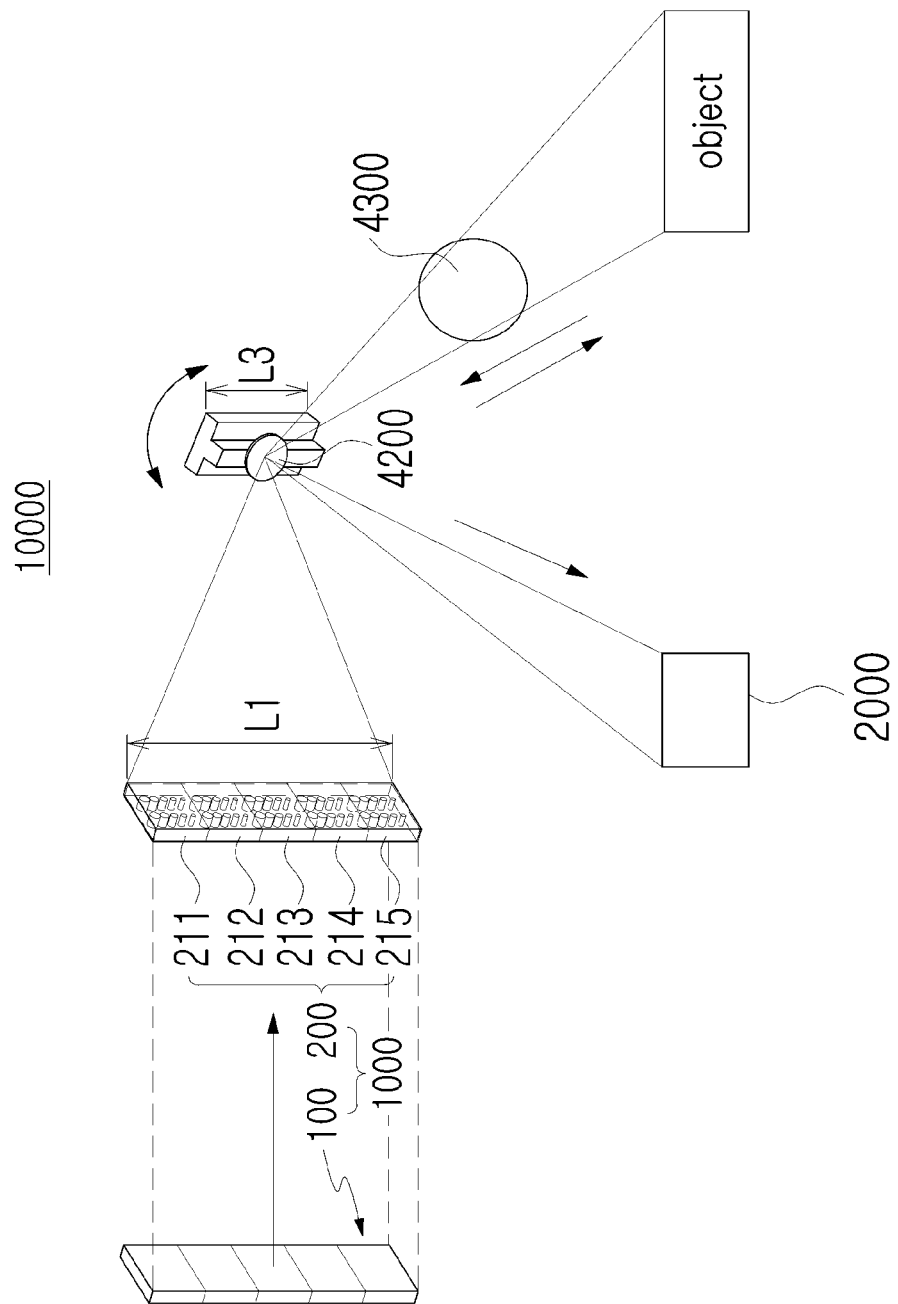

FIG. 35 is a view for describing a lidar device according to still another implementation.

Referring to FIG. 35, a lidar device 10000 may include a laser emitting device 1000, a sensor unit 2000, and a nodding mirror 4200.

The laser emitting device 1000 may include a laser emitting unit 100 and a beam steering unit 200.

Meanwhile, the laser emitting unit of FIG. 35 may correspond to the laser emitting unit of FIG. 33. Accordingly, detailed description thereof will be omitted, and differences from the lidar device of FIG. 33 will be mainly described below.

The beam steering unit 200 according to an embodiment may steer a laser beam emitted from the laser emitting unit 100 along the rotation axis.

The beam steering unit 200 may generate a laser beam of a line pattern extending along the rotation axis from the laser beam emitted from the laser emitting unit 100.

The beam steering unit 200 may include a plurality of beam steering cells 210 each including a plurality of nanopillars 10.

For example, the beam steering cells 210 may include a first beam steering cell 211, a second beam steering cell 212, a third beam steering cell 213, a fourth beam steering cell 214, and a fifth beam steering cell 215.

Each of the first to fifth beam steering cells 211, 212, 213, 214, and 215 may steer a laser beam using the plurality of nanopillars 10. For example, each of the first to fifth beam steering cells 211, 212, 213, 214, and 215 may steer a laser beam emitted from the laser emitting unit 100 along a rotation axis of the nodding mirror 4200 by using the plurality of nanopillars 10.

The first to fifth beam steering cells 211, 212, 213, 214, and 215 may be arranged in the form of an array along the rotation axis.

The plurality of nanopillars 10 may steer a laser beam emitted from the laser emitting unit 100.

The plurality of nanopillars 10 may form a subwavelength pattern on the basis of at least one attribute of the width W, height H, and number per unit length thereof. For example, the plurality of nanopillars 10 may form a subwavelength pattern on the basis of locations at which the plurality of beam steering cells 211, 212, 213, 214, and 215 are arranged in the array in which the plurality of beam steering cells 211, 212, 213, 214, and 215 are arranged.

Specifically, the plurality of nanopillars 10 may form, in a direction from the center of the array toward the beam steering cell 210 in which the plurality of nanopillars 10 are included, a subwavelength pattern in which an attribute repeatedly decreases.

Accordingly, the plurality of nanopillars 10 which are included in the first beam steering cell 211 located at the top of the array may form a subwavelength pattern in which an attribute gradually decreases toward the top of the array.

On the other hand, the plurality of nanopillars 10 which are included in the fifth beam steering cell 215 located at the bottom of the array may form a subwavelength pattern in which an attribute gradually decreases toward the bottom of the array.

Also, the plurality of nanopillars 10 which are included in the third beam steering cell 213 located at the center of the array may form a subwavelength pattern in which an attribute is uniform.

Meanwhile, the plurality of nanopillars 10 may form a subwavelength pattern in which a change rate of attribute becomes gradually higher the farther the beam steering cell 210 is from the center of the array. For example, a change rate of a first attribute of the plurality of nanopillars 10 included in the first beam steering cell 211 may be higher than a change rate of a second attribute of the plurality of nanopillars 10 included in the second beam steering cell 212.

Accordingly, a size of a rotation-axis component of a steering angle of the beam steering cell 210 may gradually increase away from the center of the array. For example, a size of a rotation-axis component of a first steering angle of the first beam steering cell 211 may be larger than a size of a rotation-axis component of a second steering angle of the second beam steering cell 212.

In this way, the size along the rotation axis of a laser beam emitted from the laser emitting device 1000 may gradually decrease from the laser emitting device 1000 toward the nodding mirror 4200.

Accordingly, a third length L3 along the rotation axis of the nodding mirror 4200 may be smaller than a first length L1 along the rotation axis of the array in which the plurality of beam steering cells 211, 212, 213, 214, and 215 are arranged.

Accordingly, the nodding mirror 4200 may be manufactured in a smaller size. That is, as the size of the nodding mirror 4200 is reduced, the lidar device 10000 may be manufactured in a smaller size.

Meanwhile, the nodding mirror 4200 may be a MEMS mirror. In this case, a rotational speed of the nodding mirror 4200 may be higher than a rotational speed of the polygonal mirror 4100 of FIG. 33. Accordingly, a scanning speed of the lidar device 10000 may be increased.

Also, since, in comparison to the lidar device of FIG. 33, the lidar device of FIG. 35 does not include a motor providing a rotary force, durability may be improved.

The sensor unit 2000 may receive a laser beam reflected from the nodding mirror 4200. Specifically, the sensor unit 2000 may receive a laser beam reflected from an object through the nodding mirror 4200.

Meanwhile, the lidar device 10000 may include a condensing lens 4300 for increasing an amount of laser beam received from an object to the nodding mirror 4200.

The condensing lens 4300 may obtain a laser beam reflected from the object. The obtained laser beam may be transmitted to the nodding mirror 4200.

Meanwhile, the nodding mirror 4200 may rotate within a preset range. For example, a rotation range of the nodding mirror 4200 may be −15° to 15°.

Accordingly, the sensor unit 2000 configured to receive a laser beam reflected from an object through the nodding mirror 4200 may be located at the same side as the laser emitting device 1000 with respect to the nodding mirror 4200.

Figure 36:
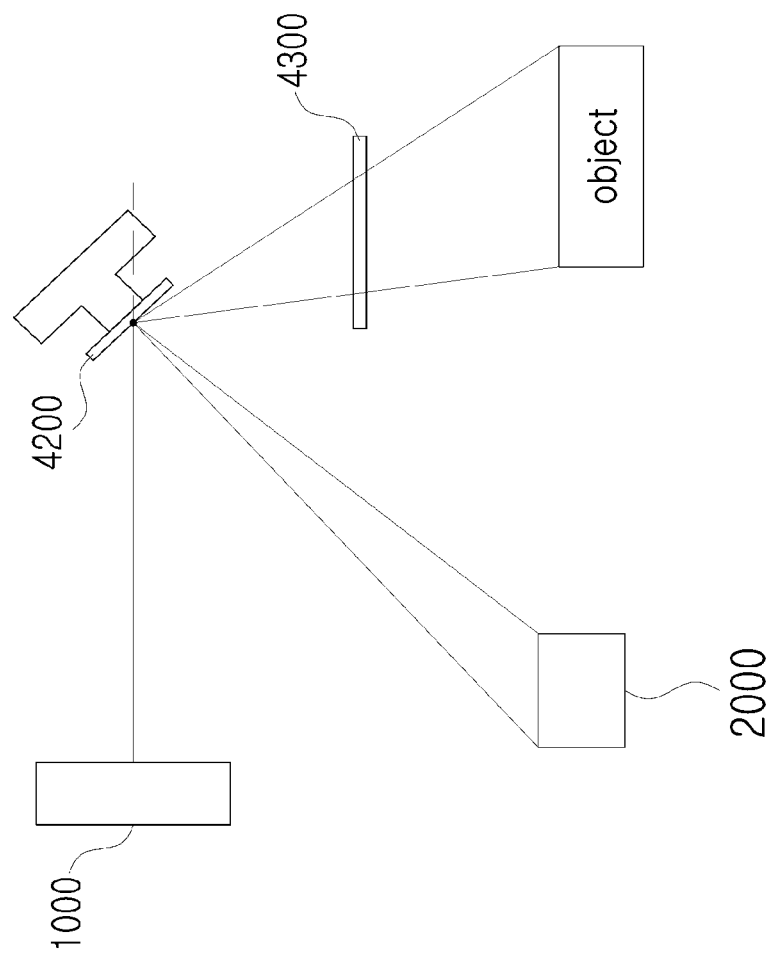
FIG. 36 is a top view of the lidar device of FIG. 35 viewed from the top.

FIG. 36 is a top view of the lidar device of FIG. 35 viewed from the top.

Referring to FIG. 36, a lidar device 10000 may include a laser emitting device 1000 and a nodding mirror 4200.

The nodding mirror 4200 may project a laser beam emitted from the laser emitting device 1000 toward an object by rotating within a predetermined range about a rotation axis.

Meanwhile, the laser emitting device 1000 may emit a laser beam toward the rotation axis of the nodding mirror 4200. That is, a virtual line along which the laser beam emitted from the laser emitting device 1000 extends may cross the rotation axis of the nodding mirror 4200.

Figure 37:
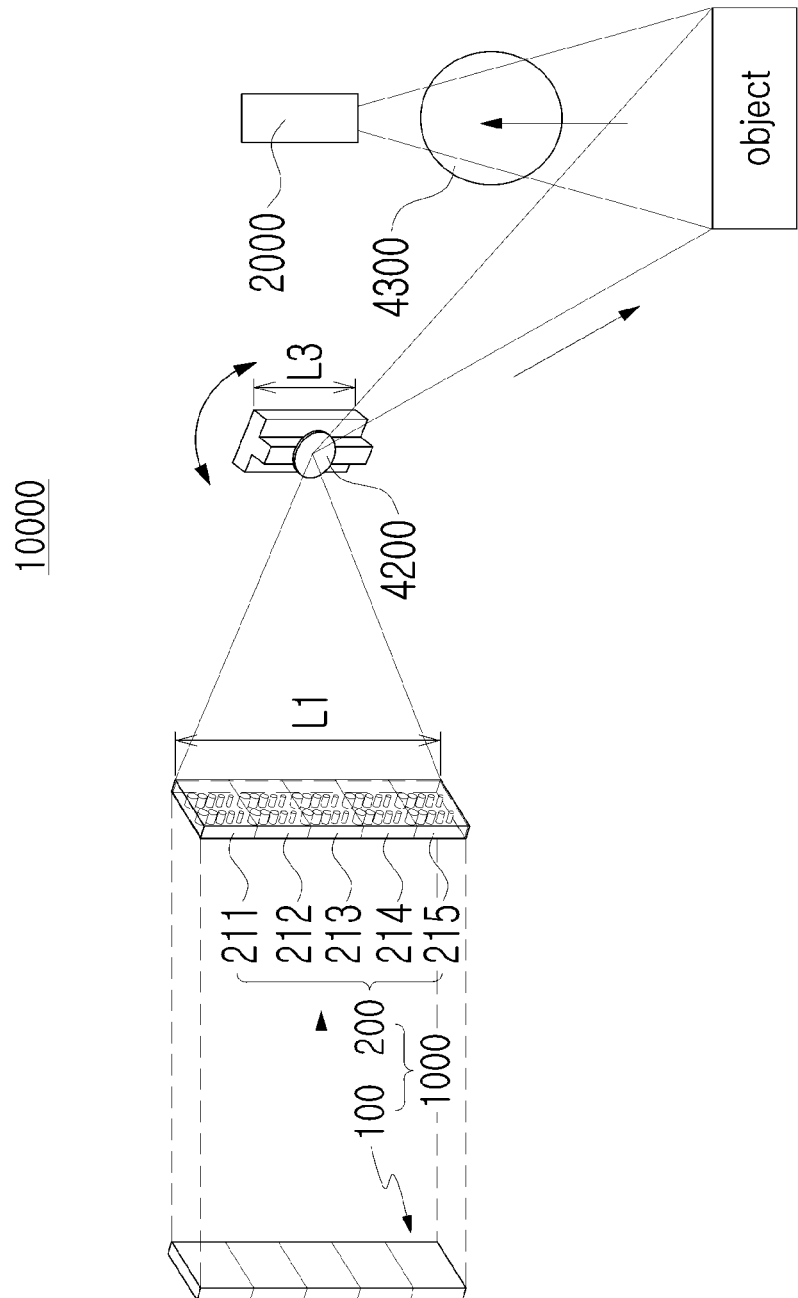
FIG. 37 is a view for describing a lidar device according to still another implementation.

FIG. 37 is a view for describing a lidar device according to still another implementation.

Referring to FIG. 37, a lidar device 10000 may include a laser emitting device 1000, a sensor unit 2000, a nodding mirror 4200, and a condensing lens 4300.

The laser emitting device 1000 may include a laser emitting unit 100 and a beam steering unit 200.

Meanwhile, the laser emitting device 1000 and the nodding mirror 4200 of FIG. 37 may operate identically to the laser emitting device 1000 and the nodding mirror 4200 of FIG. 35. Accordingly, detailed description thereof will be omitted, and differences with the lidar device of FIG. 35 will be mainly described below.

The nodding mirror 4200 may guide a laser beam emitted from the laser emitting device 1000 to an object. For example, the nodding mirror 4200 may guide the emitted laser beam to the object by reflecting the emitted laser beam.

The nodding mirror 4200 may rotate about an axis in a direction in which first to fifth beam steering cells 211, 212, 213, 214, and 215 are arranged. Alternatively, the nodding mirror 4200 may rotate about an axis perpendicular to an emission direction of a laser beam emitted from the laser emitting unit 100.

The nodding mirror 4200 may form a laser beam in a planar form from a laser beam in a linear form by rotating about axis. That is, the nodding mirror 4200 may form a laser beam point cloud.

The nodding mirror 4200 may irradiate the laser beam in the planar form to an object.

The sensor unit 2000 may receive a laser beam reflected from the object.

The condensing lens 4300 may be disposed between the sensor unit 2000 and the object to obtain the laser beam reflected from the object. The obtained laser beam may be obtained by the sensor unit 2000.

The sensor unit 2000 may include a plurality of sensor elements arranged in the form of an array. For example, the plurality of sensor elements may be arranged in a direction parallel to a direction in which the first to fifth beam steering cells 211, 212, 213, 214, and 215 are arranged.

According to an embodiment, the size of a lidar device can be reduced by using a VCSEL element.

According to another embodiment, a scanning point cloud can be generated by forming various subwavelength patterns using nanopillars.

According to still another embodiment, a solid-state lidar device capable of 3D scanning can be realized using a metasurface.

Advantageous effects of the present disclosure are not limited to those described above, and other unmentioned advantageous effects should be clearly understood by those of ordinary skill in art to which the present disclosure pertains from the present specification and accompanying drawings.

The method according to an embodiment may be implemented in the form of a program command that is executable by various computer means and may be recorded in a computer readable recording medium. The computer readable recording medium may include a program command, a data file, a data structure, and the like solely or in combination. The program command recorded in the medium may be particularly designed for the embodiment or may be known and usable by one of ordinary skill in the computer software art. Examples of the computer readable recording medium include hardware devices particularly configured to store and execute program commands such as magnetic media such as a hard disk, a floppy disk, and a magnetic tape, optical media such as a compact disk read-only memory (CD-ROM) and a digital versatile disk (DVD), magneto-optical media such as a floptical disk, and semiconductor storage devices such as a ROM, a random access memory (RAM), and a flash memory. Examples of the program command include high-level language codes that are computer-executable by using an interpreter and the like as well as machine language codes such as those formed by a compiler. Above-mentioned hardware device may be configured to serve as one or more software modules to execute operations of the embodiment, and vice versa.

Although embodiments of the present disclosure have been described above using limited embodiments and drawings, one of ordinary skill in art should be capable of modifying and changing above-described embodiments in various ways. For example, the above-described techniques may be performed in a different order from the above-described method, and/or above-described elements such as a system, a structure, a device, and a circuit may be coupled or combined in a different form from above-described method, or suitable results may be achieved even when the elements are replaced or substituted with other elements or their equivalents.

Therefore, other implementations, embodiments, and equivalents of appended claims also belong to the scope of the claims below.

What is claimed is:

1. A lidar device for measuring a first distance to an obstacle within a field of view having a vertical direction and a horizontal direction and being formed by a plurality of scanning points, the device comprising:
   a laser emitting unit including a plurality of VCSEL (Vertical Cavity Surface Emitting Laser) elements arranged in a form of array and emitting a laser beam;

a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit;

wherein the nanopillars form a subwavelength pattern in the plurality of the beam steering cells, wherein the subwavelength pattern of a specific beam steering cell among the plurality of the beam steering cells includes:

an increment of a first attribute being repeated along a first direction from a center of the metasurface to a row of the specific beam steering cell and a first change rate of the first attribute being increased according to a second distance from the row of the specific beam steering cell to the center of the metasurface, an increment of a second attribute being repeated along a second direction from the center of the metasurface to a column of the specific beam steering cell and a second change rate of the second attribute being related to a third distance from the column of the specific beam steering cell to the center of the metasurface, and wherein the first attribute is related to at least one of a first width, a first height, and a first number per unit length of the nanopillars, and the second attribute is related to at least one of a second width, a second height, and a second number per unit length of the nanopillars.

2. The lidar device of claim 1, wherein a steering direction of the specific beam steering cell has a vertical component in a range of $-M°$ to $M°$ and a horizontal component in a range of $-N°$ to $N°$, wherein N is greater than M.

3. The lidar device of claim 1, wherein:
a first size of a first component corresponding to the vertical direction of a first steering direction of the plurality of beam steering cells corresponds to a first location in the row direction of the specific beam steering cell; and
a second size of a second component corresponding to the horizontal direction of a second steering direction of the plurality of beam steering cells corresponds to a second location in the column direction of the specific beam steering cell.

4. The lidar device of claim 1, wherein a first location of each of the plurality of scanning points included in the field of view is related to a second location of the specific beam steering cell.

5. The lidar device of claim 4, wherein:
a vertical location of each of the plurality of scanning points corresponds to a row-direction location of the specific beam steering cell; and
a horizontal location of each of the plurality of scanning points corresponds to a column-direction location of the specific beam steering cell.

6. The lidar device of claim 1, wherein the nanopillars have a cylindrical or polygonal column shape.

7. A lidar device for measuring a distance to an obstacle within a field of view having a vertical direction and a horizontal direction and being formed by a plurality of scanning points, the device comprising:
a laser emitting unit including a plurality of VCSEL (Vertical Cavity Surface Emitting Laser) elements arranged in a form of array and emitting a laser beam;
a metasurface including a plurality of beam steering cells guiding the laser beam to the plurality of the scanning points by using nanopillars disposed on an emission surface side of the laser emitting unit;

wherein the nanopillars form a subwavelength pattern in the plurality of the beam steering cells, wherein the subwavelength pattern of a specific beam steering cell among the plurality of the beam steering cells includes:

a first increment of a first attribute being repeated along a first component of a first steering direction in which the specific beam steering cell guides the laser beam and a first change rate of the first attribute being increased according to a first magnitude of the first component, a second increment of a second attribute being repeated along a second component of a second steering direction in which the specific beam steering cell guides the laser beam and a second change rate of the second attribute being increased according to a second magnitude of the second component, and wherein the first component corresponds to the vertical direction of the field of view and the second component corresponds to the horizontal direction of the field of view.

8. The lidar device of claim 7, wherein the first and second steering directions of the specific beam steering cell has a vertical component in a range of $-M°$ to $M°$ and a horizontal component in a range of $-N0$ to $N0$, wherein N is greater than M.

9. The lidar device of claim 7, wherein:
the plurality of beam steering cells are arranged in a two-dimensional array in a row direction corresponding to the vertical direction and a column direction corresponding to the horizontal direction;
a first size of the first component corresponding to the vertical direction of the first steering direction of the plurality of beam steering cells corresponds to a first location in the row direction of the specific beam steering cell; and
a second size of the second component corresponding to the horizontal direction of the second steering direction of the plurality of beam steering cells corresponds to a second location in the column direction of the specific beam steering cell.

10. A lidar device for measuring a distance to an obstacle within a field of view having a vertical direction and a horizontal direction and being formed by a plurality of scanning points, the device comprising:
a laser emitting unit including a plurality of VCSEL (Vertical Cavity Surface Emitting Laser) elements arranged in a form of array and emitting a laser beam;
a metasurface including a plurality of beam steering cells arranged in a form of two-dimensional array having a row direction corresponding to the vertical direction and a column direction corresponding to the horizontal direction, wherein the plurality of the beam steering cells guide the laser beam to the plurality of the scanning points by using nanopillars disposed on an emission surface side of the laser emitting unit;
wherein the plurality of the beam steering cells include a first cell, a second cell being located at a same row and on a right side of the first cell, and a third cell being located at a same column and on a lower side of the first cell,
wherein the nanopillars included in each of the first, the second and the third cells form a plurality of subwavelength patterns in each of the first, the second and the third cells, wherein the plurality of subwavelength patterns in each of the first, the second and the third cells includes:

a first increment of a first attribute being repeated along a first direction from a center of the metasurface to a row of each of the first, the second and the third cells, respectively, and a second increment of a second attribute being repeated along a second direction from a center of the metasurface to a column of each of the first, the second and the third cells, respectively, and wherein the first attribute is related to at least one of a width, a height, and a number per unit length of the nanopillars and the second attribute is related to at least one of a width, a height, and a number per unit length of the nanopillars, in case that the first to the third cells are located on a upper left quadrant side among a quadrant of the metasurface, a first change rate of the second attribute of a first subwavelength pattern of the plurality of subwavelength patterns in the first cell is greater than a second change rate of the second attribute of a second subwavelength pattern of the plurality of subwavelength patterns in the second cell and a third change rate of the first attribute of the first subwavelength pattern in the first cell is greater than a fourth change rate of the first attribute of a third subwavelength pattern of the plurality of subwavelength patterns in the third cell.

* * * * *